US012701843B2

(12) United States Patent
    Asad

(10) Patent No.: US 12,701,843 B2
(45) Date of Patent: Aug. 4, 2026

(54) METHOD OF PACKAGING AND INTEGRATION FOR MULTI-LAYER SYSTEM

(71) Applicant: HYPERLUME INC., Toronto (CA)

(72) Inventor: Mohsen Asad, Ottawa (CA)

(73) Assignee: HYPERLUME INC., Ottawa (CA)

( * ) Notice: Subject to any disclaimer, the term of this patent is extended or adjusted under 35 U.S.C. 154(b) by 0 days.

(21) Appl. No.: 19/023,655

(22) Filed: Jan. 16, 2025

(65) Prior Publication Data

US 2025/0169261 A1 May 22, 2025

Related U.S. Application Data

(63) Continuation of application No. PCT/IB2023/057485, filed on Jul. 23, 2023.
(Continued)

(51) Int. Cl.
    *H10H 29/01* (2025.01)
    *H10H 29/14* (2025.01)

(52) U.S. Cl.
    CPC ...... *H10H 29/0364* (2025.01); *H10H 29/012* (2025.01); *H10H 29/034* (2025.01); *H10H 29/142* (2025.01)

(58) Field of Classification Search
    CPC ............. H10H 29/0364; H10H 29/012; H10H 29/034; H10H 29/142; H10H 20/857;
(Continued)

(56) References Cited

U.S. PATENT DOCUMENTS

| | | | | |
|---|---|---|---|---|
| 10,418,350 B2 * | 9/2019 | Das | ........................ | H10W 20/20 |
| 2017/0317228 A1 * | 11/2017 | Sung | .................. | H10H 20/0137 |

FOREIGN PATENT DOCUMENTS

| | | | | |
|---|---|---|---|---|
| CN | 107887331 | | 4/2018 | |
| CN | 107887331 A | * | 4/2018 | ............. H10H 20/83 |
| WO | WO2016080712 A1 | | 5/2016 | |

OTHER PUBLICATIONS

Mazen Hijazi on behalf of Canadian Intellectual Property Office, International Search Report for PCT/IB2023/057485, Mailed Nov. 9, 2023.
(Continued)

*Primary Examiner* — Arleen M Vazquez
*Assistant Examiner* — Robert P Alejnikov, Jr.
(74) *Attorney, Agent, or Firm* — Ramesh Rajaduray

(57) ABSTRACT

A method of packaging micro-LEDs onto a substrate including: microfabricating micro-LEDs on a transparent microdevice substrate with an epitaxial layer, aligning a test substrate with test electrodes to connect to the micro-LEDs, and injecting a current to capture brightness information and map healthy and defective micro-LEDs. The test substrate is removed, and a photo-sensitive polymer is coated on the microdevice substrate and optically patterned to remove the polymer around defective micro-LEDs. A receiver substrate with pads is forced toward the microdevice substrate such that at least one pad penetrates the polymer to contact a healthy micro-LED, and the polymer fills any gap. The polymer surrounding the healthy micro-LED is cured to bond it to the receiver substrate and achieve lift-off from the microdevice substrate, which is then moved away.

20 Claims, 54 Drawing Sheets

Related U.S. Application Data

(60) Provisional application No. 63/391,753, filed on Jul. 24, 2022.

(58) Field of Classification Search
CPC ............. H10H 20/0364; H10H 20/841; H10H 20/8513; H10H 20/856; H10H 20/018; H10H 20/01; H10W 90/00
USPC .................................................... 324/762.07
See application file for complete search history.

(56) References Cited

OTHER PUBLICATIONS

Mazen Hijazi on behalf of Canadian Intellectual Property Office, Written Opinion for PCT/IB2023/057485, Mailed Nov. 9, 2023.

* cited by examiner

102

108        107

108-1        107-1

102-1

187

186

189   188

187

186

189   190

187

186

189  190  191

196

192

195

193

194

199

124

202

199

124

Figure 52:
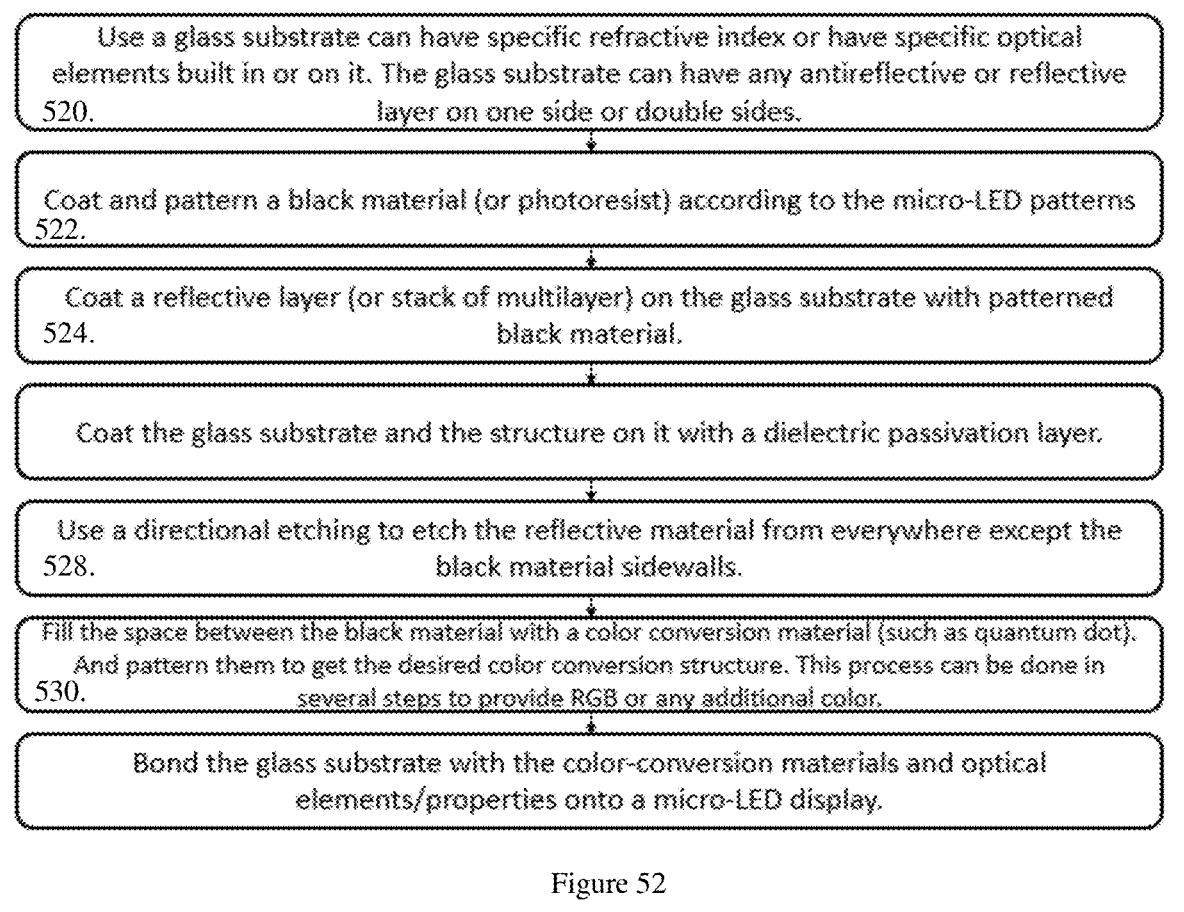

Use a glass substrate can have specific refractive index or have specific optical elements built in or on it. The glass substrate can have any antireflective or reflective layer on one side or double sides.
520.

Coat and pattern a black material (or photoresist) according to the micro-LED patterns
522.

Coat a reflective layer (or stack of multilayer) on the glass substrate with patterned black material.
524.

Coat the glass substrate and the structure on it with a dielectric passivation layer.

Use a directional etching to etch the reflective material from everywhere except the black material sidewalls.
528.

Fill the space between the black material with a color conversion material (such as quantum dot). And pattern them to get the desired color conversion structure. This process can be done in several steps to provide RGB or any additional color.
530.

Bond the glass substrate with the color-conversion materials and optical elements/properties onto a micro-LED display.

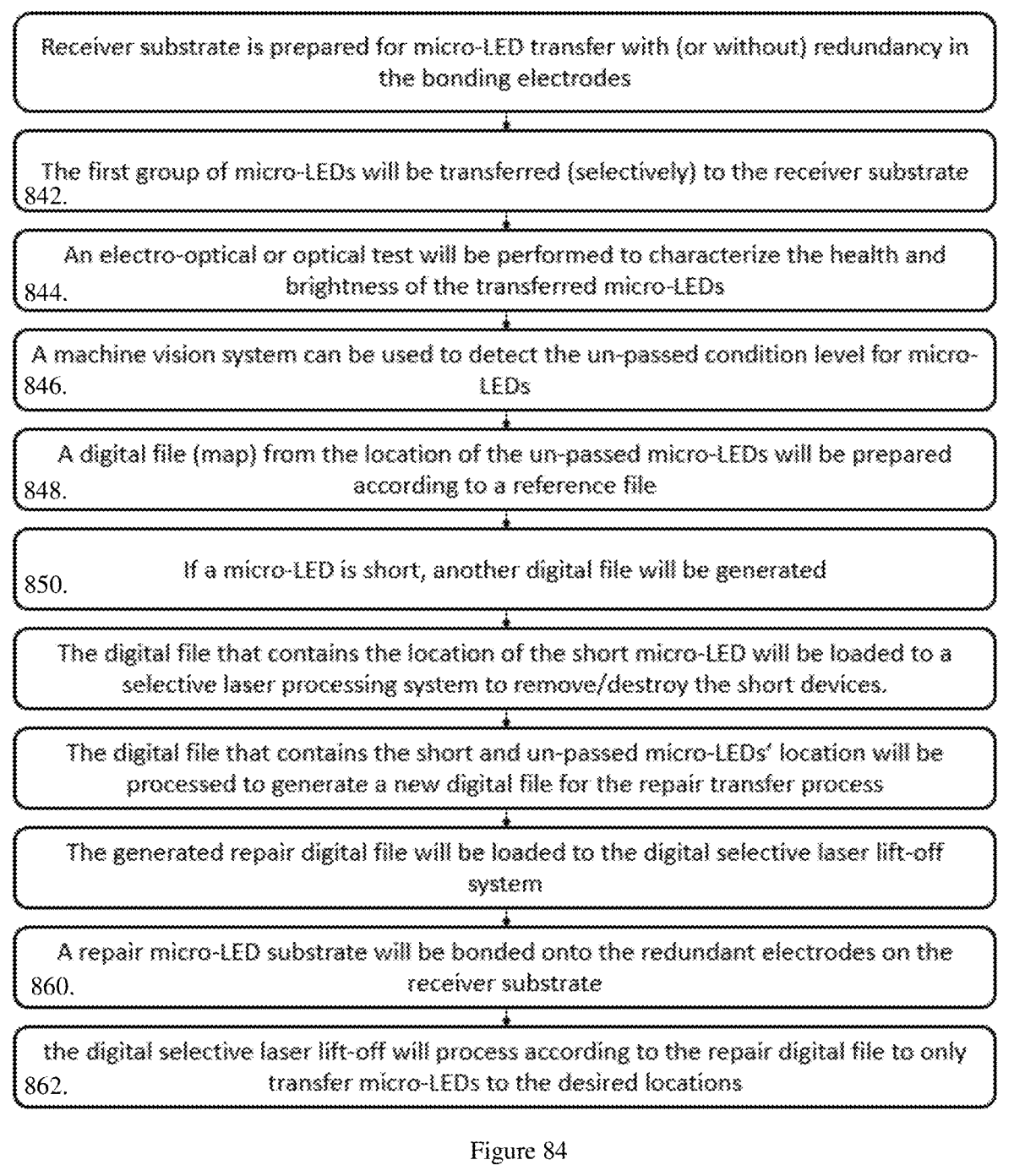

Receiver substrate is prepared for micro-LED transfer with (or without) redundancy in the bonding electrodes 842. The first group of micro-LEDs will be transferred (selectively) to the receiver substrate 844. An electro-optical or optical test will be performed to characterize the health and brightness of the transferred micro-LEDs 846. A machine vision system can be used to detect the un-passed condition level for micro-LEDs 848. A digital file (map) from the location of the un-passed micro-LEDs will be prepared according to a reference file 850. If a micro-LED is short, another digital file will be generated The digital file that contains the location of the short micro-LED will be loaded to a selective laser processing system to remove/destroy the short devices.

The digital file that contains the short and un-passed micro-LEDs' location will be processed to generate a new digital file for the repair transfer process The generated repair digital file will be loaded to the digital selective laser lift-off system 860. A repair micro-LED substrate will be bonded onto the redundant electrodes on the receiver substrate 862. the digital selective laser lift-off will process according to the repair digital file to only transfer micro-LEDs to the desired locations

Figure 84

METHOD OF PACKAGING AND INTEGRATION FOR MULTI-LAYER SYSTEM

CROSS-REFERENCE TO RELATED APPLICATIONS

The instant application claims priority to PCT application PCT/IB2023/057485 with an international filing date of Jul. 23, 2023, which in turn claimed priority to U.S. provisional application 63/391,753, filed on Jul. 24, 2022. The contents of each application are hereby incorporated by reference.

COPYRIGHT NOTICE

FIELD OF TECHNOLOGY

This relates to light-emitting diodes (LEDs), and more particularly to a selective bonding method integrating a desired pattern or resolution of micro-LEDs or other semiconductor devices onto a receiver (secondary) substrate.

BACKGROUND

Micro-LEDs are a promising technology for the next generation of wearable and flat panel displays. Due their inorganic nature they can be patterned with conventional lithography process to fabricate high resolution displays. In contrary to organic materials which are coated at vacuum at room temperature, the inorganic epitaxial layers are normally grown on a substrate at high temperature (700~1100° C.) which is not compatible with the substrate with driving circuit and may degrade the circuit efficiency. As a result, the inorganic material should be released from the growth substrate and be transferred onto the backplane. The resolution of the processed microdevices on the growth substrate does not need to be the same as the resolution required for the display and by selective transfer of micro-LEDs, the production cost can be dramatically decreased by selective transfer of micro-devices.

To mass-transfer micro-LEDs from a growth substrate onto a receiver disparate substrate, a reliable and fast technology is required for the display mass production. Conventionally, two step transfer techniques based on adhesive polymers, MEMS devices or PDMS structure have been developed. Using those techniques, micro-LEDs are initially transferred from a growth substrate onto a carrier substrate and then will be transferred to the final receiver substrate with driving circuits. Unfortunately, adding an additional transfer step may decrease the process yield and consumes more time. In order to improve the yield, improving the throughput and decreasing the mass-transfer cost a single-step process is required to transfer micro-LEDs from the sapphire substrate onto a final substrate. When a two-step transfer is used, normally, the whole fabricated micro-LEDs are transferred from the growth substrate onto a carrier substrate. Selective pickup and release of the micro-LEDs from the carrier substrate is complex that may decrease the yield of the process. To reduce the fabrication cost of a micro-LED display a new transfer technology is required.

The array of micro-LEDs on sapphire substrate can be fabricated in a higher resolution than the resolution required in the backplane. Then by using a selective bonding process, a desired resolution of micro-LEDs can be bonded, and laser processed. The remained micro-LEDs can be used for the next transfer step which can be performed for several times. The selective bonding process should keep micro-LEDs healthy during the high-power laser processing.

Also, integration of micro-devices onto requires a strong mechanical bond onto the receiver substrate. The bonding strength should be strong enough to pass the harsh humidity and thermal tests and be compatible with the next encapsulation and top-glass integration process. A low electrical contact resistance is also vital for making a low power display and reduce the failure risk due the joule heating at the micro-device pads. As a result, the bonding process should be selective to bond a desired pattern of the micro-devices and at the same time provide both mechanical strength and low contact resistance. The current state of the art bonding technologies based on eutectic, thermo-compression or cold welding can not satisfy the flat panel fabrication requirements.

Another important aspect of the display fabrication is the ability to repair the dead/missed pixel. When the size of the display is small (such as wearable displays) each location can have a redundancy of 2 pixels. It is a cost-effective solution to self-repair the display if one pixel is broken or the junction resistance or optical performance are not acceptable. However, in case of a larger display size, the redundancy approach is a costly solution, and the dead pixel should be repaired. The repair mechanism can be performed after the initial display electro-optical test and before final packaging steps. As one the test's outcome, the dead pixels and their location in the display (backplane) substrate can be defined. One approach for the repair is removing the dead pixel using mechanical force or a laser beam and integrating another micro-device onto the original place. However, this technique is both risky (may cause failure to other healthy device) and time consuming. As an optimizes approach, a redundant electrical junction (pad) can be fabricated and be connected to the same driving circuit. If a pixel is dead, another pixel can be transferred onto the vacant pad and the original pixel can be removed from the driving steps. In this case, the defective micro-LED (both open-circuited and short-circuited) can be neglected during the electrical driving.

The same selective laser transfer printing process (SLTP) which was used to transfer micro-LEDs can be used to integrated other semiconductor driving circuits made based on GaN, Si or other technologies. The GaN driving circuit can provide a high driving current and benefits from the same material property as the GaN micro-LEDs which is suitable for laser-liftoff process. If the driving circuit is made using other technologies, the fully (partially) process devise can be transferred onto a transparent substrate (such as glass or sapphire) and then the SLTP will be used to transfer them onto the backplane (final) substrate. SLTP technique can be used not only for transferring micro-LEDs or micro-drivers, but also for the whole range semiconductor devices which are grown or mounted on a optically/thermally transparent substrate.

When a display is fabricated based on transferring only monochrome micro-LEDs, an additional color conversion layer (CCL) is required to up-convert the base emitted wavelength into lower frequencies and generate potentially red, greed green or blue. The full-color display fabricated by this technique normally uses quantum dot, phosphorous materials, or any up-converting materials as a color conversion element. To prevent crosstalk between neighbor pixel, the gap between each pixel needs to be covered with an optically barrier material. Black matrices based on black photoresist is one of the solutions for overcoming the neighbor pixel crosstalk and improving the display contrast ratio. However, due the black nature of the material a portion of the photons generated by CCL layer or micro-LED will be wasted by absorbing into the back layer. Consequently, a disadvantage for using black matrices can be the higher total power consumption. As a result, an optimized structure is required to prevent the crosstalk, and to improve recycling the side-emitted photons inside of each CCL structure. The mentioned optimized optical structure needs be easily mass-produced with a reasonable cost.

BRIEF SUMMARY

This disclosure includes a selective bonding method integrating a desired pattern or resolution of micro-LEDs or other semiconductor devices onto a receiver (secondary) substrate. To release micro-LEDs or semiconductor devices selectively from a growth substrate or handling substrate, a laser beam is selectively processing the micro-LEDs or semiconductor devices to transfer them onto the receiver substrate according to a digital pattern loaded to the printing system. The selective laser processing pattern can be implemented by syncing the laser frequency and the speed/ location of the stage with the receiver substrate mounted on it, or it can be implemented using a diffractive optical element and pottering, or by masking the emitted laser beam to desired size and shape. Also, the laser steering can be implemented by employing digital micromirror devices or fast scanning mirrors followed by an f-theta lens. A sequential selective bonding and laser processing can enable a full-colour (RGB) display. An RGB display can be realized by transferring violet or blue micro-LEDs and employing colour-conversion layers or sequentially patterning the red, green, and blue sub-pixels. The same method can be used to transfer the driving circuits on the growth substrate (such as the GaN driving circuit) or on a carrier substrate (such as the silicon substrate). The transferred micro-LED (semiconductor devices) can be optically or electrically tested after the transfer process. A pattern (layout) from the defective devices is generated after the test and used for the repair process using the digital selective laser printer. A second round of printing only prints micro-devices onto the pads located in or beside the defective device. This process is called the repair process. In addition, a structure with sidewalls coated with a reflective layer can be created on micro-LEDs or on a separate glass substrate to stop the crosstalk between pixels, improve the light-extraction efficiency, improve the emission angle, and provide a uniform light pattern for red, green, and red pixels.

BRIEF DESCRIPTION OF THE DRAWINGS

For a better understanding of the various examples described herein and to show more clearly how they may be carried into effect, reference will now be made, by way of example only, to the accompanying drawings in which:

FIG. 52 depicts the process flow to fabricate an efficient color conversion layer on a glass substrate.

FIG. 84 depicts the process flow for repairing broken, short, or un-passed micro-LEDs.

DETAILED DESCRIPTION, INCLUDING THE PREFERRED EMBODIMENT

Figure 1:
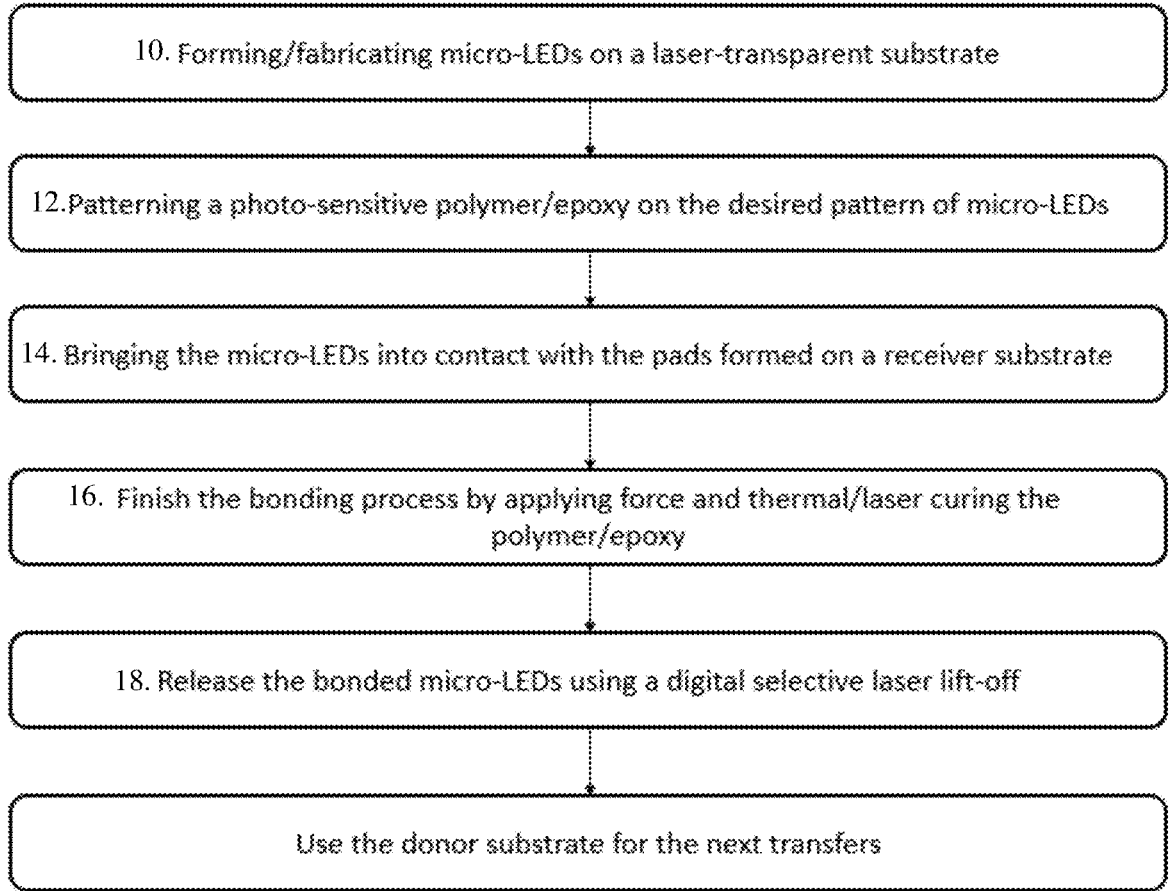
FIG. 1 shows a flow chart of a selective micro-LED transfer method.

Various exemplary embodiments are described in detail with reference to the drawings. It should be noted that the relative arrangement of the components and steps, the numerical expressions, and numerical values set forth in these embodiments do not limit the scope unless it is specifically stated otherwise.

The following description of at least one exemplary embodiment is merely illustrative in nature and is in no way intended to be limiting, including in application or uses.

Techniques, methods and apparatus as known by one of ordinary skill in the relevant art may not be discussed in detail but are intended to be part of the specification where appropriate. In all the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Below, the embodiments and examples will be described with reference to the accompany figures.

FIG. 1 shows the flow chart of a selective micro-LED transfer method.

Figure 2:
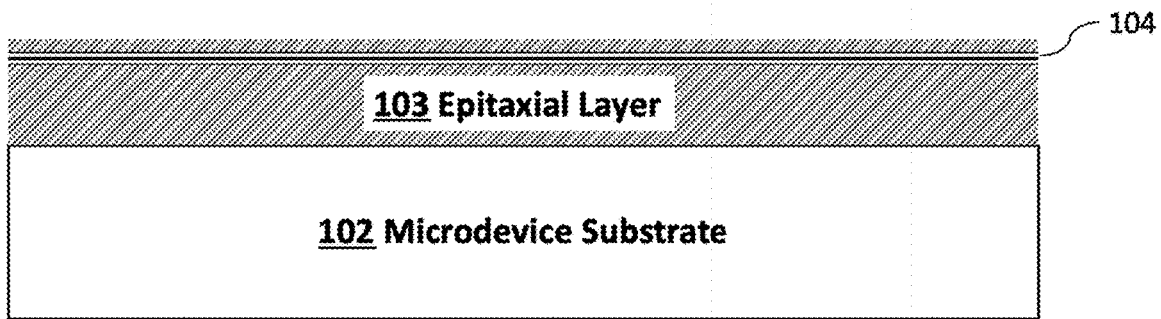
FIG. 2 depicts the schematic of the epitaxial layer grown on a sapphire substrate or transferred onto a transparent substrate like glass.

As shown in the FIG. 2, the process starts with an epitaxial layer (103) on an optically transparent microdevice substrate (102). The epitaxial layer (103) can be grown on the (102) substrate or it can be transferred from a growth substrate using methods such as laser-liftoff, epitaxial-liftoff or etc. The active (quantum well, quantum dot or nanowire) layer which is responsible for light generation is shown by (104). The structure can have several active regions which can be connected electrically or such as using a tunnel junction, a metal layer or can be bonded together using an adhesive or dielectric layer.

Figure 3:
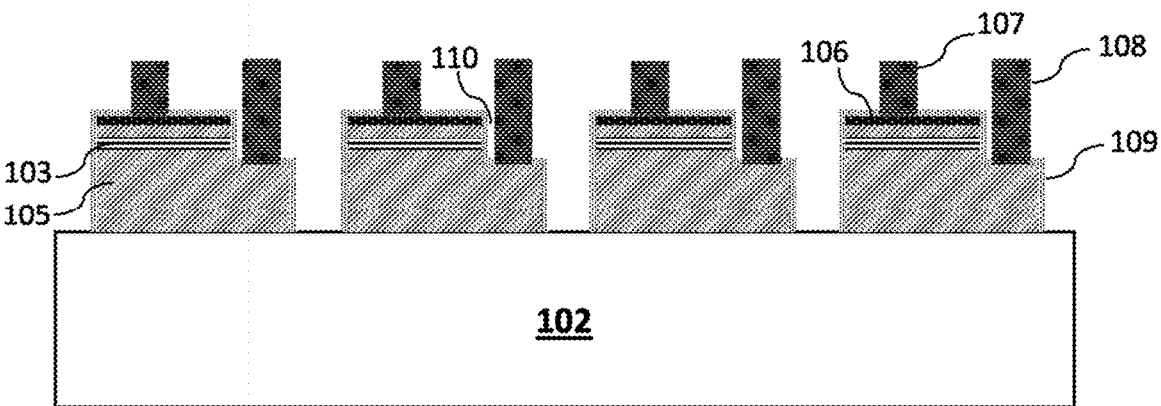
FIG. 3 depicts flip-chip micro-LEDs fabricated on a substrate.

The next step is forming 10 the micro-LEDs on the (102) substrate using a micro-fabrication process. Micro-LEDs fabricated on the microdevice substrate are shown in FIG. 3 where (103) is the patterned active layer, (105) is the device bulk layer, (106) is the top electrode that can be a metallic (reflective or not-reflective) or a metal-oxide material, (107) is the anode electrode which can be a stack of multi metals and solders, (108) is the cathode electrode which can be a stack of multi metals and solders, (109) is the passivation layer that can be made from dielectrics, amorphous materials, doped amorphous materials or a combination of them, and (110) which is the space between the cathode electrode and mesa. The configuration of anode and cathode electrodes is not limited to what shown here and can be at any location of the device. Based on the bulk semiconductor type, (107) and (108) can be cathode or anode also.

Figure 4:
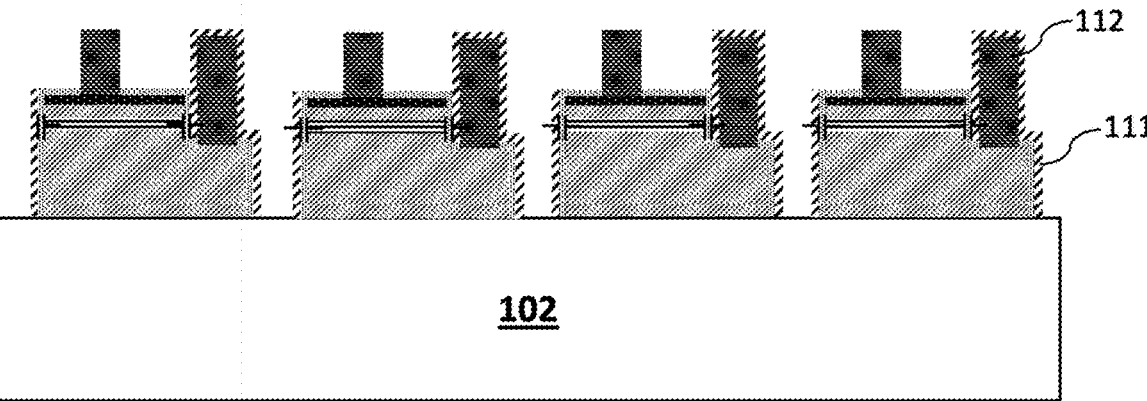
FIG. 4 depicts flip-chip micro-LEDs fabricated on a substrate where the cathode electrode can be connected to a surround electrode.

A surround electrode layer (111) and (112), as shown in FIG. 4, can cover the device sidewalls. It can be a single reflective layer or multi-layers of metals or dielectrics. The passivation layer prevents any short-circuit between anode and cathode and semiconductor with different types. The surround electrode is connected to the cathode electrode to impose an electric field around the mesa and ripple one type of the carriers from the device sidewalls and consequently reduce the defect-assisted non-radiative recombination. The layers (112) and (111) can be connected to each other and can be created in a single-step or multi-step process.

Figure 5:
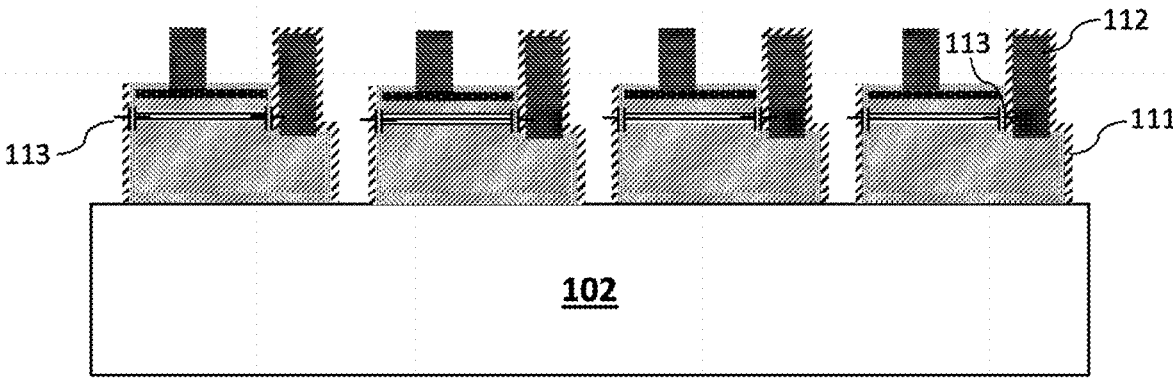
FIG. 5 depicts flip-chip micro-LEDs with a cathode electrode providing a gated structure.

FIG. 5 shows micro-LED structures where an electric field (capacitance) is created by the surround electrode in every side of the mesa structure. The gap between cathode and mesa structure is filled with the dielectric and surround electrode which lead to an electric field induction towards the micro-LED's sidewall (especially at the active layer). Induced electric field effect at the sidewalls are shown by (113). It can be a positive or negative electric field.

Figure 6:
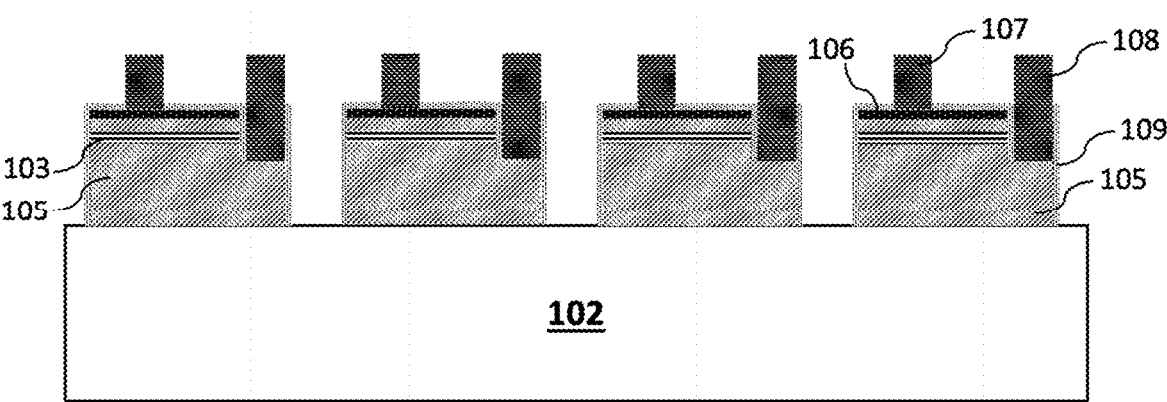
FIG. 6 depicts flip-chip micro-LED fabricated or transferred on a substrate.

FIG. 6 shows micro-LED structures where the cathode electrode is completely made at the edge of the device and there is no gap between the cathode electrode and the device edge. It will save some space and can lead to higher resolution. However, strain/stress management during the transfer process is important.

Figure 7:
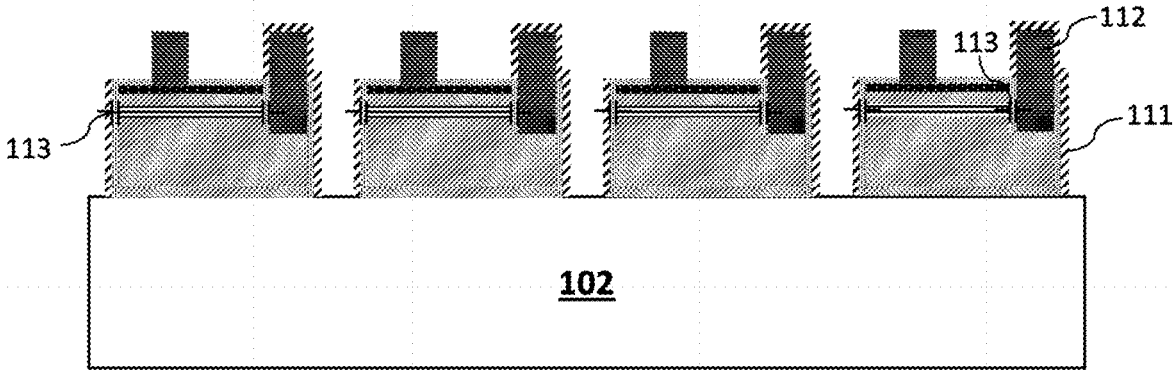
FIG. 7 depicts flip-chip micro-LEDs with a cathode electrode connected to a surround electrode.

FIG. 7 shows the micro-LEDs with the cathode electrode at the edge where a surround electrode is connected to the cathode electrode. The depletion region created due to the surround electrode is shown by (113).

Figure 8:
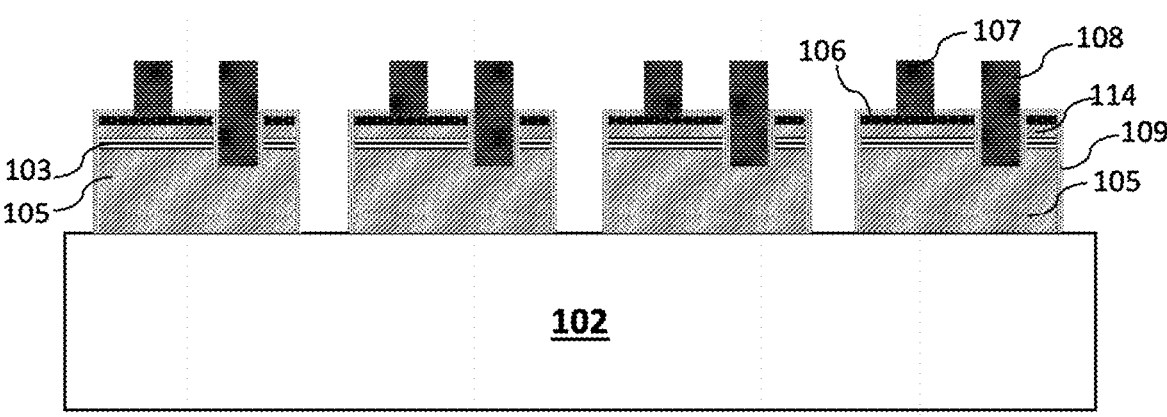
FIG. 8 depicts micro-LEDs fabricated or transferred on a substrate.

In another embodiment (FIG. 8) the cathode electrode (108) is formed in the area closer to middle (anode) of the micro-LED. A passivation layer (114) needs to passivate the cathode electrode from the LED internal mesa sidewalls.

Figure 9:
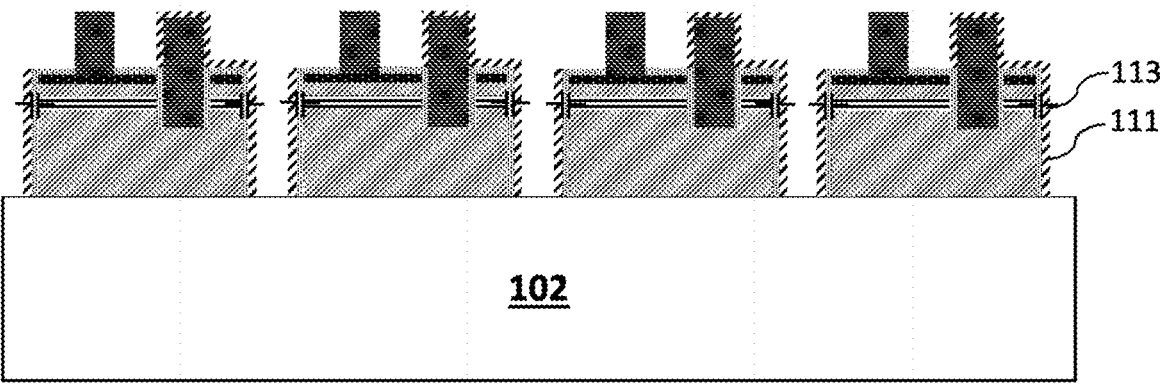
FIG. 9 depicts micro-LEDs with a surround electrode connected to a cathode.

The surround electrode layer (111) on the micro-LEDs with inward cathode electrode (FIG. 8) is presented in FIG. 9. The induced depletion region is shown by (113). The surround electrode can cover the cathode electrode or can be connected to the electrode sidewall.

Figure 10:
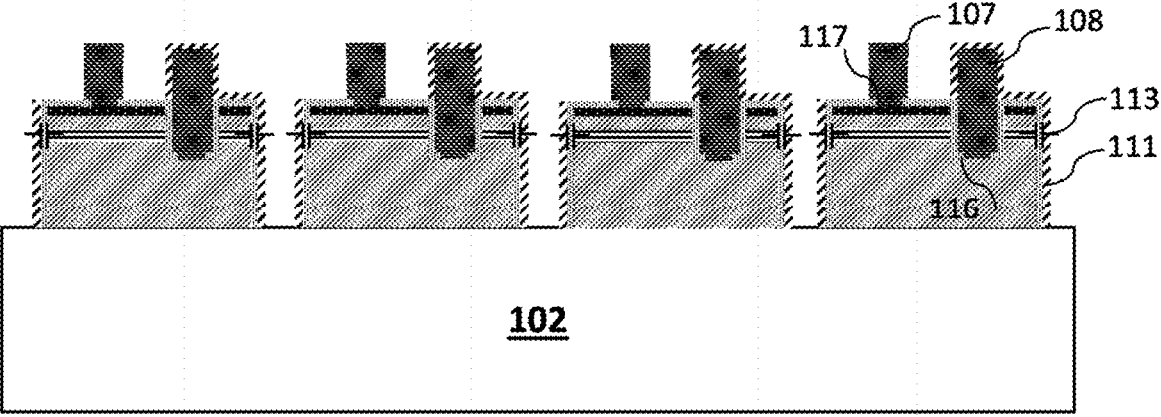
FIG. 10 depicts micro-LEDs with two electrodes for outside connection.

In another embodiment, FIG. 10, a narrower opening window is used for connecting the cathode electrode to the micro-LED bulk or n-type semiconductor. Part of the bottom of the etched mesa is covered with a dielectric layer (116).

In all embodiments, the surround electrode (111) and (113) can be disconnected from the cathode electrode. The surround electrode can be a charged (doped) semiconductor (as a p-type or n-type) which then acts like a static electric field around the device.

Figure 11:
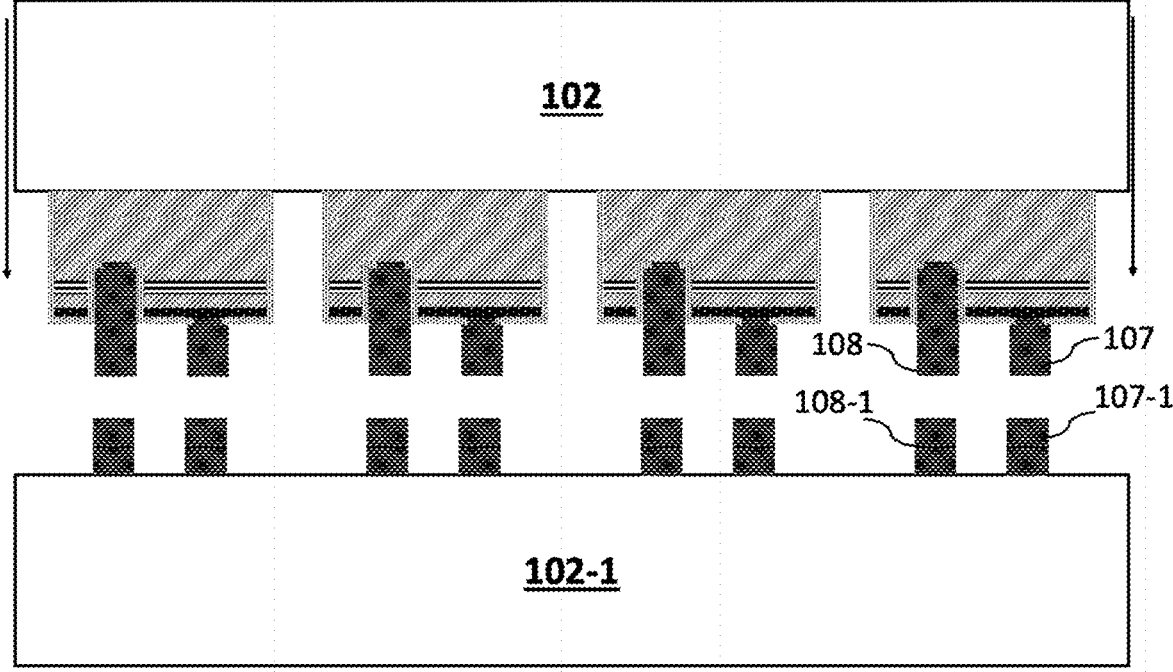
FIG. 11 depicts a test substrate, electrode and system to test micro-LEDs before transfer process.

The test substrate (102-1) and it's biased test electrodes (107-1) and (108-1) are shown in FIG. 11. The number of electrodes per device is not limited to 2 and more electrodes can be considered for improving the throughout or testing other functions. The test electrodes (107-1) and (108-1) can be made from a soft polymer coated by a conductive layer such as gold. The test electrodes can have a probe head core with a spring incorporated in a barrel. The type of the test electrodes is not limited to what mentioned here and any material and structure can be employed. It will provide the required flexibility and can overcome the force non-uniformity applied on the microdevice substrate during the test operation. As shown in FIG. 11, the micro-LEDs' electrode (107) and (108) should be aligned with the test electrodes (107-1) and (108-1) in order to test the device electrically and measure the electroluminescence (EL) intensity.

Figure 12:
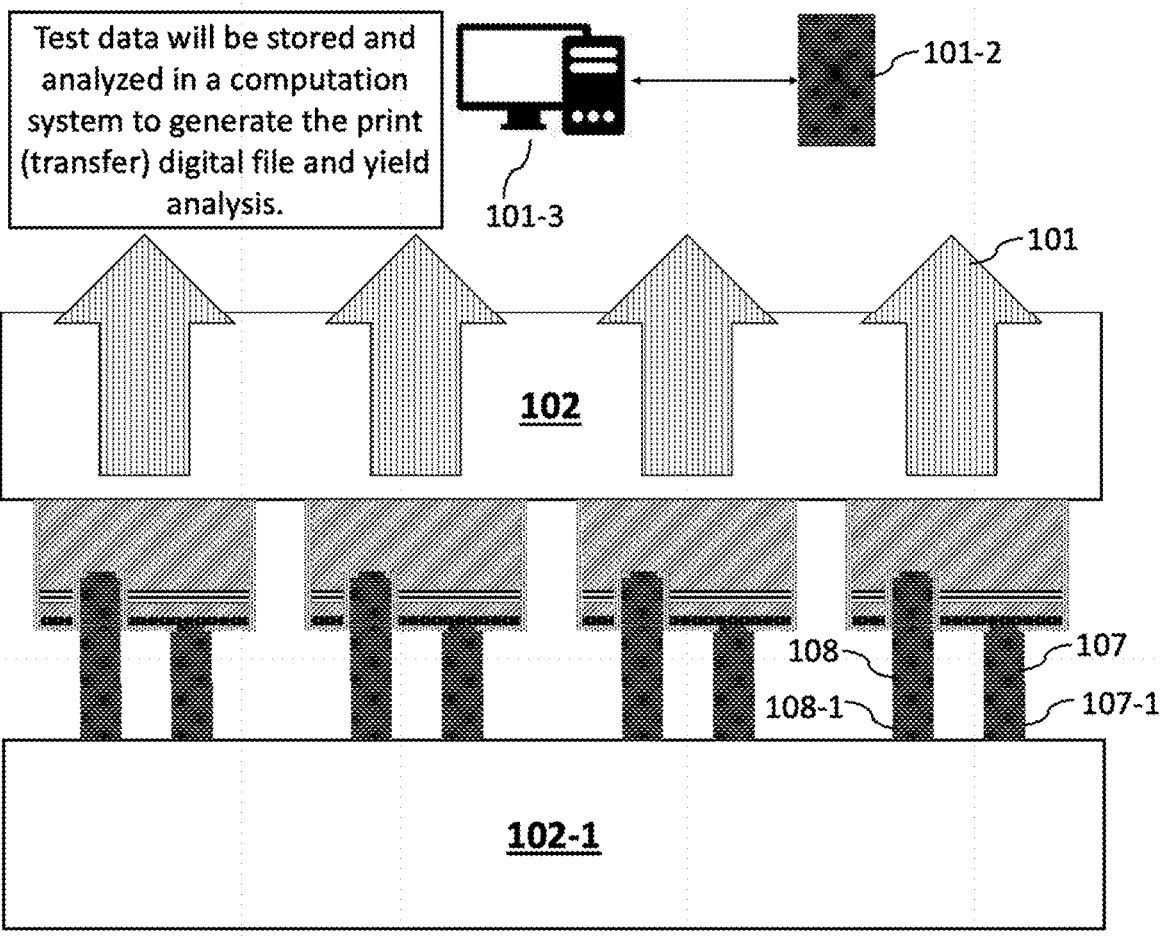
FIG. 12 depicts the micro-LED substrate contacted the test substrate when micro-LEDs are biased, and a vision system is analysing the healthy micro-LEDs.

FIG. 12 depicts when the microdevice substrate (102) is down enough to connect the micro-LED electrodes and test electrodes. As shown, after injecting a current or applying a voltage through the test electrode, the EL/PL intensity (101) can be measured from the microdevice substrate backside. A machine vision system equipped with image processing captures the brightness information from individual micro-LEDs. It can be done using a linear scanning CCD or 2-dimensional CMOS image sensors. In FIG. 12 all micro-LEDs are emitting light. However, the pass-condition can be based on the measured photon intensity (lux or lumen). If a micro-LED provides enough brightness, it can be processed at the next steps. Otherwise, it should be neglected during the bonding and transfer process. The test is not limited to EL measurement and other techniques such as I-V, photoluminescence, x-ray can be performed to extract a map (digital file) from the location of the healthy and broken (un-passed) micro-LEDs. Test data will be stored and analyzed in a computation system (103-1) to generate the print (transfer) digital file and yield analysis.

Figure 13:
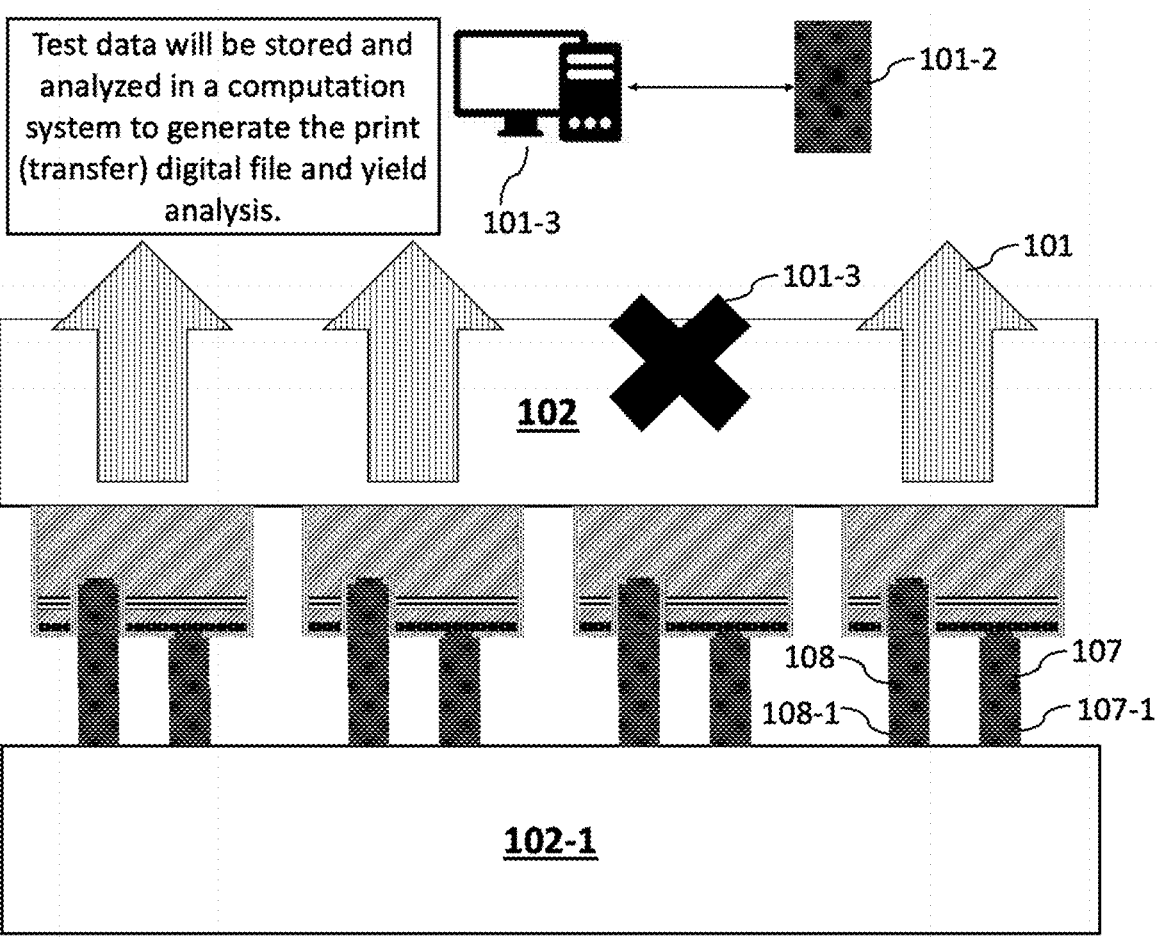
FIG. 13 depicts the micro-LED test system when one micro-LED failed due to not generating photons or poor intensity.

An example of un-passed micro-LED is shown in FIG. 13. The measured light intensity is not enough, the micro-LED is short, or it is OFF due to any damage during, before, or after the transfer process. This is a failed micro-LED with a failed result (101-3). The machine vision system (101-2) will generate a digital file from the healthy micro-LED with accepted light intensity (101) to be used for selective laser processing. Since the microdevice substrate is transparent, all the micro-LEDs can be inspected from the substrate backside. Test data will be stored and analyzed in a computation system (103-1) to generate the print (transfer) digital file and yield analysis.

Figure 14:
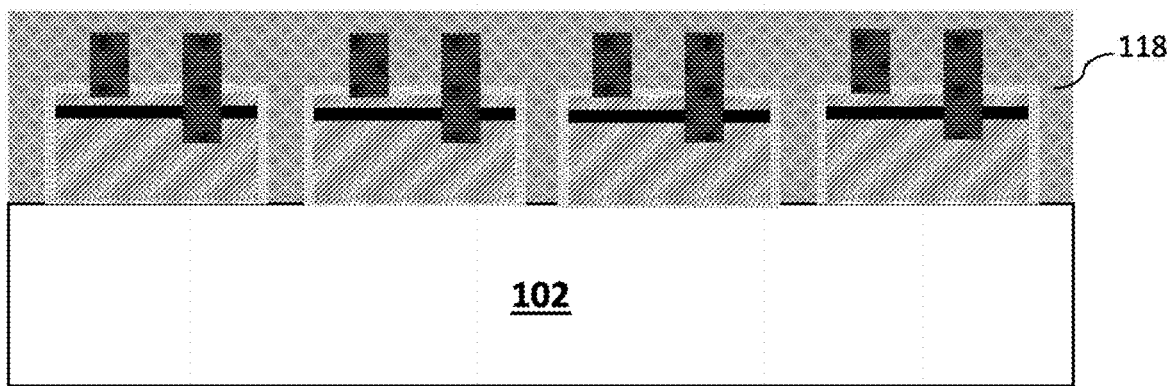
FIG. 14 depicts micro-LEDs on a substrate covered with a polymer film.
Figure 15:
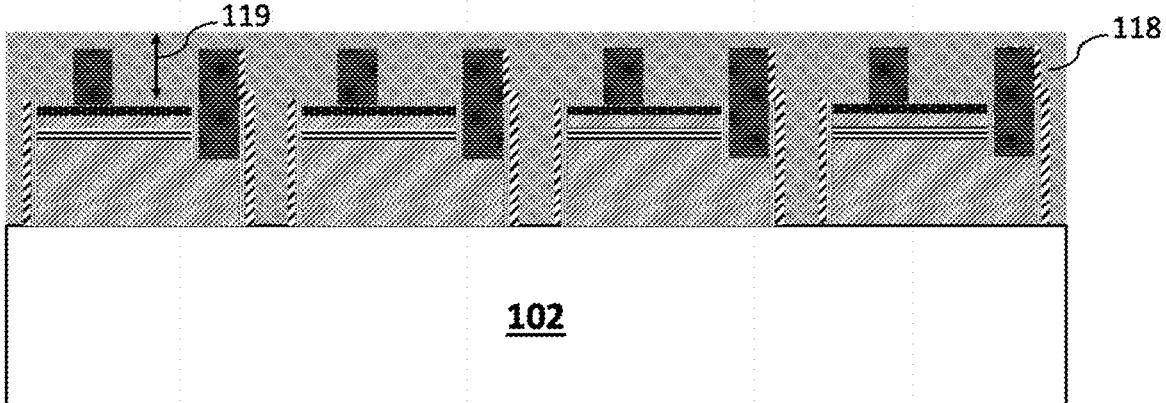
FIG. 15 depicts micro-LEDs on a substrate covered with a polymer with a thickness which can be variable.

As shown in FIG. 14, a photo-sensitive polymer (epoxy) (118) is then coated (spinning, blade, spray, or . . . ) on the micro-LED substrate. The micro-LEDs can have or not have a surround electrode and can have any structure or any geometry that is mentioned in previous embodiments or it can be any geometry that is not mentioned here. The micro-LED structure is not limited to what has been shown until now and it can be a vertical micro-LED or any other flip-chip micro-LED structures The photo-sensitive polymer can be coated with different heights (thicknesses). In FIG. 15, the polymer thickness (119) is larger than the micro-LED height and the cathode and anode pads are covered with the polymer.

Figure 16:
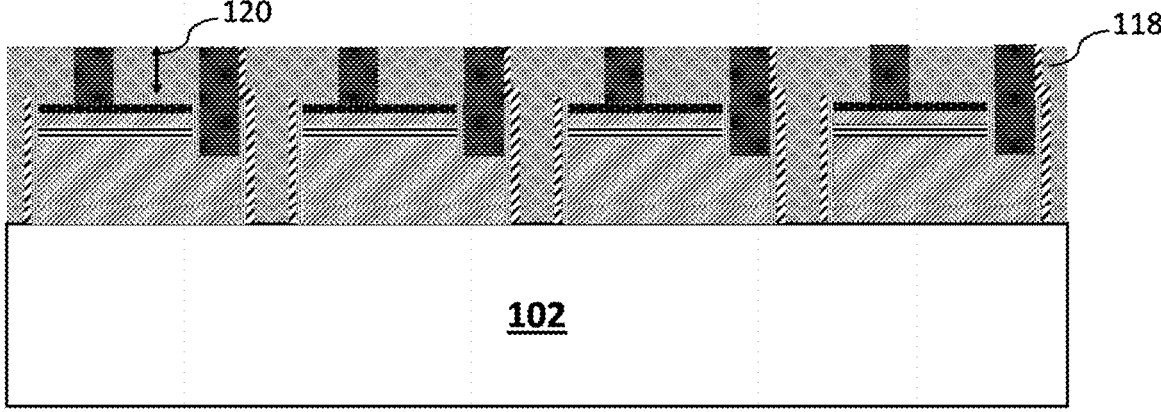
FIG. 16 depicts micro-LEDs on a substrate covered with a polymer with a thickness which can be variable.

In another embodiment, FIG. 16, the polymer thickness (120) is the same as the height of the micro-LEDs and the pad's topside is exposed. It can be achieved by engineering the coating condition or by removing the excess polymer after patterning (using a combination or a physical/chemical process).

Figure 17:
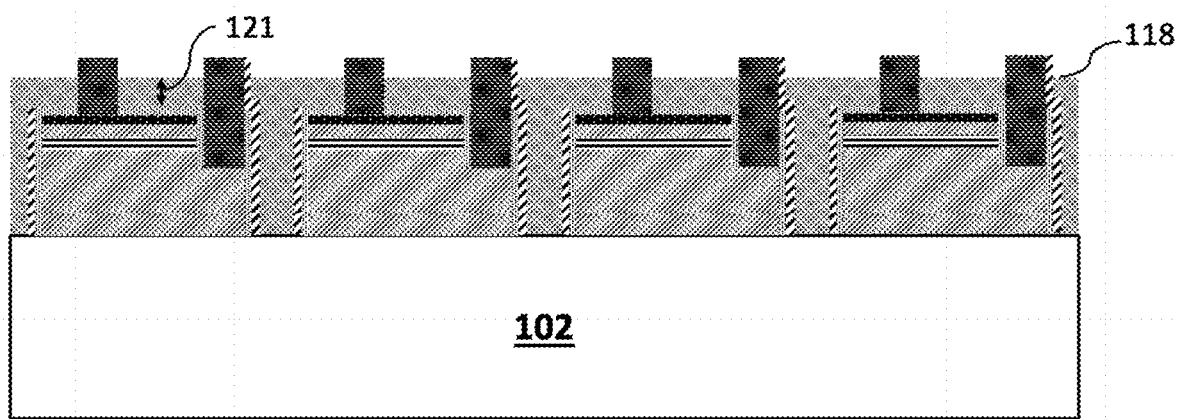
FIG. 17 depicts micro-LEDs on a substrate covered with a polymer with thickness which can be variable.

In another embodiment, FIG. 17, the polymer thickness (121) is less than the height of the micro-LEDs and a larger part of the micro-LED's pads are exposed. The thickness of the polymer can be tuned by the coating parameters, or another etch (or ash) step using gases such as $O_2$, $CF_4$ or etc. The polymer after coating should be cured to remain fix for the next step processing. However, it should not completely cure to be used for the packaging process.

Figure 18:
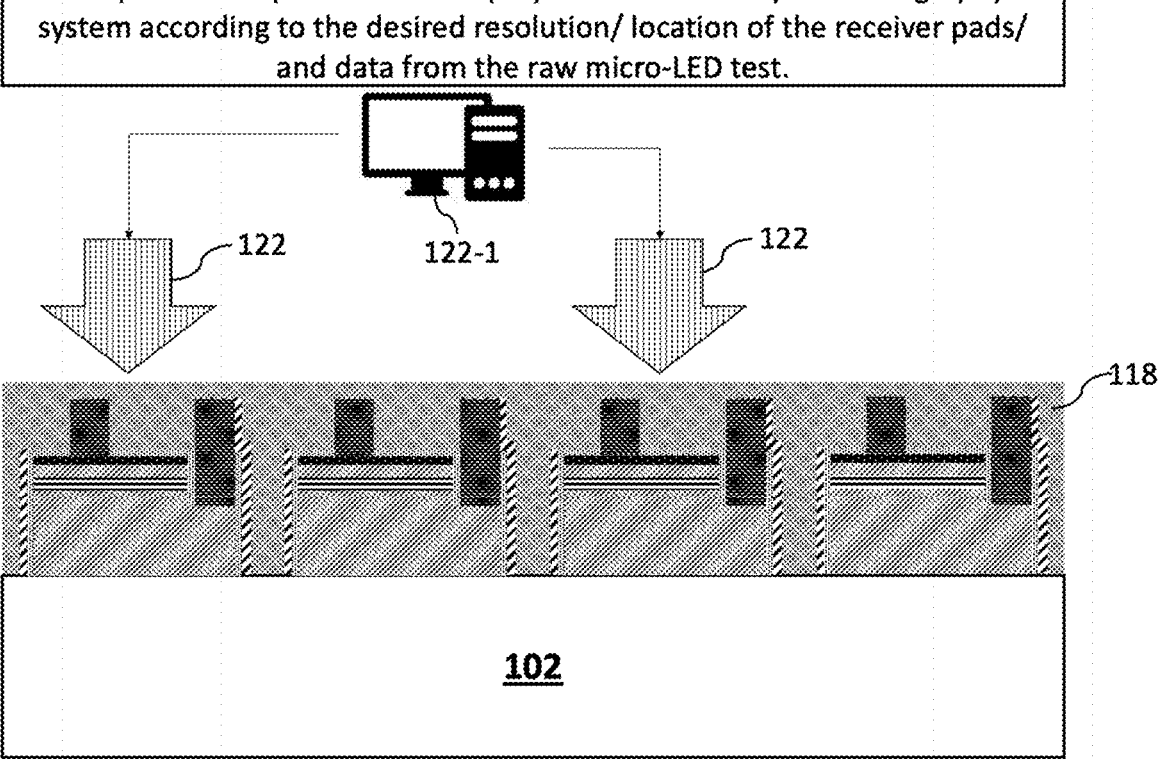
FIG. 18 depicts laser/optical beams used for patterning the photo-sensitive polymer.

As shown in FIG. 18, a direct laser lithography, a hard mask-based lithography, contact lithography, or other optical patterning techniques can be used to expose a desired pattern 12 into the photo-sensitive polymer. The optical beams (122) to be used for patterning the photo-sensitive polymer are shown in FIG. 18. The optical beam intensity, size, overlap, and focus depth should be defined to only expose the polymer to achieve the desired pattern. The lithography pattern is loaded from a computation unit (122-1) according a digital file (GDS/CAD) generated based on the desired display resolution, location of the receiver pads and data from the raw micro-LED test process.

Figure 19:
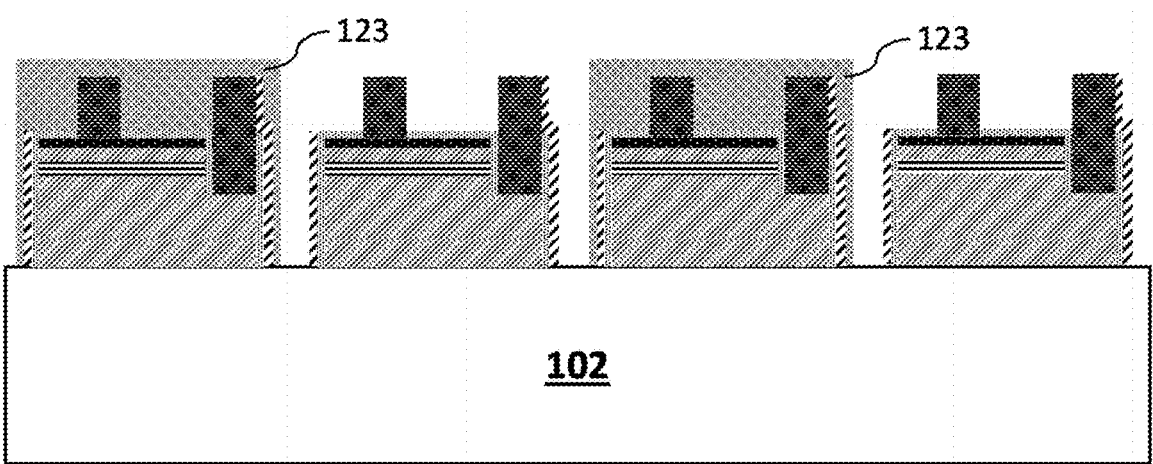
FIG. 19 depicts the micro-LEDs on a substrate and the patterned polymer covering only pre-defined micro-LEDs.

After exposure, development and any required washing steps, the patterned photo-sensitive polymer (123) is shown in FIG. 19. The photo-sensitive polymer should remain on the micro-LEDs that needs to be transferred. The defective micro-LEDs that were detected in the test process, can be neglected to be covered with polymer. It can be engineered based on the digital file generated for selective transfer printing after electrical/optical test. Also, the photo-sensitive polymer can be a positive or negative tone photoresist. The polymer is not completely (fully) cured. It can be a two or three step cure polymer and the fully cure step can be achieved during the next steps. The photo-sensitive polymer pattern is then defined based on the required resolution for the micro-LED display resolution and geometry.

Figure 20:
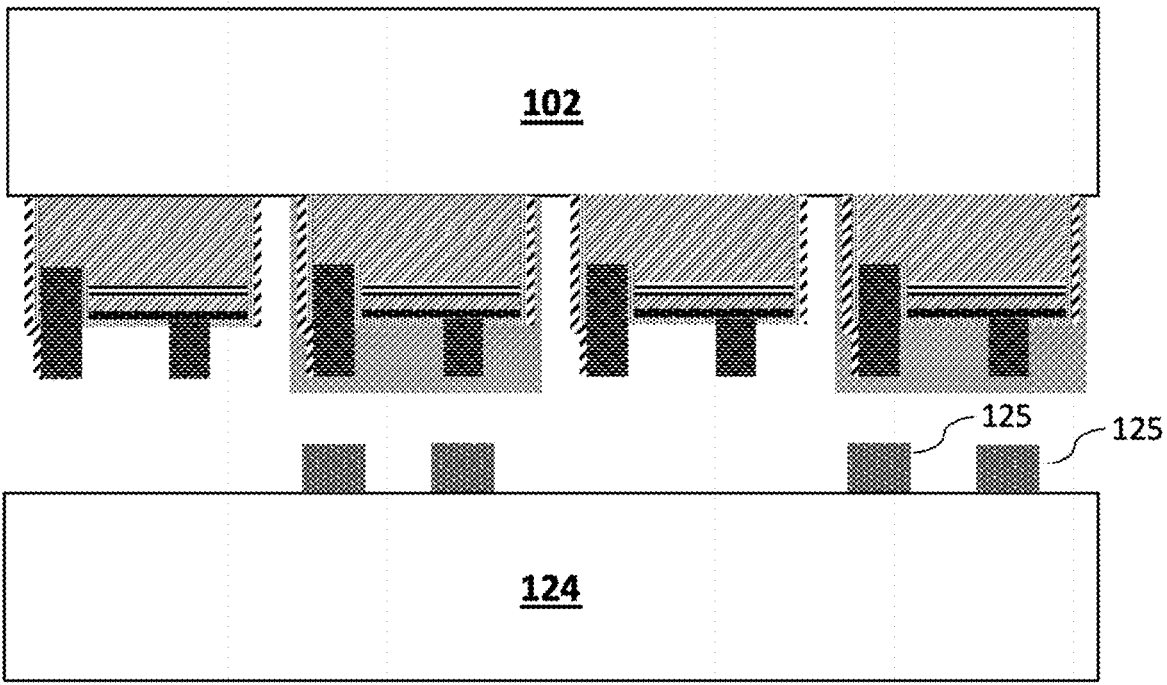
FIG. 20 depicts the micro-LED substrate flip-chipped to be bonded onto another substrate (back-plane) with exposed electrodes.

As shown in FIG. 20, the micro-LED substrate (102) with patterned photo-sensitive polymer is flip-chip aligned onto a receiver substrate (124) that can be a backplane, substrate with or without active driving circuit, passive driving lines or a substrate with through vias connecting the topside to the backside. The substrate can be flexible or rigid and there is no limitation abut the substrate material. The micro-LED pads are aligned to the received pads (125) on the receiver substrate. The pads can be electrically active or can be temporary pads that can keep micro-LEDs for the next transfer process. The alignment process can be performed through the transparent micro-LED substrate or using optical elements between two substrates. Machine vision can facilitate and automate the alignment process. For alignment, depending on the consequence of the transfer process, several fiducial patterns can be considered which can be used as a reference for each transfer step. The fiducial can be from the same micro-LED material and be removed (or released or transferred) at the same step with affiliated micro-LEDs. Also, the remained fiducial patterns are matched with another series of micro-LEDs that should be transferred (printed) in each step.

Figure 21:
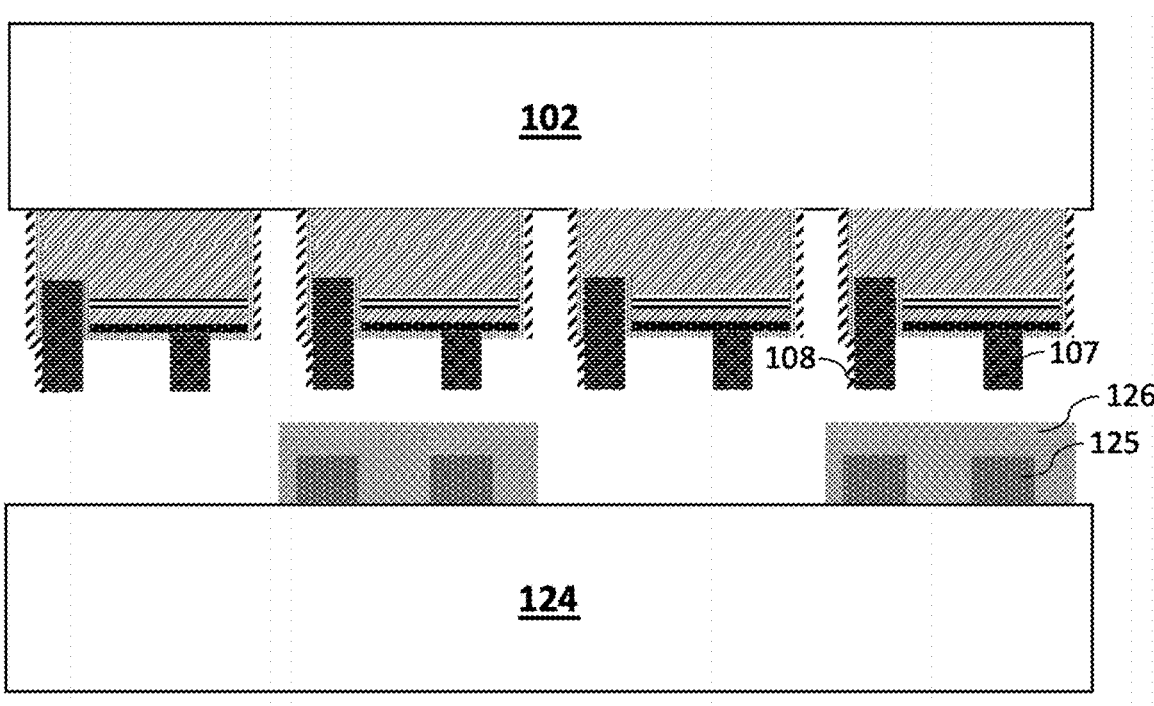
FIG. 21 depicts the micro-LED substrate flip-chipped to be aligned and bonded onto another substrate (backplane) with electrodes covered with a polymer.

In another embodiment as shown in FIG. 21, a photo-sensitive polymer (126) is patterned on the receiver pads (125) using the same lithography steps described earlier. The height of the polymer on the receiver pad can be tuned and it can provide further mechanical strength. Since the polymer is not cured and is till soft, the micro-LED pads (anode and cathode), (107) and (108) for example, can penetrate through the polymer and provide the electrical contact. The photo-sensitive polymer is not only limited to each micro-LED or receiver pads and both structure can be coated with photosensitive polymer. The fiducial pattern can be covered with the photo-sensitive polymer to be transferred. The thickness of photo-sensitive polymer (126) on receiver pads (125) can be tuned by coating parameters or by employing a physical/chemical process after patterning. The receiver substrate can only have the photo-sensitive polymer without the electrical pads (125). This photosensitive polymer on the receiver substrate can be used as a temporary bonding for the next step transfer/processing.

Figure 22:
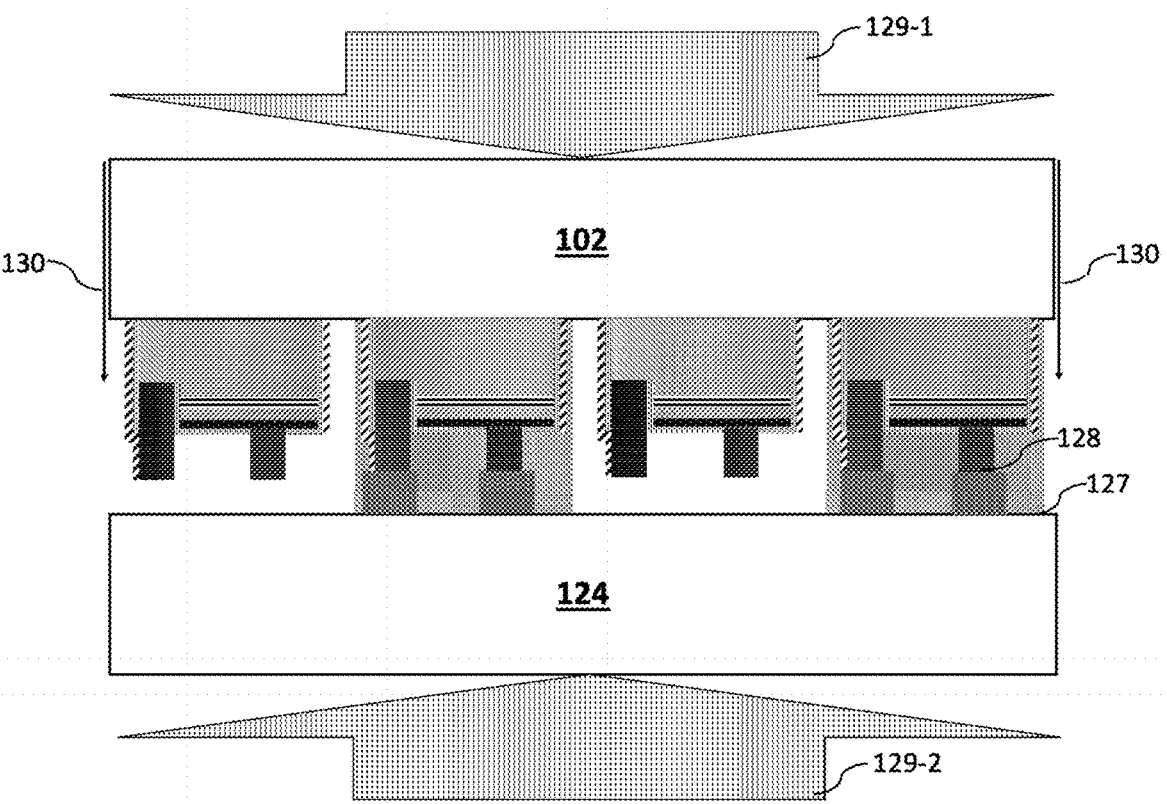
FIG. 22 depicts the micro-LED substrate and secondary substrate bonded by force and heated with an optical beam or heat from the holder or micro-device substrate.

FIG. 22 depicts the bonding process where the micro-LED substrate is pushed towards the receiver substrate pads with force (130). The force (130) should be large enough that the micro-LED electrodes (pads) can penetrate through the photo-sensitive polymer and reach 14 the receiver substrate pads and make electrical contact (128). The force should be too large to squeeze the polymer during the bonding and cause polymer bleeding. The photo-sensitive polymer should fill the gap between the micro-LED and the receiver substrate as shown in (127) where the polymer is touching the receiver substrate. This gap can be filled with the photo-polymer from the receiver substrate or from the polymer from the microdevice substrate. When the force is applied (or after applying the force) the photo-sensitive polymer can be cured 16 using a laser/optical beam emitted through the transparent micro-LED substrate (129-1) or through the receiver substrate (129-2). Also, (129-1) and (129-2) can be any other kind of heaters implemented in the carrier stage or mounting arm and the type of source is not limited to any specific technology. The curing process converts the photo-sensitive polymer into a more solid material that can support the laser lift-off process. Additional curing steps might be required to finalize the curing process and possible after any rework. Since the other micro-LEDs are not covered with photo-sensitive material and not in touch with any pad on the substrate, they can remain intact and be used for the next transfer process.

Figure 23:
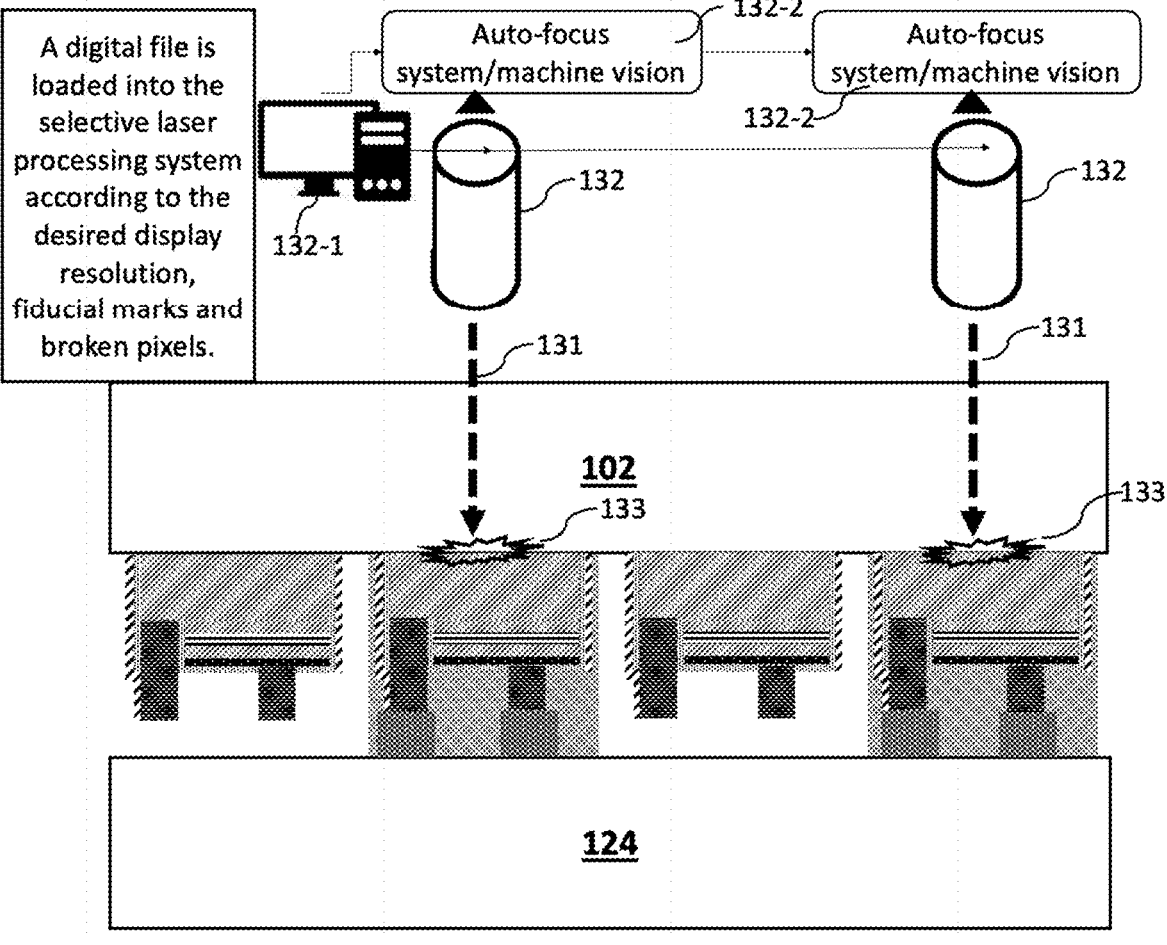
FIG. 23 depicts the bonded structure while a laser beam is illuminated onto the bonded micro-LEDs' interface with the substrate. It can be a laser-liftoff process.

FIG. 23 shows a selective laser-liftoff process where the laser source (132) generates laser beam (131) that can pass through the microdevice substrate (102). The laser beam (131) will be absorbed at the interface between micro-LED and microdevice substrate, as shown in (133), and a laser-liftoff will happen due to material decomposition, burning, or any other physical, chemical reaction at the interface between micro-LED and microdevice substrate. As a result, the micro-LED will be detached 18 from the microdevice substrate (102) or can be loosed with a weak adhesion. In order to increase the throughput, multiple laser sources/beams can be used to simultaneously perform the laser-liftoff process. The location of the laser beam can be generated by a hard mask, a diffractive beam splitter, or any other beam shaping technologies. The laser beam location should be matched with the location of the bonded micro-LEDs according to the uploaded digital file (GDS, CAD or any other file) from a computation unit (132-1) into the laser processing (printing) system. The computation unit can be a network of systems that extract data from the raw micro-LED test results, selective laser processing (printing), micro-LED display test station after transfer process, and the repair process. A machine vision system (132-2) can be used to perform the autofocus and check the quality of the laser-liftoff process. The machine vision can be integrated through the laser optics into the system, or it can have separate optical structure.

Figure 24:
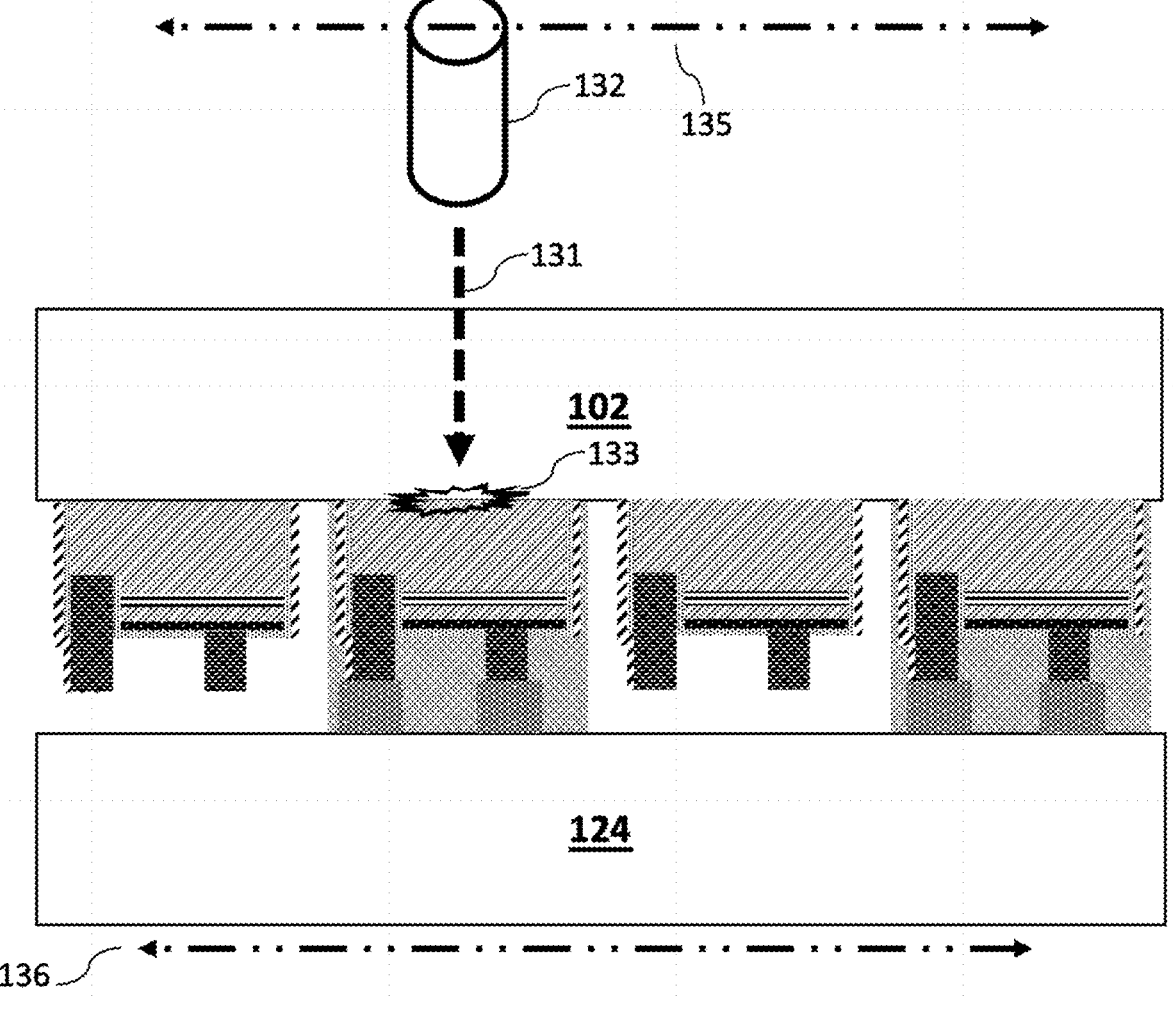
FIG. 24 depicts a laser beam that can move on top of the micro-LED substrate or the whole package can move to laser process selectively.

As shown in FIG. 24, in order to sync the laser beam with the location of the micro-LEDs, the laser beam/source can move, as shown by (135), on top of the microdevice substrate (102). Also, the laser beam/source can be fixed and the microdevice substrate can move, as shown by (136). Both laser beam/source (131, and 132) and microdevice substrate (102) can move at the same time. The laser operational frequency and the moving speed (either laser or substrate) should be synced as the laser beam only turns ON when the beam is located on top of the bonded micro-LEDs. This selective laser processing (liftoff) only releases the bonded micro-LEDs and the remain will remain intact.

Figure 25:
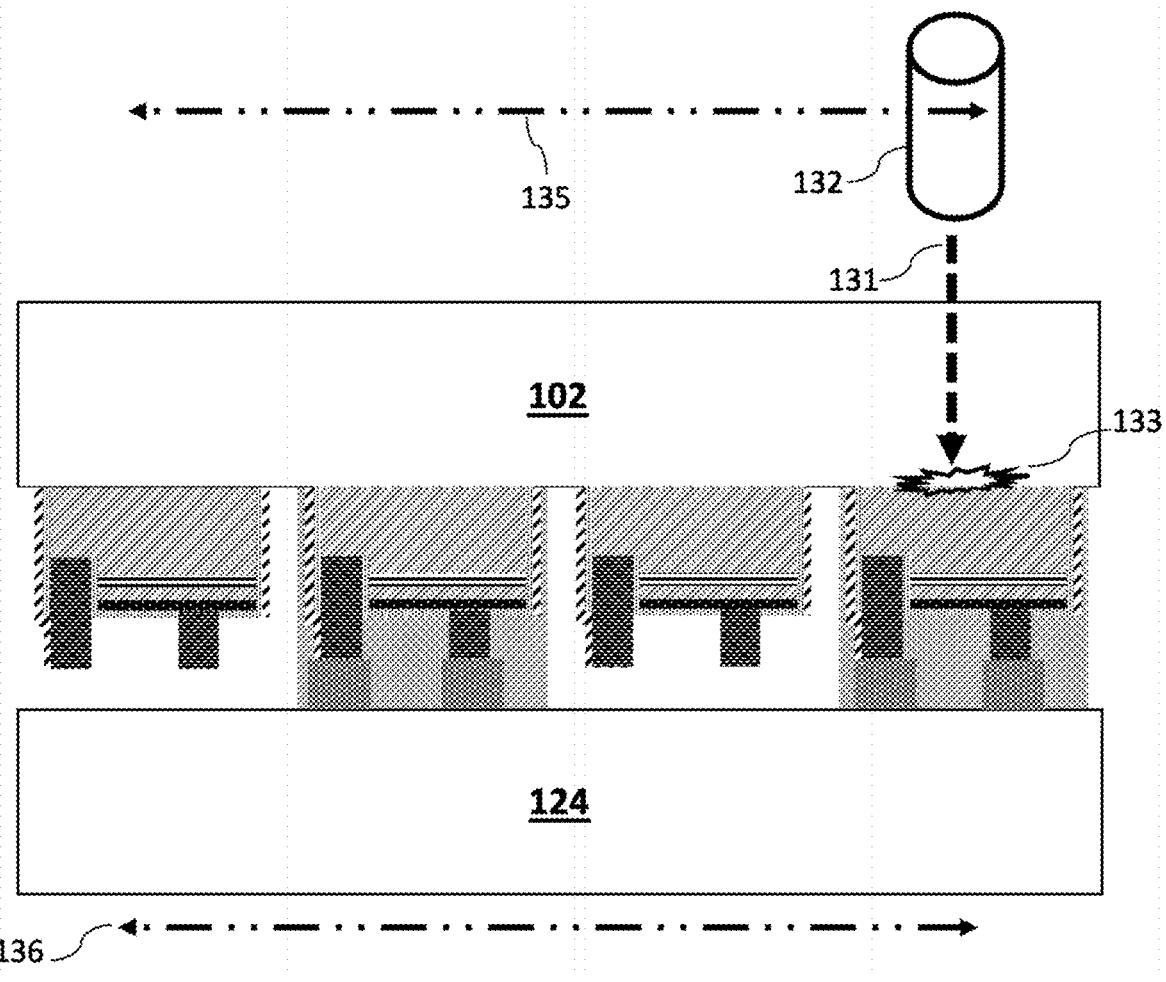
FIG. 25 depicts a laser beam that can move on top of the micro-LED substrate or the whole package on a stage can move to laser process selectively.

FIG. 25 shows when either the laser source is moved as (135), or substrate moved as (136). The laser beam is ON over another micro-LED and laser-liftoff happens. This optical processing can be performed with a masking layer too.

Figure 26:
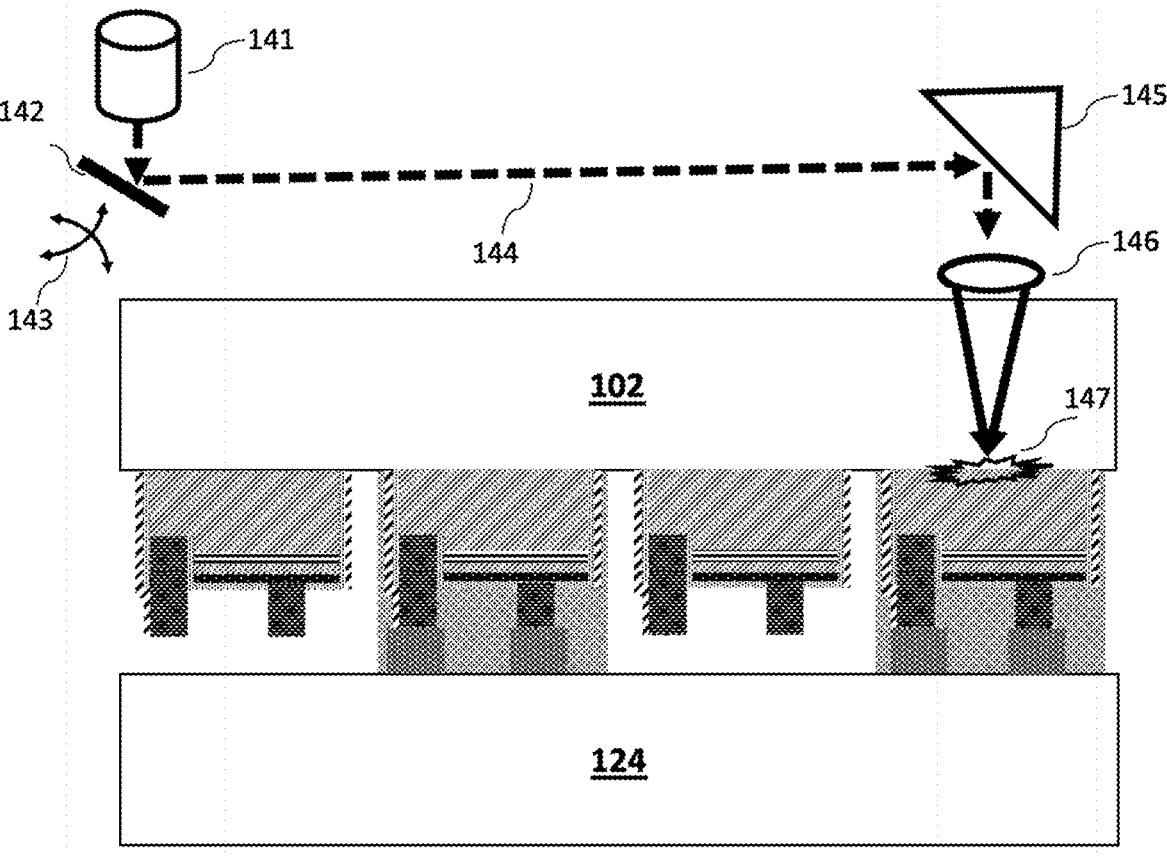
FIG. 26 depicts a system for laser processing when the laser source is fixed, and the beam can be used to scan selectively over the micro-LED substrate using mirrors and optical elements.

FIG. 26 shows another set-up for the digital selective laser printing process when the laser source (141) is fixed, and a scanning mirror, or Galvano mirror (142) can be used to direct the laser beam towards other optical elements. The fast-scanning mirror (FSM) (142) can move in x, or y and can rotate as shown in (143) to guide the laser beam towards the optical elements. An optical element (145) that can be a prism, a mirror, or any other element is used to direct the laser beam towards the micro-LEDs. A focusing lens (146) such as f-theta or other focusing system can be used to focus the laser beam onto the micro-LED interface with the microdevice substrate (147).

Figure 27:
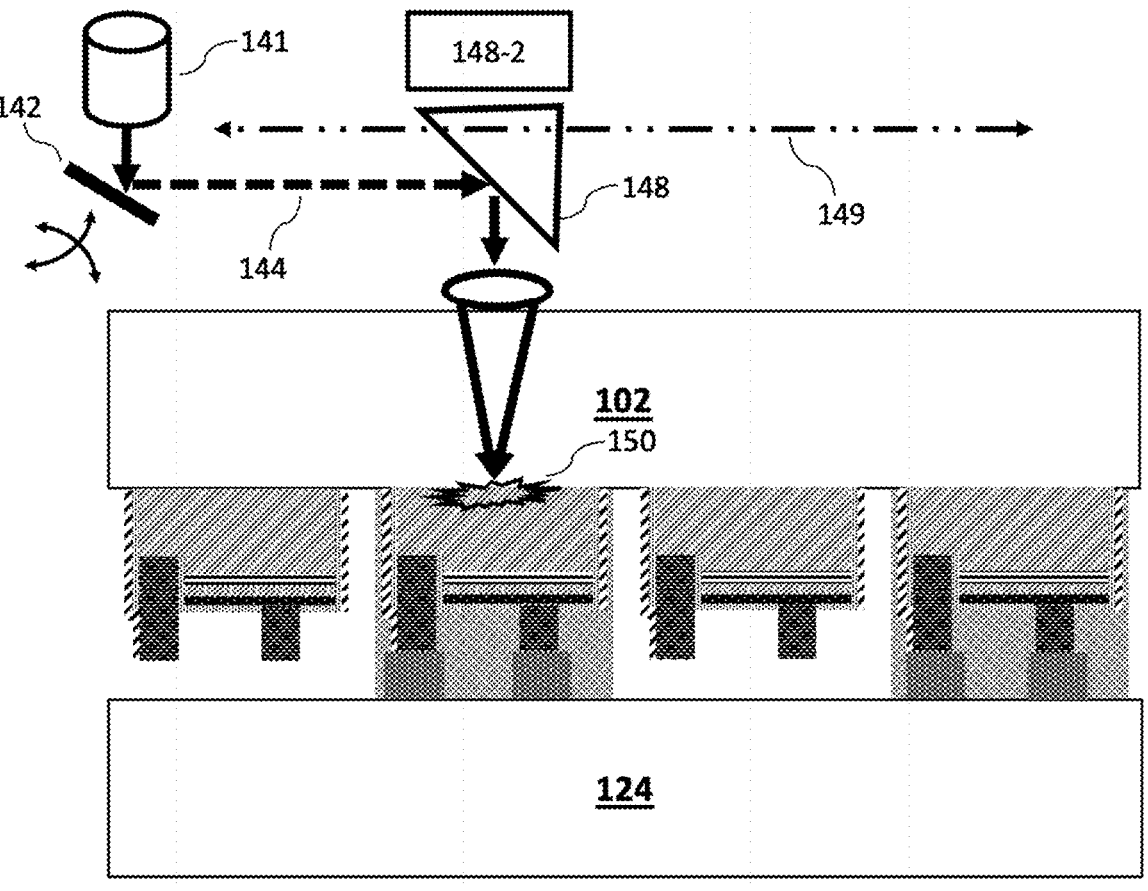
FIG. 27 depicts the same system as shown in FIG. 26 while the optical system moves to shape the optical beam or process a specific location of micro-LED substrate. A machine vision system can be integrated to the system.

As show in FIG. 27, the optical element (145) and focusing lens (146) can move synchronously or separately over the new micro-LED for a selective laser-liftoff (150). The moving line is shown as (149). The speed and rotation of the optical elements, mirrors and lenses can be tuned or synced to get a selective laser process only on the bonded micro-LEDs. A machine vision focusing system (148-2) can be integrated to check the focus depth of the laser beam.

Figure 28:
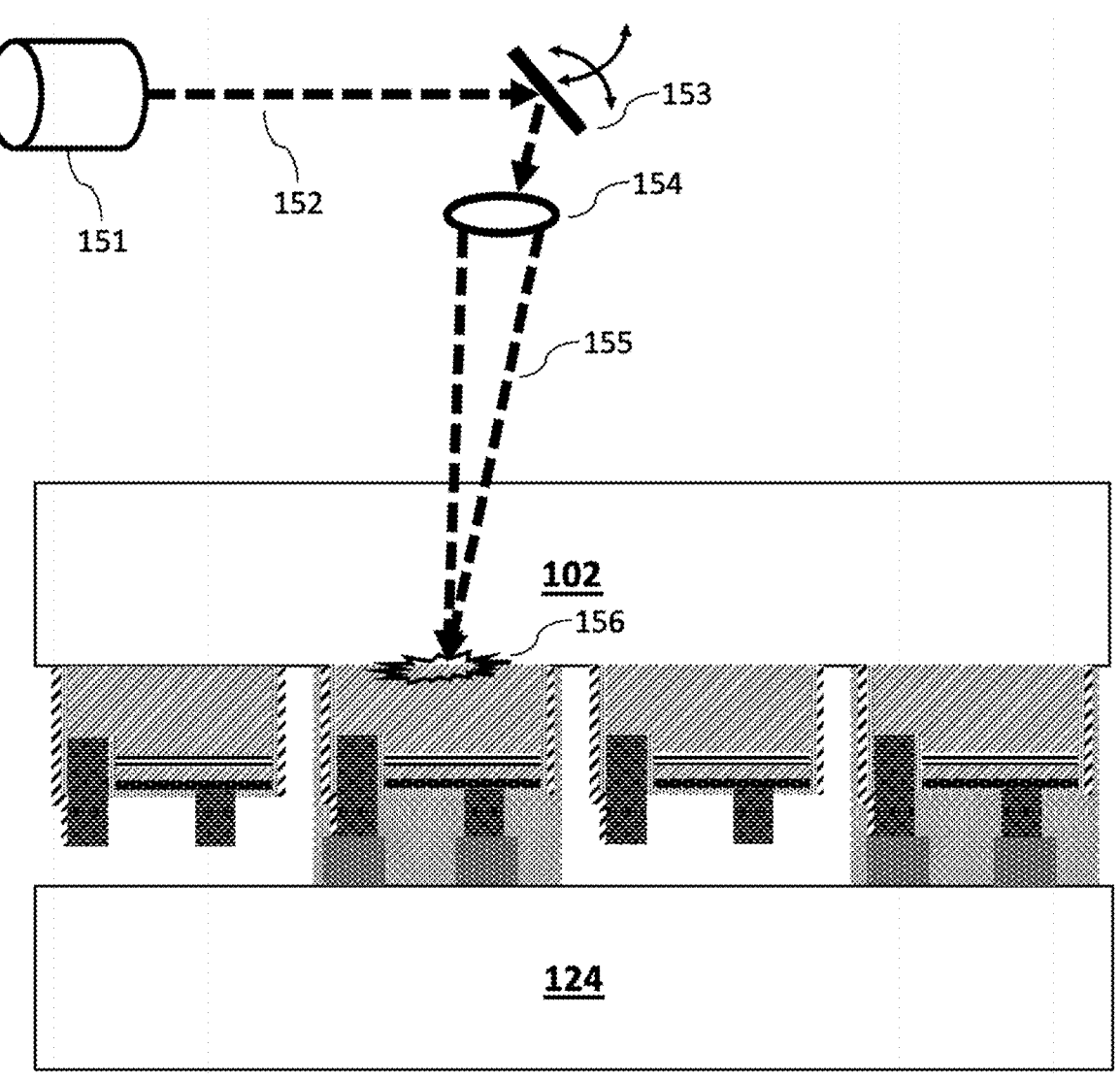
FIG. 28 depicts a laser processing system when the laser beam is fixed, and a scanning mirror is used to scan the micro-LEDs' backside for selective processing.

As shown in FIG. 28, the laser beam (152) can be directed towards the bonded micro-LED interface (156) using a FSM or Galvano mirror and focusing lens (154). In this case the laser source (151) needs to be directed towards the scanning mirror (153). The focused beam (155) will heat the micro-LED interface (156) with microdevice substrate (102). The laser source is not limited to the gas laser, solid state laser, or fiber laser. Any kind of laser is compatible with all demonstrated set-ups.

Figure 29:
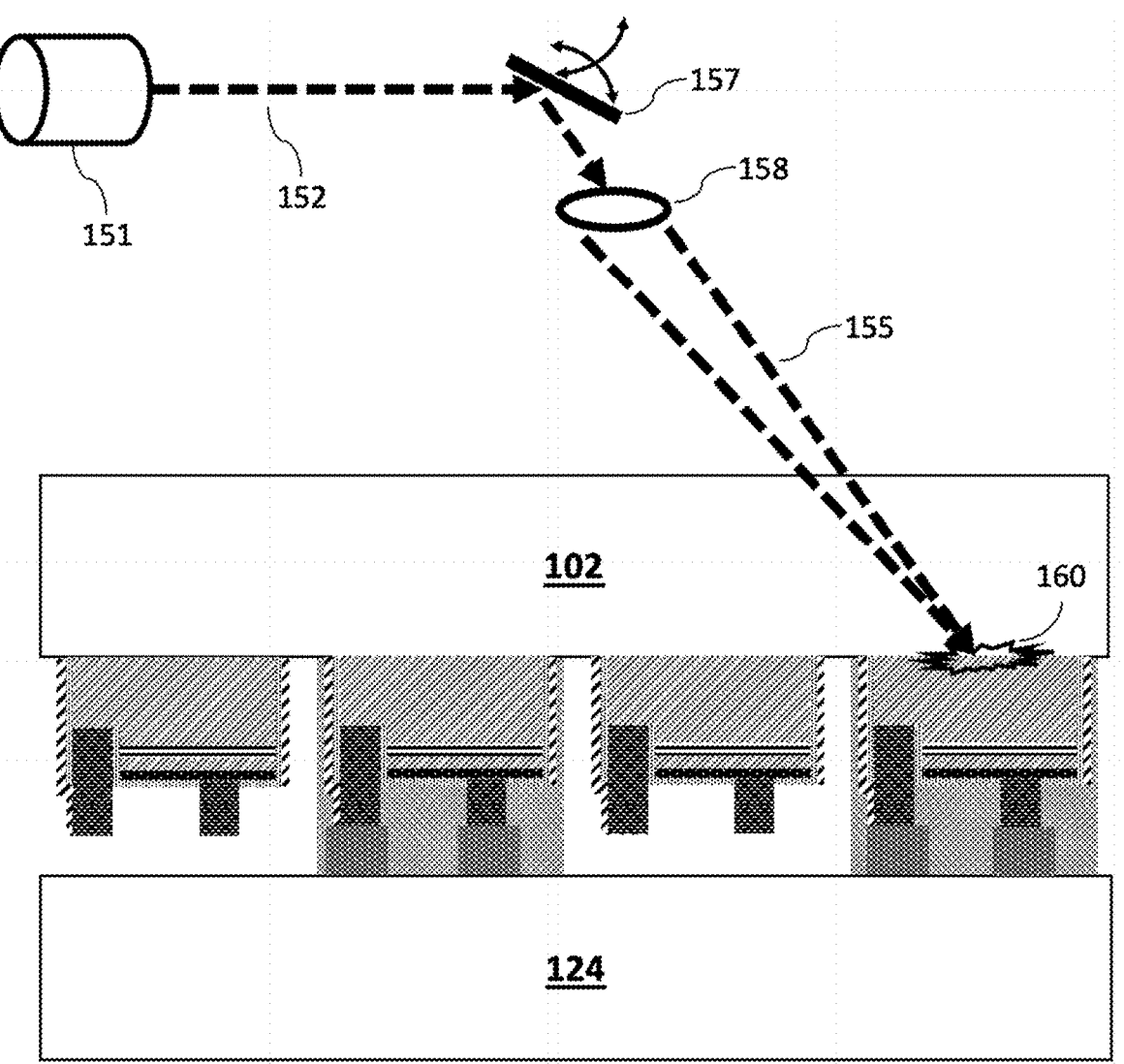
FIG. 29 depicts the system presented in FIG. 28 when the scanning mirror and lens (ftheta) can guide the laser to process another place of the substrate.

As shown in FIG. 29, by rotating the scanning mirror (157) and moving the focus lens (158), the laser beam (155) can be focused onto another micro-LED interface (160). The rotation of the mirror and location of the focus lens can be synced according to the digital input file to selective laser process the micro-LEDs.

Figure 30:
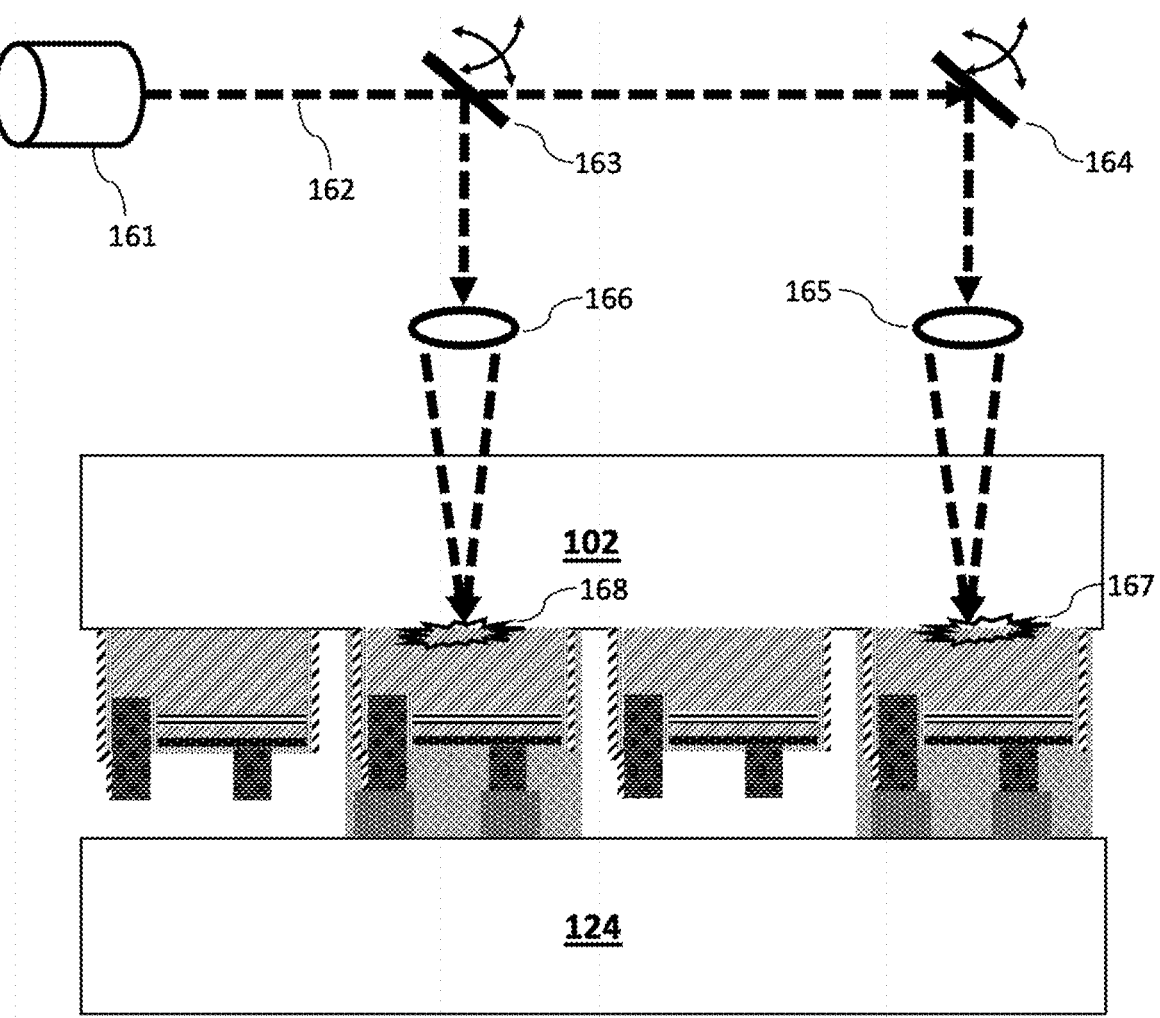
FIG. 30 depicts a laser processing system with multiple mirrors and optics (lens) to increase the throughput.

In order to improve the throughput, as shown in FIG. 30, using a laser source (161), the emitted laser beam (162) can be reflected toward the microdevice substrate using two or more mirrors (163) and (164). The reflected light from each mirror can be focused on the interface between micro-LEDs and microdevice substrate using two or more focusing lens (165) and (166). In this case, simultaneously, two or more laser-liftoff processes (167) and (168) can be performed that increases the throughput of the digital laser printing process.

Figure 31:
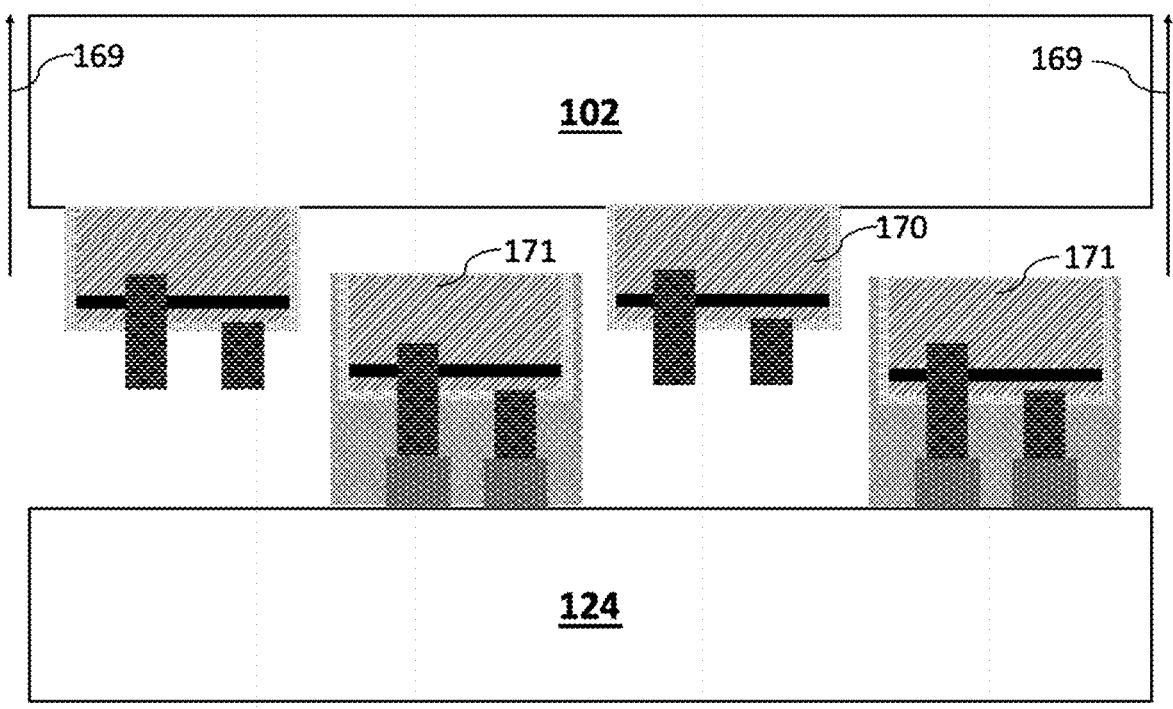
FIG. 31 depicts moving the micro-LED's substrate upward when a portion of micro-LEDs is bonded and transferred selectively onto a receiver substrate.

As shown in FIG. 31, when the laser-liftoff is finished, the microdevice substrate (102) can be moved upward (169) using a head or arm when the intact micro-LEDs (170) are still on the microdevice substrate. The laser processed micro-LEDs (171) are bonded on the receiver substrate (124) and will remain there. It is possible to apply any heat using any source (such as but not limited to laser source or plate heater) to facilitate the release process.

Figure 32:
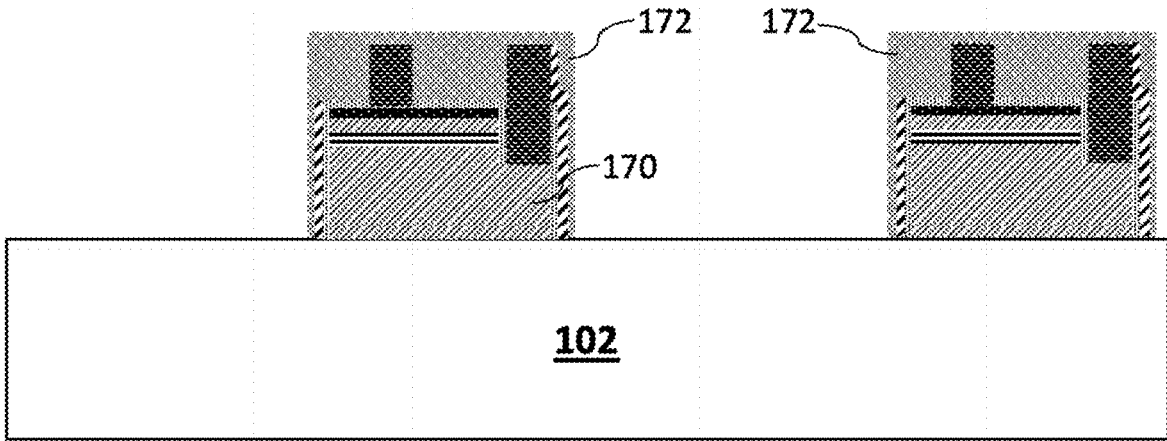
FIG. 32 depicts the remaining micro-LEDs on the growth (process) substrate after covering with a photo-sensitive polymer and ready for a next bonding/transfer process.

As shown in FIG. 32, the remained micro-LEDs (170) can be used for the next transfer process. A photo-sensitive polymer (172) needs to be patterned to cover the remained micro-LEDs (170) or the photo-sensitive polymer should be patterned on the new receiver substrate electrodes (pads). The same coating process, lithography, and development processes that were explained earlier can be used to pattern the photo-sensitive polymer. The lithography process is not limited to what mentioned any other technologies (such as stencil printing, nano-imprint or etc.) can be used.

Figure 33:
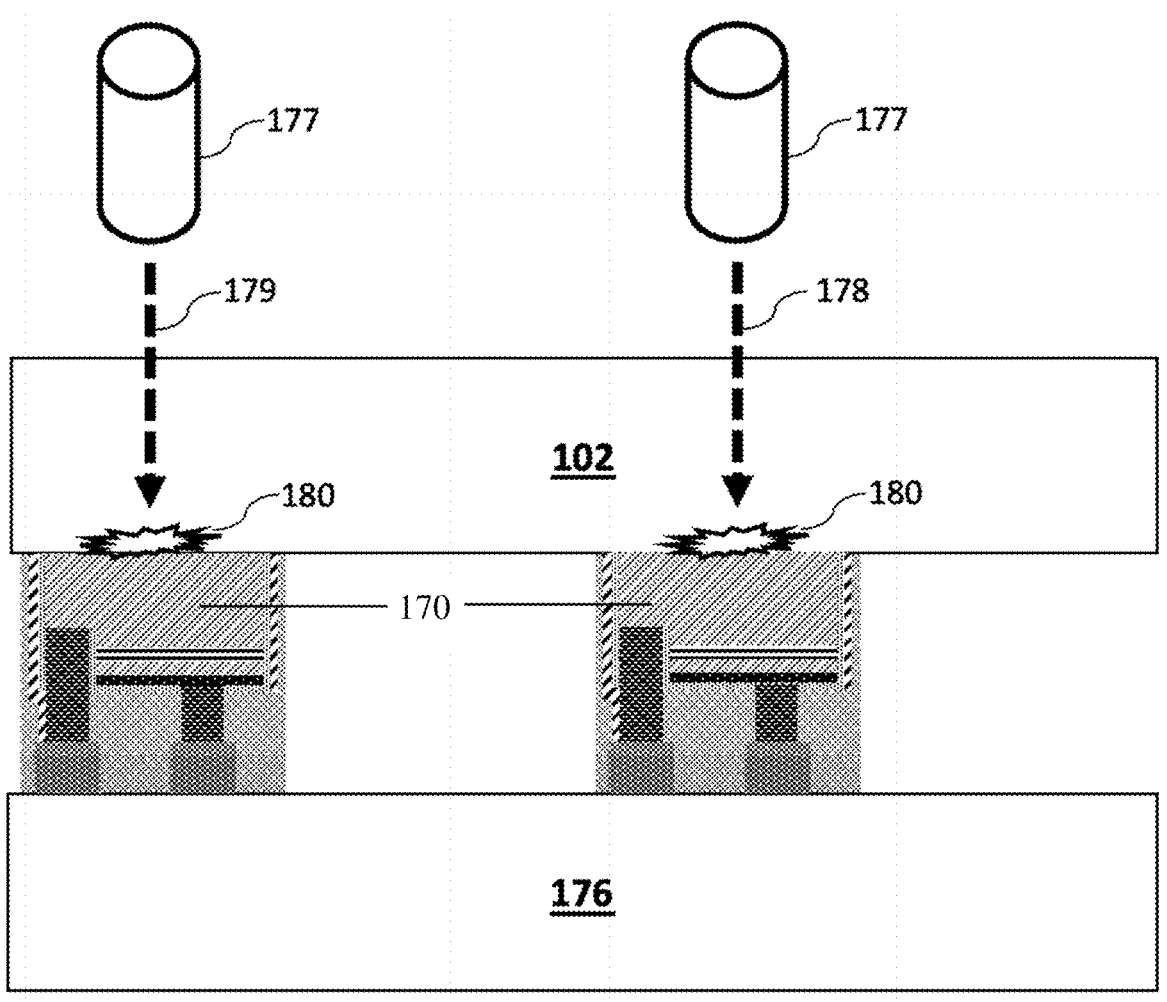
FIG. 33 depicts a laser system processing selective bonded micro-LEDs.

As shown in FIG. 33, the remained micro-LEDs (170) can be bonded onto a new receiver substrate (176) and another digital selective laser processing can be performed. One or two laser sources (177) can be used to guide the laser beams (178) (179) towards the micro-LED interface with microdevice substrate to perform the selective laser-liftoff (180). The laser processing pattern is defined by a digital file loaded into the laser system. The optical set-up is not limited to what is shown in the figures, and any other laser, optical set-up discussed earlier can be employed. The geometry of the pads on the receiver substrate (176) and their coverage with any photosensitive polymer can be the same as previously discussed.

Figure 34:
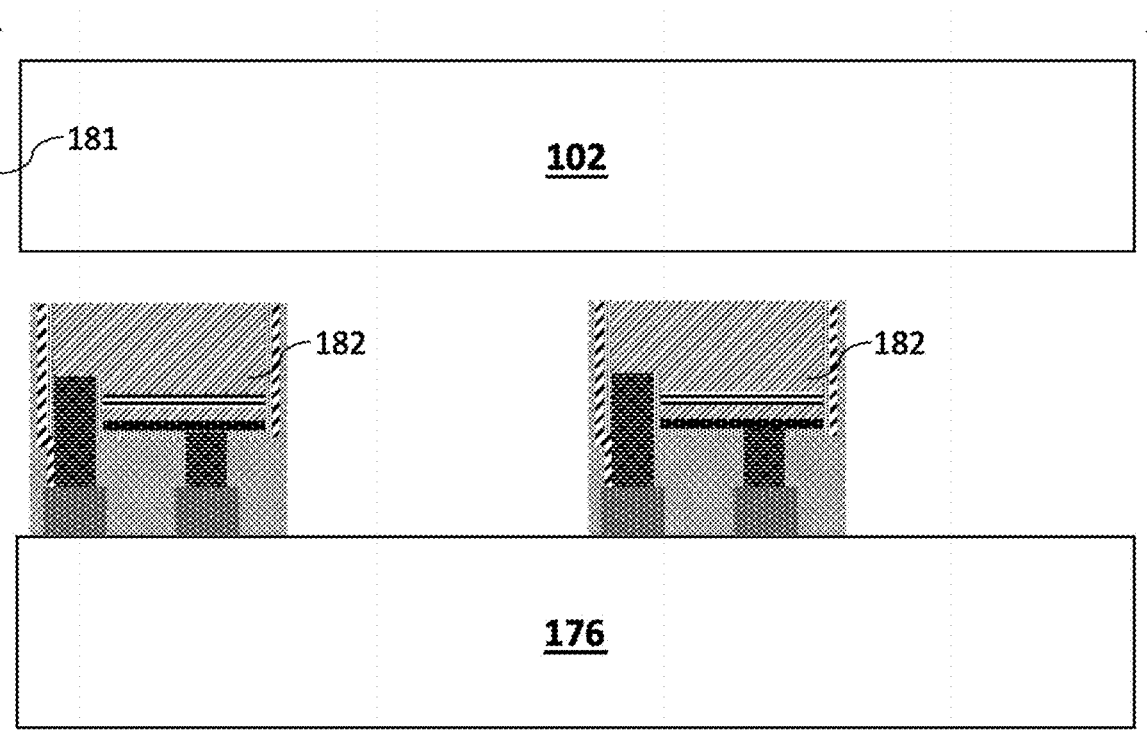
FIG. 34 depicts the micro-LED substrate moving upward when the micro-LEDs are released and bonded onto the receiver substrate.

As shown in FIG. 34, after the selective laser processing, the microdevice substrate can be moved upward (181) or it can be released. The bonded and laser processed micro-LEDs (182) are transferred onto another receiver substrate (176) that can be rigid, flexible, or any other types. This selective transfer process can be repeated several times until all the micro-LEDs are transferred onto various receiver substrates according to the display resolution requirement. The number of transfer process depends on the population (resolution) of the micro-LEDs on the microdevice substrate and the required population (resolution) on the receiver substrate.

Figure 35:
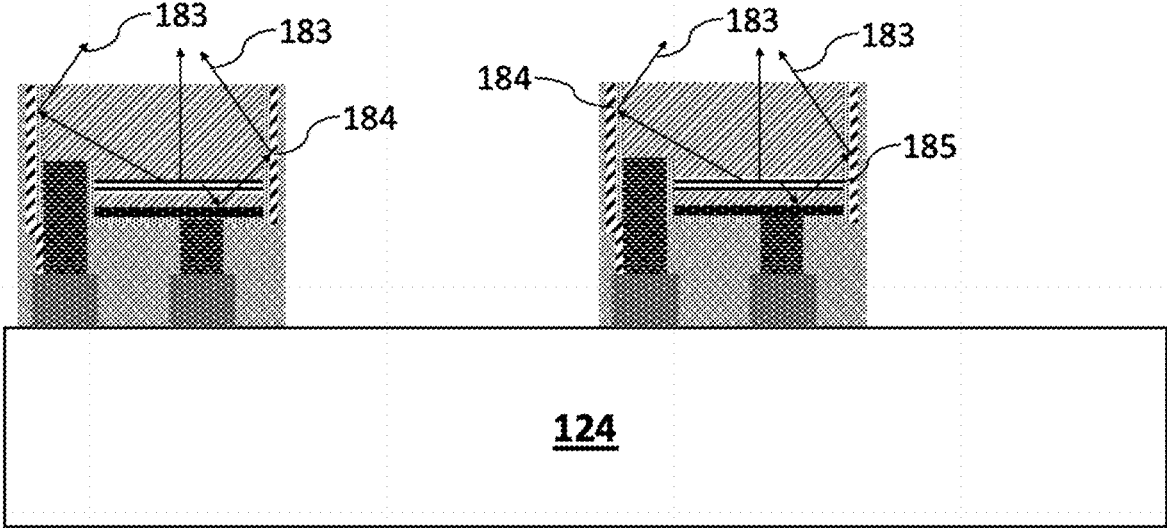
FIG. 35 depicts the optical path when the micro-LEDs' sidewall are covered with a reflective layer.

The optical paths of the emitted photons (183) are shown in FIG. 35. The photons are generated at active region (185) and can be reflected towards the device topside after reflecting from the reflective sidewalls coated layer (184) or from the reflective p-electrode. As a result, there is no crosstalk between the neighbor pixels.

Figure 36:
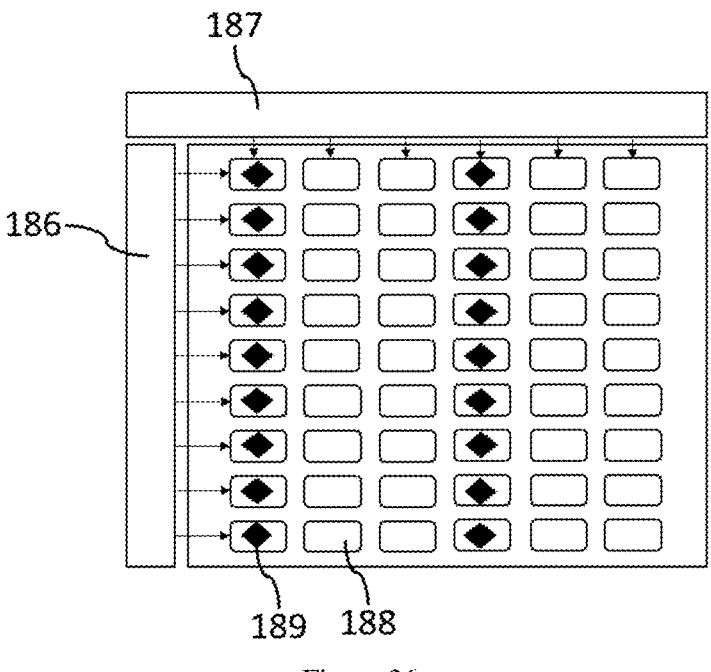
FIG. 36 depicts a backplane/receiver substrate when one type of red, green, or blue (RGB) micro-LEDs are transferred onto it.

FIG. 36 shows schematically a micro-LED display with row (187) and line (186) drivers and other drivers (can be passive or active matrix) where only one type of micro-LEDs (189) is transferred. The neighbor space (reserved area) (188) can be used for the repair process, color-redundancy, or the next color micro-LED transfer.

Figure 37:
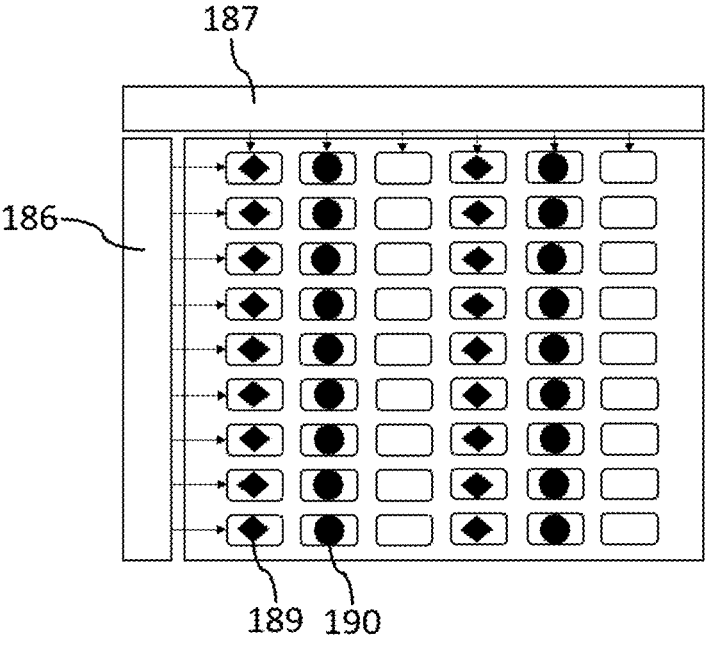
FIG. 37 depicts a backplane when 2 types of RGB micro-LEDs are sequentially transferred onto it.

FIG. 37 shows a micro-LED when 2 types of micro-LEDs (189) and (190) are selectively transferred from the receiver substrate onto the receiver substrate.

Figures 38, 39:
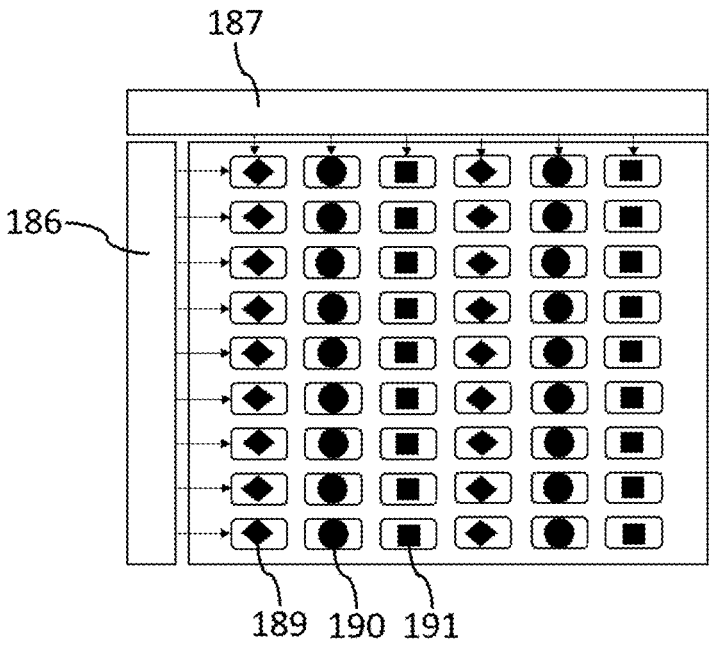
FIG. 38 depicts a backplane when RGB micro-LEDs are sequentially transferred onto the carrier substrate.
FIG. 39 depicts a display module with both micro-LEDs and driving circuits transferred onto it.

FIG. 38 present a full-color RGB (189), (190), (191) micro-LED display when all RGB micro-LEDs are transferred selectively from the microdevice substrates (102) onto the backplane/receiver substrate.

FIG. 39 presents a micro-LED display when driving circuits (192) are also transferred using the selective laser processing process. The line (195) and row (196) drivers can be also transferred using the same process or can be made on the backside of the display be wired to the topside using vias. Micro-LEDs (193) or other optical and electrical elements (such as sensors) (194) can be transferred onto the receiver substrate using the selective transfer process.

Figure 40:
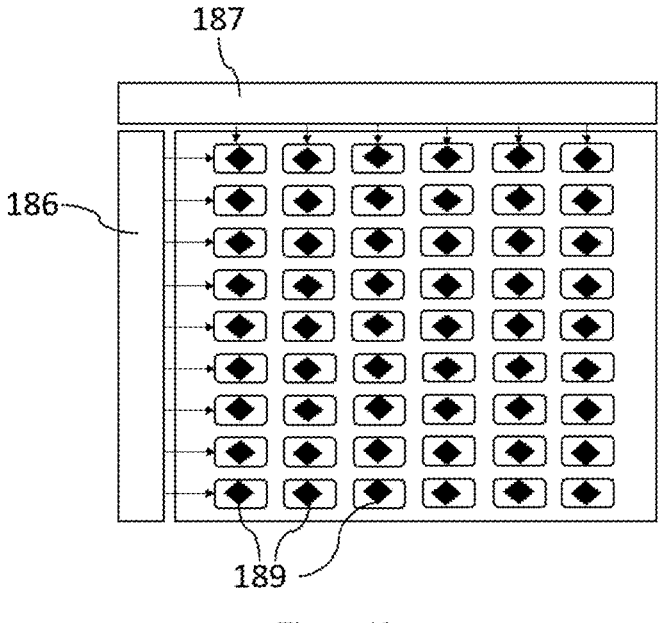
FIG. 40 depict a display module when all micro-LEDs are mono-color (such blue or violet).

FIG. 40 shows a micro-LED display with mono-color emitters (189) where a color filter or color conversion layer needs to be used for generating full RGB colors.

Figure 41:
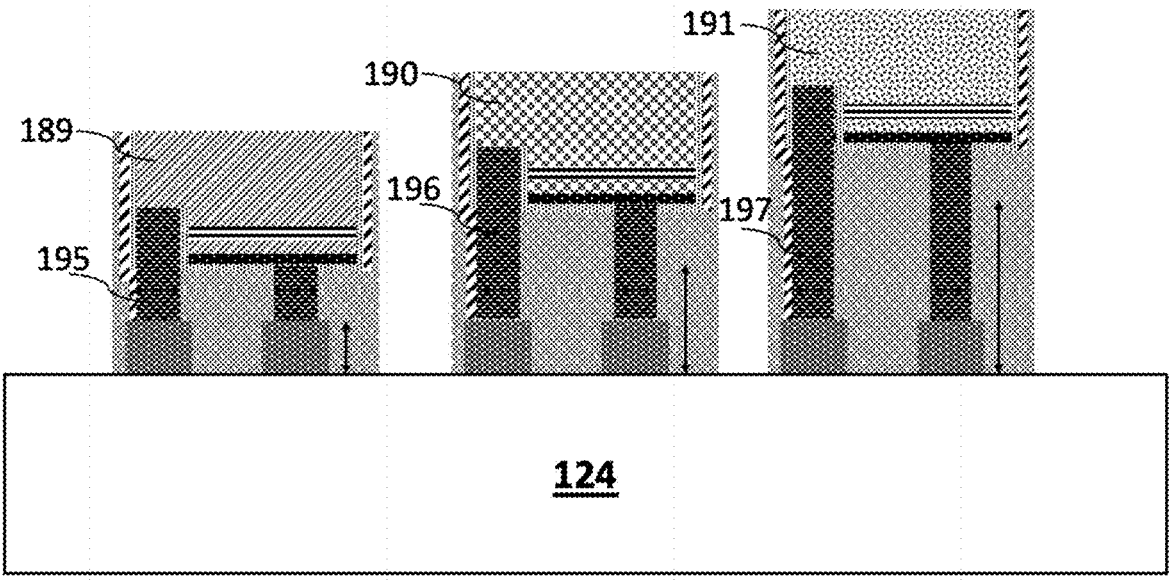
FIG. 41 depicts transferred RGB micro-LEDs with different electrode heights.

As shown in FIG. 41, to prevent any interference between micro-LEDs (189) and (190) and (191) during the multi-step (consequential) selective transfer process, a solution can be using micro-LEDs with different electrode heights (195), (196), and (197). Electrodes with different height can be either made on the receiver substrate or on the micro-LEDs.

Figure 42:
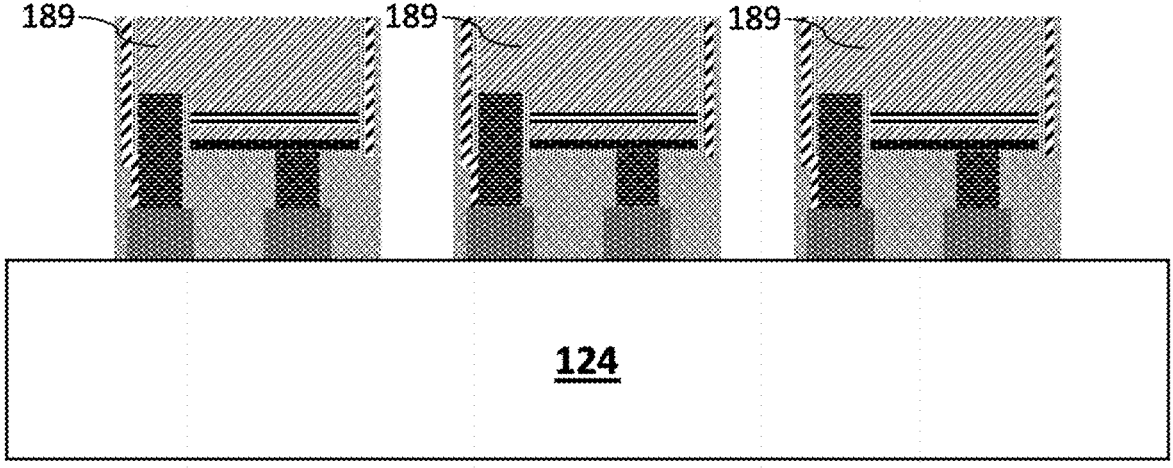
FIG. 42 depicts transferred micro-LEDs onto a receiver (backplane) substrate when all micro-LEDs are the same type.

FIG. 42 shows a receiver substrate/backplane (124) when all micro-LEDs (189) are the same color (such as blue, violet, ultraviolet or any other color).

Figure 43:
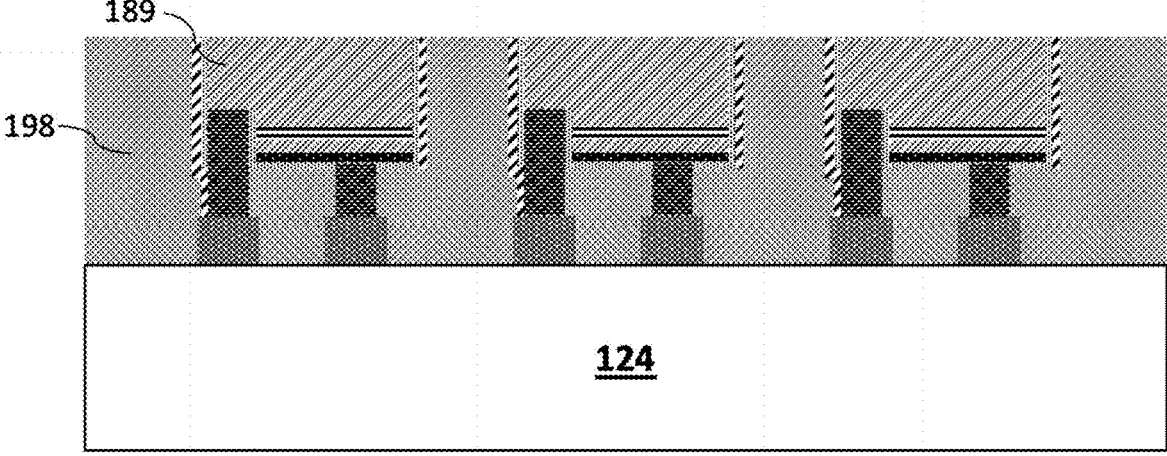
FIG. 43 depicts the transferred micro-LEDs when embedded in a polymer or a planarization polymer is applied.

FIG. 43 shows a mono-color micro-LED display when the surface is planarized using a polymer/dielectric or metallic material (198). The planarization can be done using spin-coating, deposition or any other process. The gap between micro-LEDs can be filled to improve the planarization process.

Figure 44:
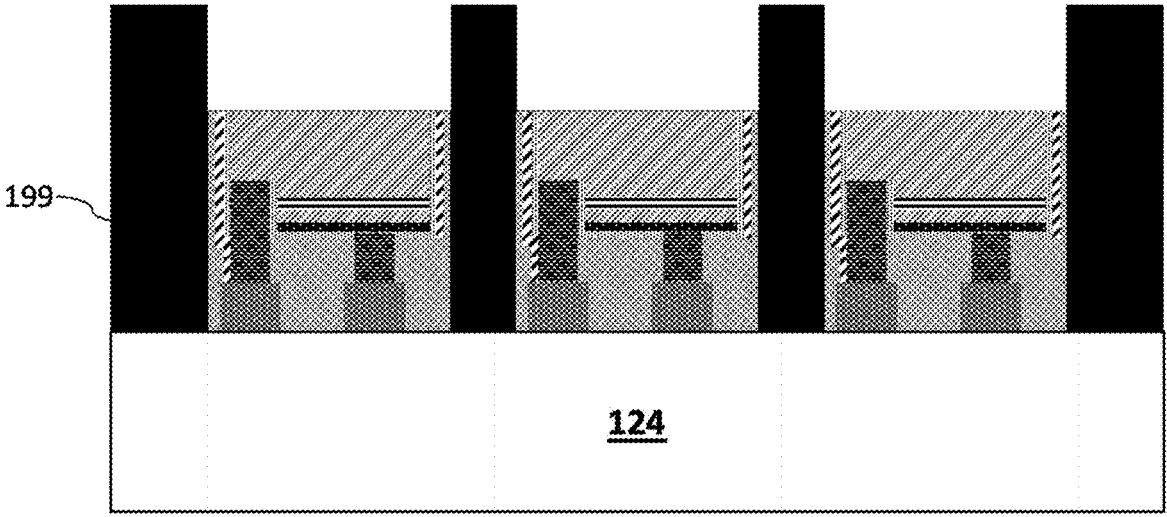
FIG. 44 depicts the micro-LEDs on a receiver substrate when the space between them is filled with a black polymer/material. The height of the black-matric can be variable.

FIG. 44 shows a micro-LED display when the space between the micro-LEDs is filled with a black matric or another optically black (non-reflective) material (199). The thickness of the black material can be engineered using the coating/deposition process parameters. It depends on the next coating/bonding micro-fabrication process.

Figure 45:
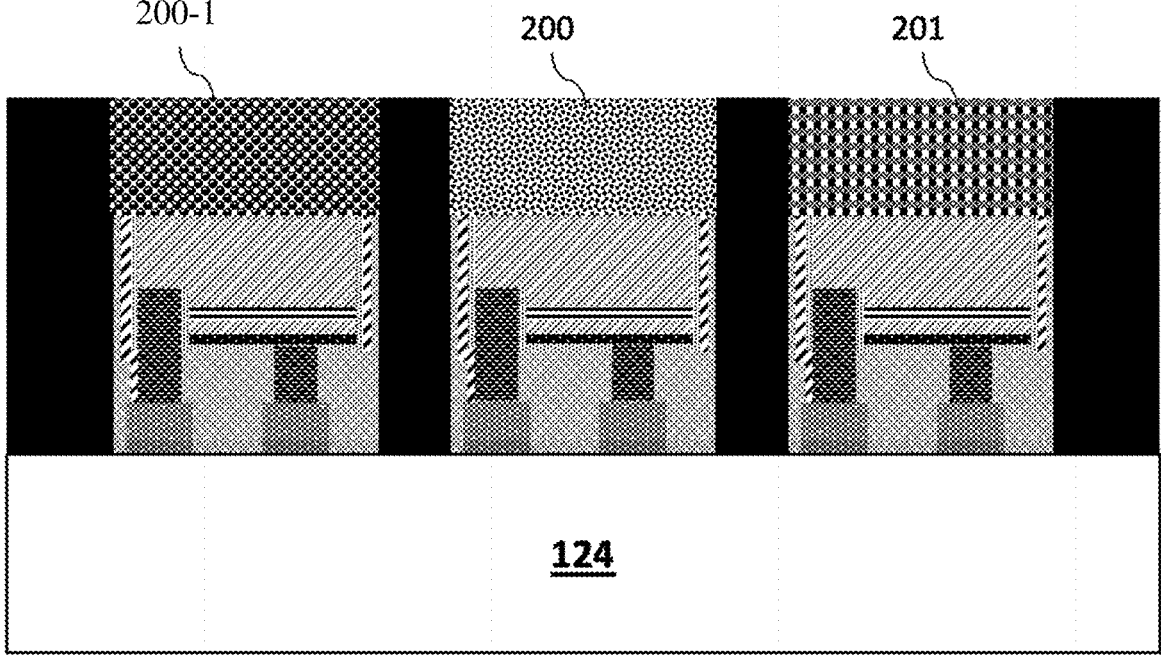
FIG. 45 depicts micro-LEDs on the receiver substrate and color-conversion materials patterned on them.

As shown in FIG. 45, in order to get a multi-color emission from a mono-color transferred micro-LEDs, a color conversion film/layer (200-1) (200) (201) can be coated/deposited/patterned on top of a micro-LED display. The color conversion can be processed sequentially using conventional lithography processes. The color conversion layer can be made from quantum-dots, quantum-wells, phosphorus materials or any other material that can be used for photon up-conversion or filtering. The space between the color-conversion layers is covered with a black material that prevents crosstalk between neighbor pixels.

Figure 46:
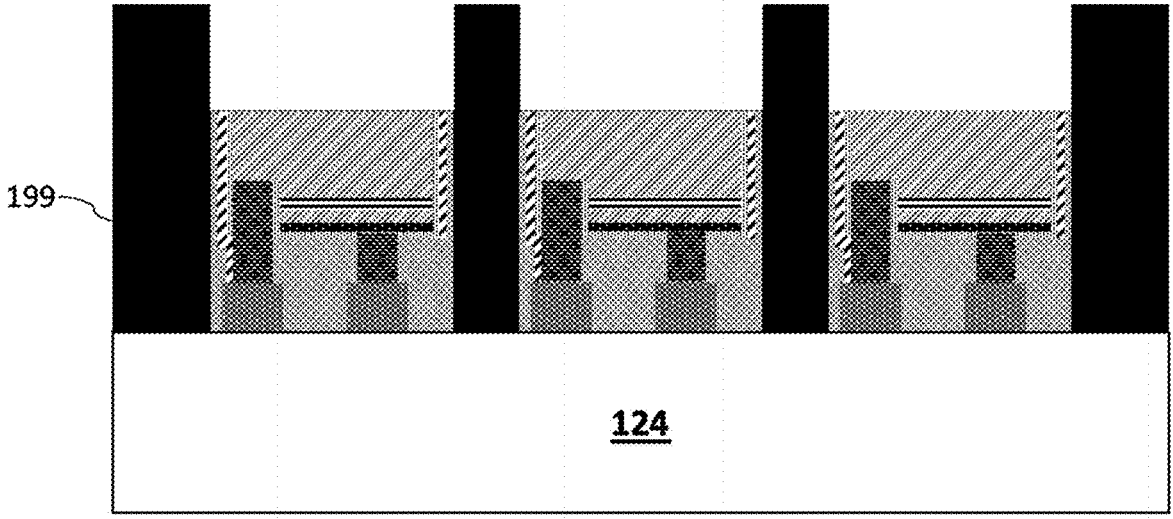
FIG. 46 depicts micro-LEDs when the space between them is filled with a black material.

FIG. 46 presents a mono-color micro-LED display when the space between micro-LEDs is filled with a black material.

Figure 47:
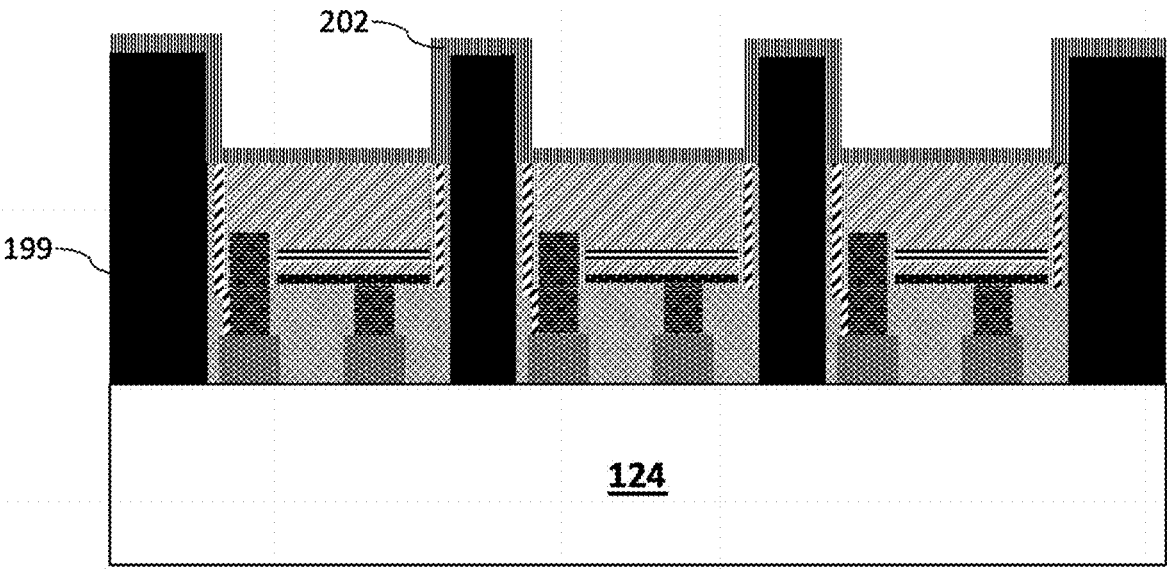
FIG. 47 depicts structure from FIG. 46 when a reflective layer (metal or dielectric) is coated on it.

As shown in FIG. 47, a reflective layer (or multilayer) (202) which can be made from dielectrics, reflective metals or combination of both is conformally coated the black material (199). The layer can be coated with any fabrication process.

Figure 48:
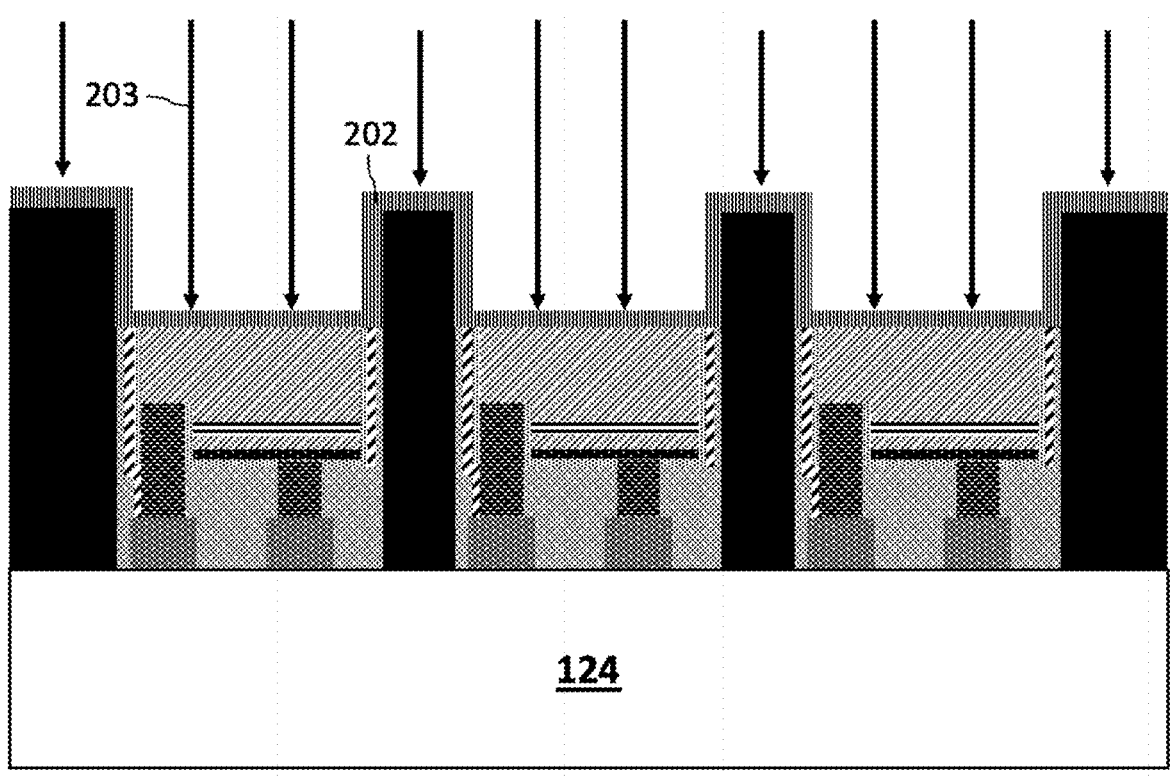
FIG. 48 depicts a directional etching process that can be performed by laser beam, high energy ions, or other chemical and mechanical processes.

As shown in the FIG. 48, a directional etching process (203) is used to etch the reflective layer from the top and bottom of the black material. The directional etching process can be done using a laser beams, high-energy ions or any other physical/chemical etching process.

Figure 49:
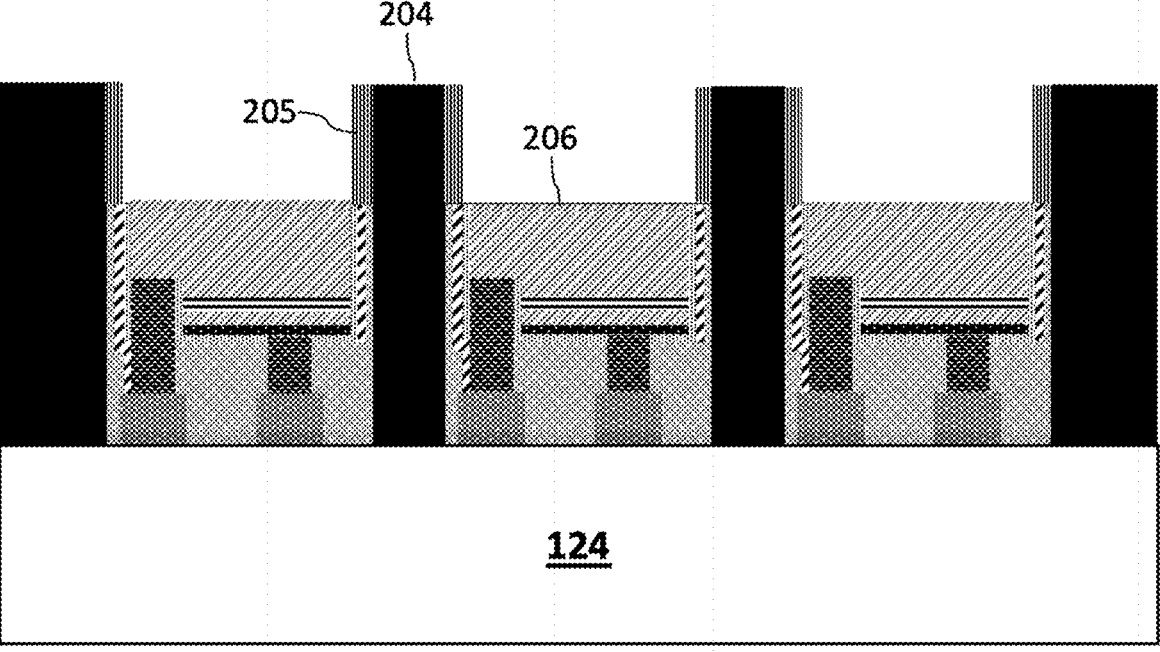
FIG. 49 depicts the micro-LED structure after etching the reflective layer from the topside of the pixels and black materials. The reflective layer still exists on the black material sidewalls.

The micro-LED display after the directional etching process of the reflective process is demonstrated in FIG. 49. The reflective material is only covering the internal sidewalls (205). The micro-LED backside (206) is exposed due to etching the reflective material from the bottom of the pixel area. The reflective layer from the top area (204) of the black material is also etched. After directional etching process a dielectric coating can be performed to passive the reflective later and prevent color conversion quenching process.

Figure 50:
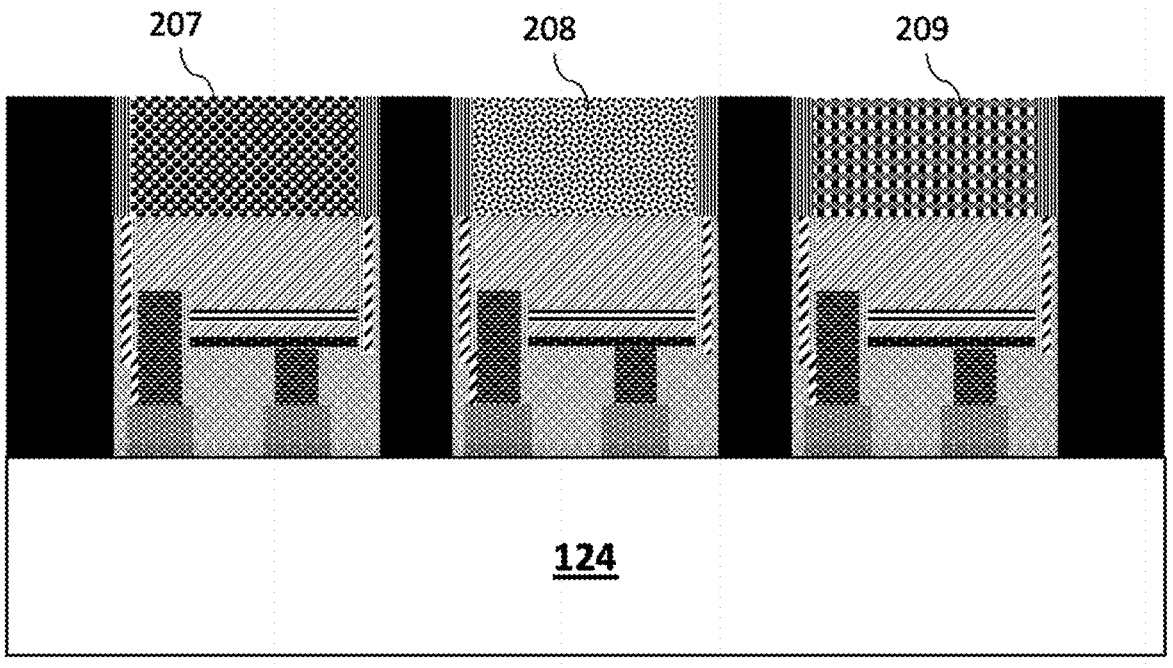
FIG. 50 depicts the micro-LED structure with black material and the reflective layer on the black material. The space (gap) between black material is filled with color conversion materials such as quantum dots.

FIG. 50 shows a micro-LED display that the sidewalls of the region filled color conversion materials (207) (208) (209) are coated with a reflective layer.

Figure 51:
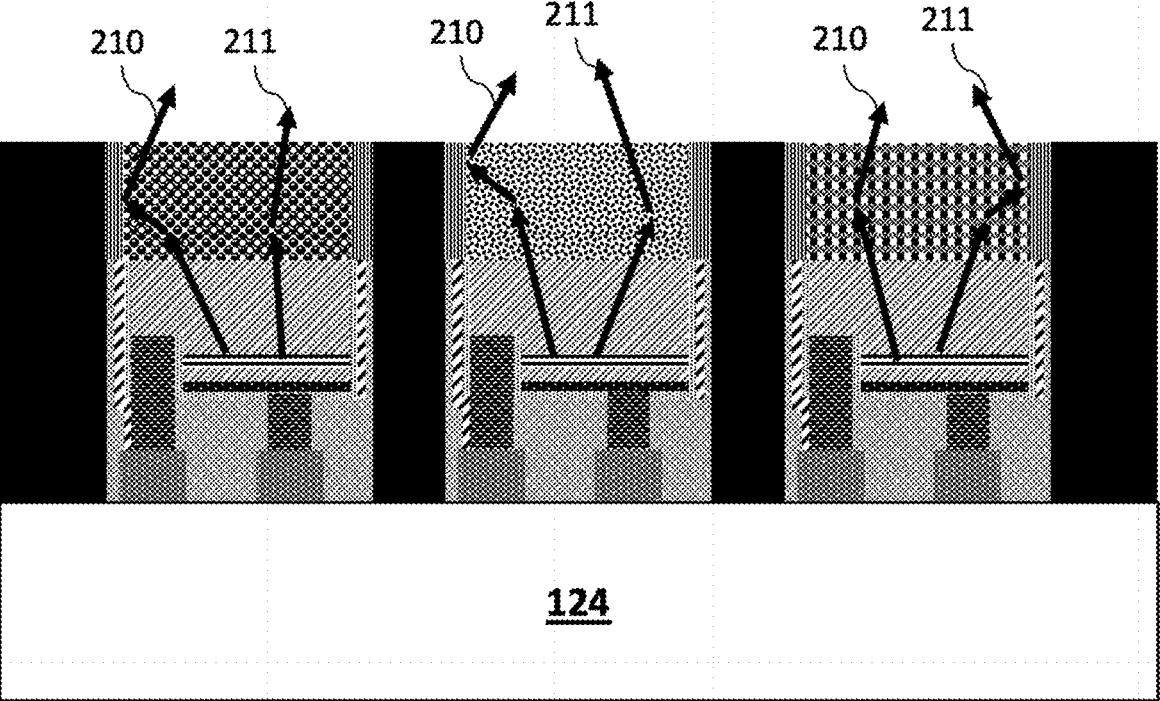
FIG. 51 depicts the optical paths of photons generated from the color conversion material.

The optical path (210) (211) of the emitted photons from the micro-LED display with reflective layer on black material is shown in FIG. 51. If a generated photon is emitted toward the black material sidewalls, the reflective material will reflect it (210) and it will add up to the upside emitted photons (211). The reflective sidewalls prevent any wasted photon absorption in the black material. This display can generate higher brightness with consuming less power due this photon recycling process and preventing photon absorption in the black material. Also, the neighbor pixel crosstalk is zero in this structure.

FIG. 52 depicts the process flow to fabricate an efficient color-conversion layer on a glass substrate. The glass substrate refractive index can be chosen 520 to enhance the light extraction efficiency. Also, in order to guide the photons and improve directionality of the display emission, other optical elements and lenses (such meta-surface lenses, couplers, beam homogenizers, axial collimators, and diffractive optic elements) can be made on or inside of the glass substrate. In addition, a reflective or anti-reflective layer can be coated on one side or both sides of the glass substrate.

Figure 53:
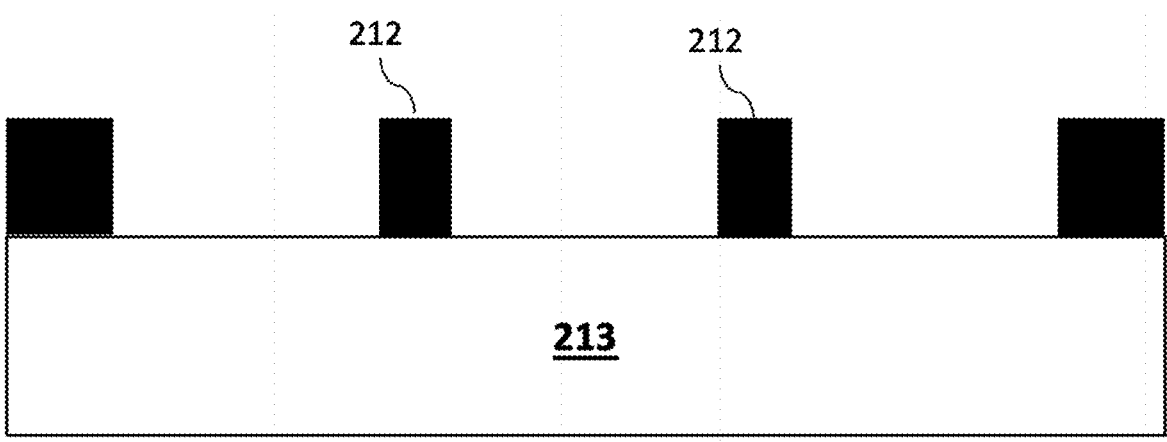
FIG. 53 depicts a glass (transparent) substrate and a patterned black material (matrices) on it.

As shown in FIG. 53, a black material (matrices) (212) will be coated and patterned 522 on a glass substrate (213) to define the place for color-conversion materials. Conventional lithography material can be used to create the black matrices. Also, the thickness of the black matrices can be defined in order to have the desired thickness of the color conversion layer in it.

Figure 54:
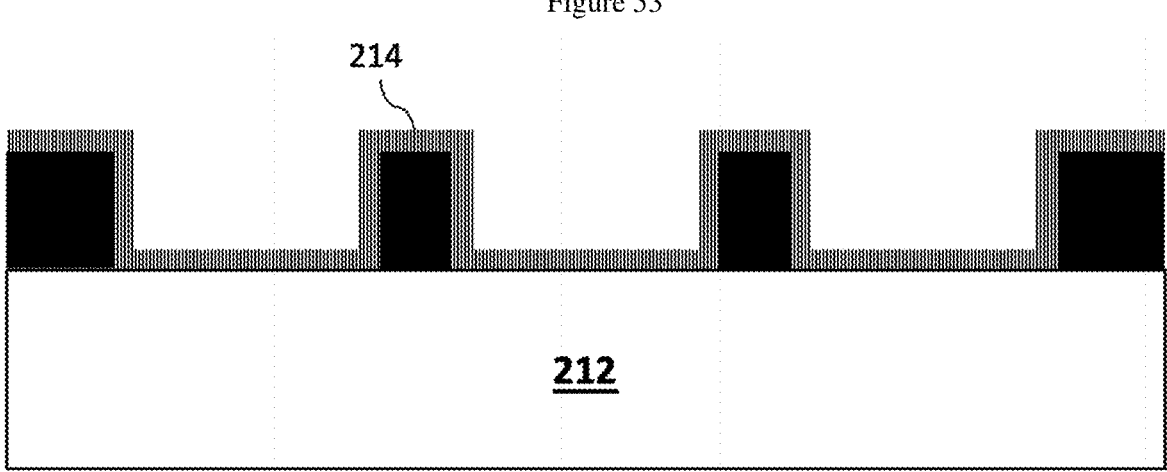
FIG. 54 depicts the glass substrate with black matrices on it when a reflective layer is coated on the whole structure.

As shown in FIG. 54, a reflective layer is coated 524 on the glass whole substrate. The reflective layer can be simply a stack of metallic films such as Ti/Al or any other materials. One layer is used for adhesion and another layer provides the optical reflection. The reflective layer can be a stack of dielectric layers. The reflective layer can be a combination of dielectric and metallic layers too. But it should be conformal to cover all sidewalls.

Figure 55:
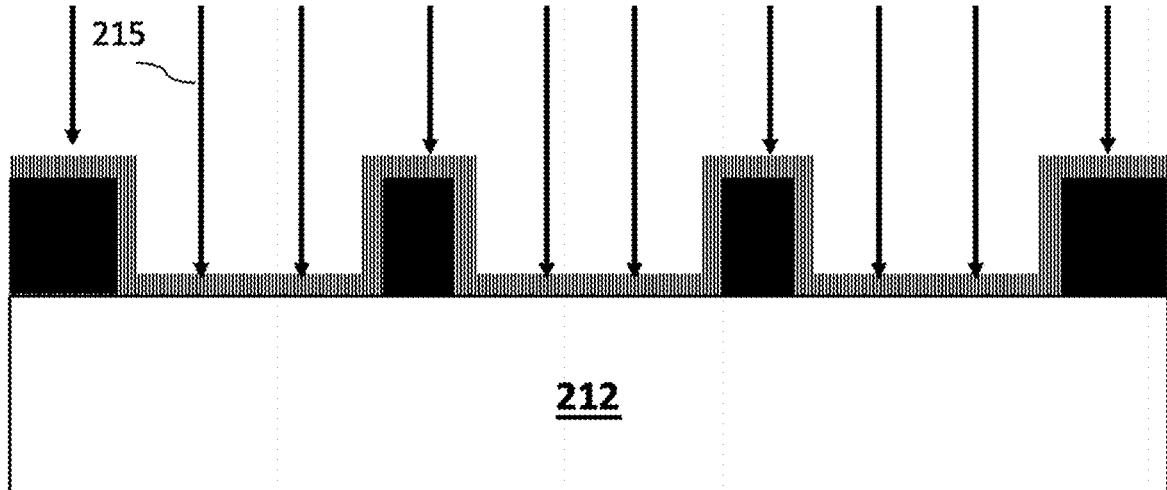
FIG. 55 depicts the directional etching process to remove the reflective layer selectively.

As shown in FIG. 55, a directional etching process (215) is used to etch 528 the reflective material from everywhere except the back material sidewalls. The directional etching process can be done using a laser beam irradiating the surface and will etch/burn the reflective layer but does not damage the black matrices. High energy ions in processes such as ion milling can be used to etch the reflective layer directionally. Since the etch rate of the reflective layer on the sidewalls is much less than the reflective layer on the top and bottom area, the reflective layer will remain only on the sidewalls after the directional etching process.

Figure 56:
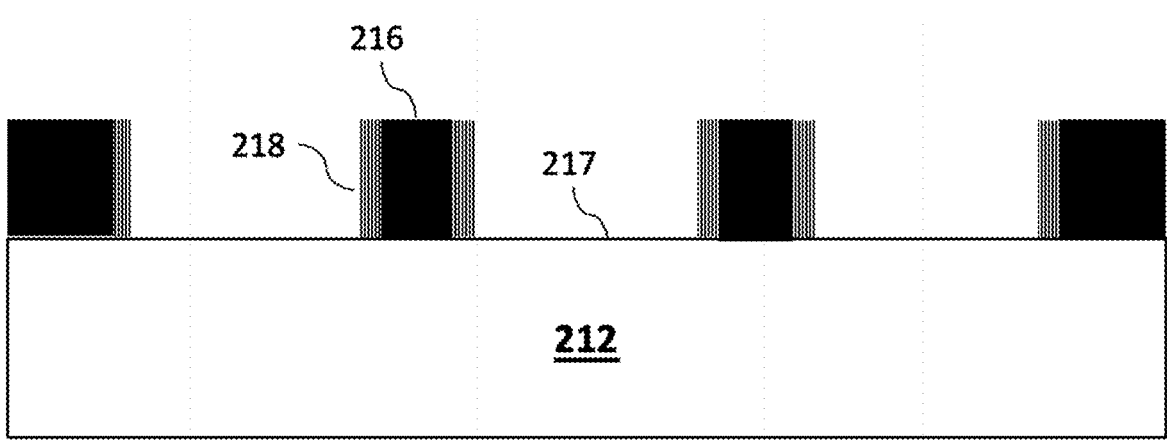
FIG. 56 depicts the glass substrate when the reflective layer is removed except from the black matrices' sidewalls.

The black material structure with reflected layer coated on its sidewalls (218) is presented in FIG. 56. All reflective materials on the top (216) of the black material and on top (217) of the glass substrate (212) is removed by the directional etching process. On the area that black matrices and reflective layer is removed from the glass substrate (212), glass substrate is transparent.

Figure 57:
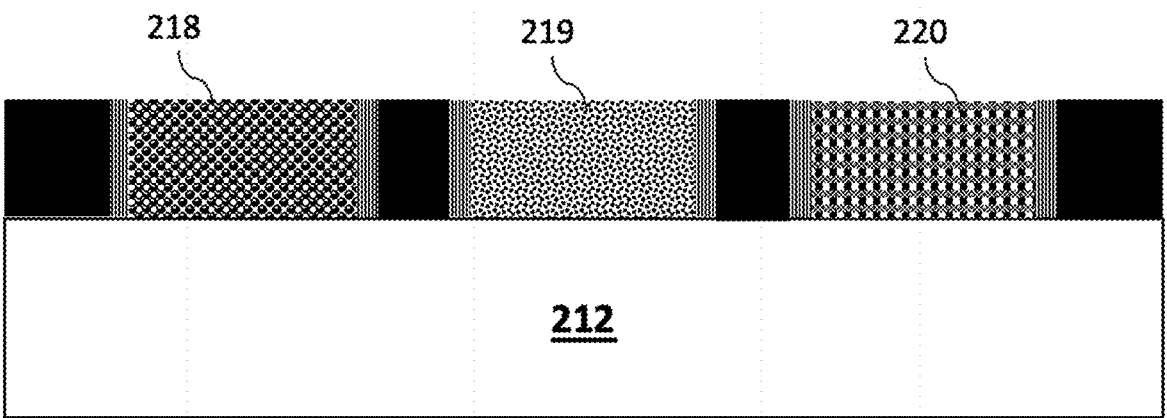
FIG. 57 depicts the glass substrate when gaps between the black matrices are filled with a color conversion material such as quantum dots.

FIG. 57 shows the glass substrate with black matrices after filling 530 the spaces with the color conversion layer. Since the black matrices thickness can be high and a thick layer of quantum dot might be required to achieve accepted color-conversion efficiency, conventional coating process may not be useful to coat the color-conversion materials. Other techniques such as blade coating can be used to get thicker color conversion layers which may also save more raw materials too. Conventional lithography processes can be used to pattern the color-conversion materials and achieve full-color (218) (219) (220) patterns.

Figure 58:
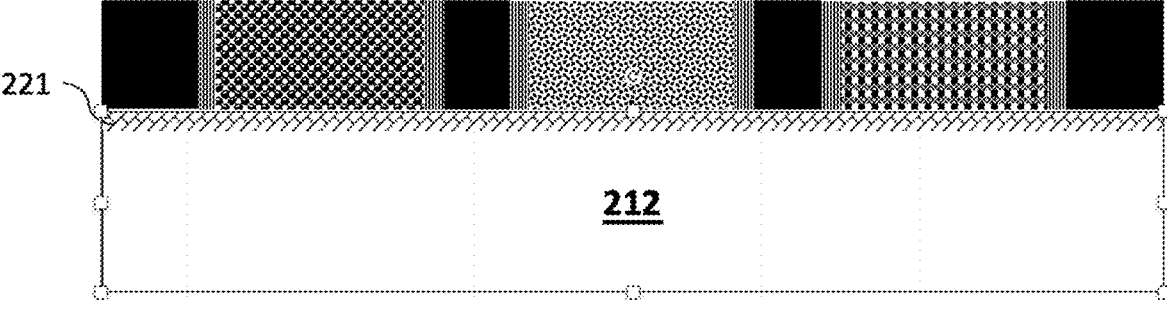
FIG. 58 depicts the same structure as shown in FIG. 57 with an additional optical layer on the glass substrate.

As shown in FIG. 58, an optical layer (221) can exist on the glass substrate (212). This optical layer can act to filter unwanted wavelengths to reflect the un-absorbed photons escaped from the color-conversion material. The optical layer (221) can be a multi-layer stack of dielectrics or polymeric materials.

Figure 59:
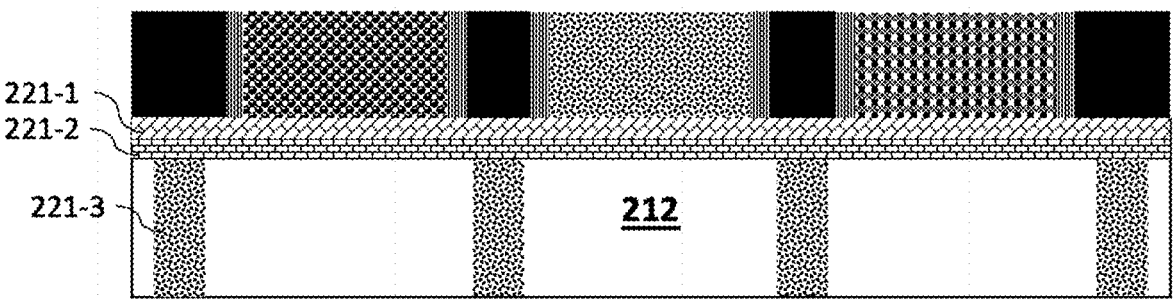
FIG. 59 depicts the same structure as shown in FIG. 58 with an additional active optical layer or waveguide structure on and in the glass substrate.

In the structure shown in the FIG. 59, the optical layer can be made from several layers with multiple functions. (221-1) can filter or reflect specific wavelength or a band spectrum. (221-2) can be an active optical material, such as liquid crystals, to guide the photons or focus the light. (221-3) can be an implanted region, a region with different optical material or through glass vias for electrical tuning the layer (221-2).

Figure 60:
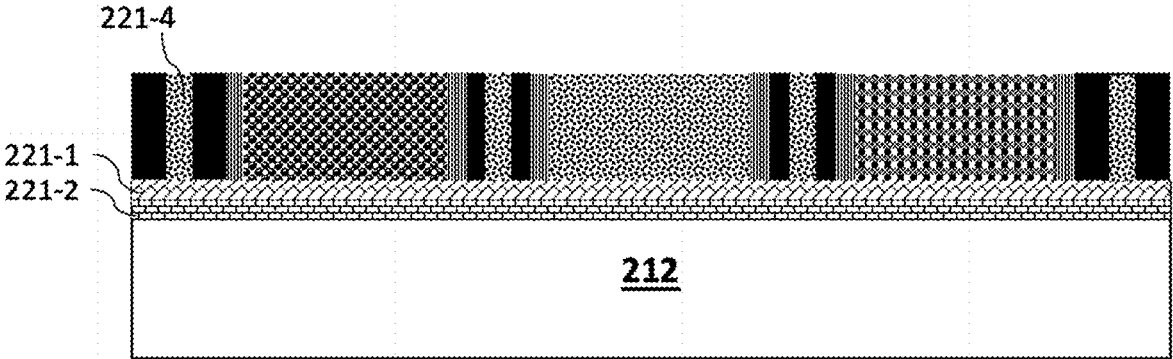
FIG. 60 depicts the same structure as shown in FIG. 58 with a through polymer via for electrical tuning the active optical layer.

In FIG. 60, a through polymer via (221-4) can be used to connect the optical layer (221-2) or (221-1) to a driving circuit or external voltage. Layer (221-1) can be a transparent electrical contact layer that provide a common voltage (or ground) over the surface of the display. The through polymer via (221-4) also can be used to connect the electrical layer (221-1) layer to a driving circuit.

Figure 61:
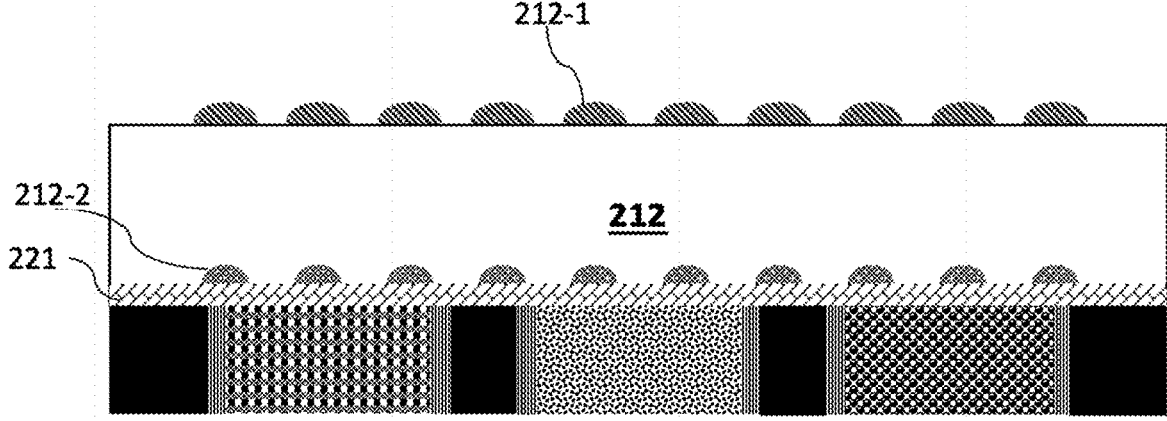
FIG. 61 depicts a glass substrate with optical element on both sides. The color conversion function is like FIG. 57.

FIG. 61 shows the glass substrate (212) with optical elements (212-1) (212-2) fabricated on both sides or only one side of it. The optical elements (212-1) (212-2) can be meta-surface lenses, couplers, beam homogenizers, axial collimators, and diffractive optic elements. These elements are fabricated in order to control and define the optical properties of the micro-LED display.

Figure 62:
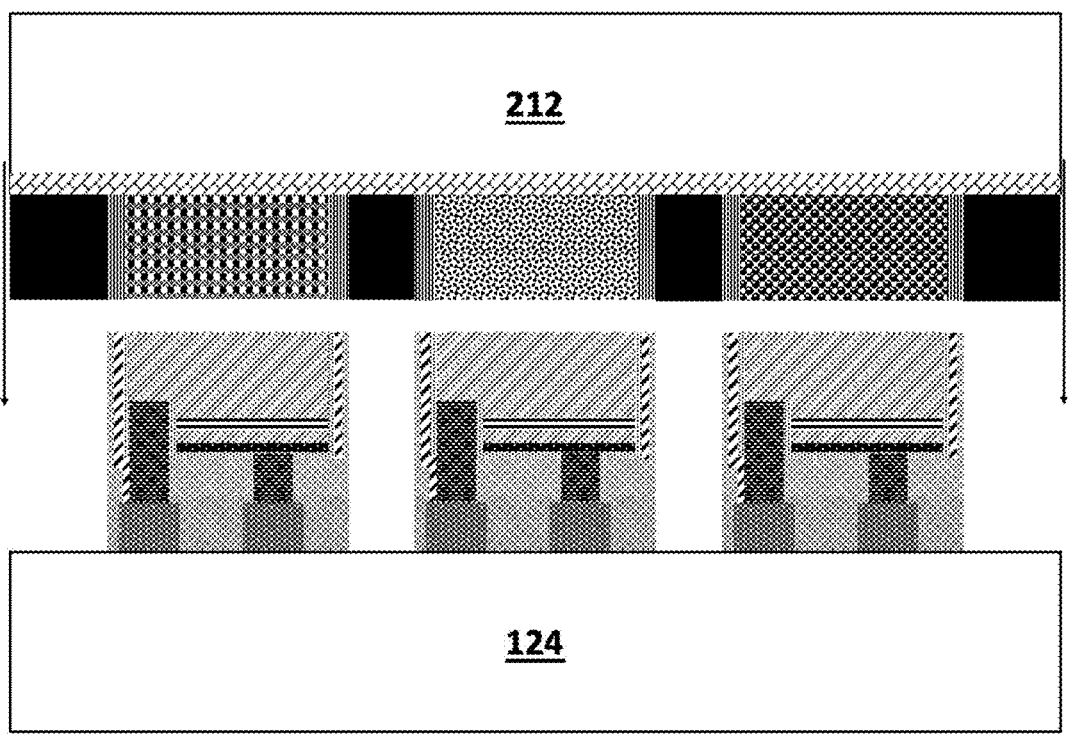
FIG. 62 depicts the alignment process between the color conversion structure on a glass/transparent substrate with the micro-LED structure/substrate.

FIG. 62 shows the alignment process between the color-conversion substrate (212) and the micro-LED display substrate (124). Each color-conversion pixel should be mounted on a specific micro-LED pixel to realize a full-color display.

Figure 63:
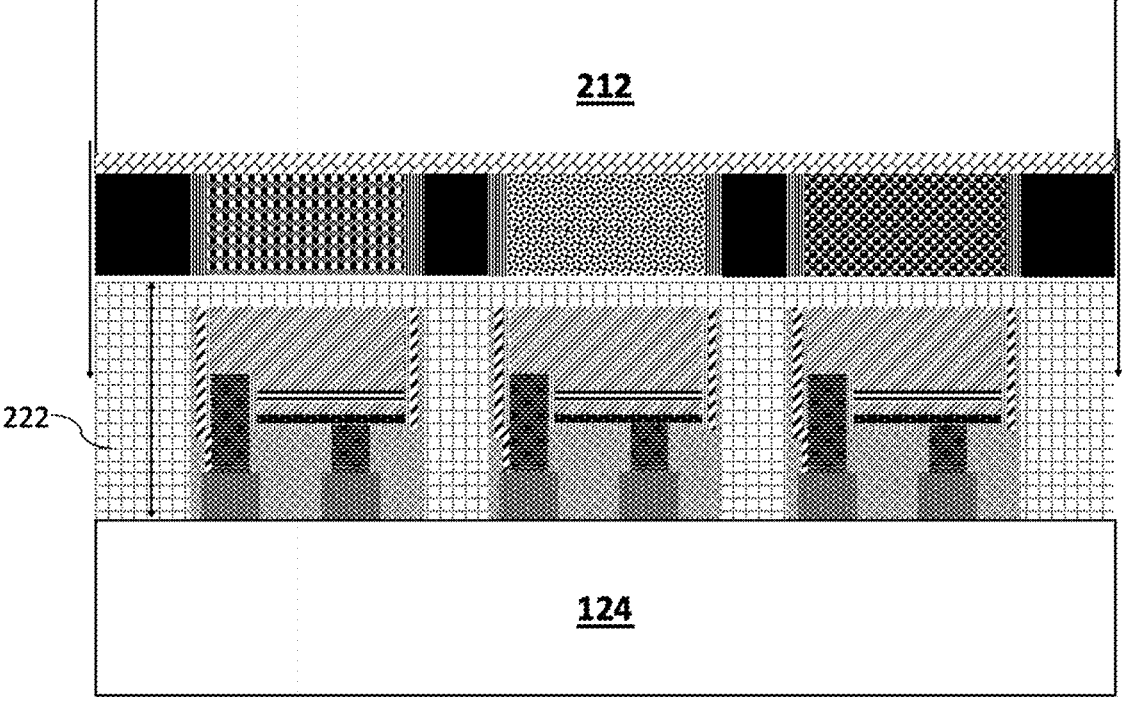
FIG. 63 depicts the alignment process between the color conversion structure on a glass/transparent substrate with the micro-LED structure/substrate when a bonding polymer/adhesive with thickness is coated on micro-LED substrate.

FIG. 63 shows the color-conversion structure on a glass substrate (212) and micro-LED substrate before bonding. The micro-LED substrate is coated with an optical epoxy (222) to provide the required adhesion between micro-LED structures and color-conversion structures. The optical epoxy (222) can be UV or thermal curable and has optical properties that only pass a specific optical band diagram. The thickness of the optical epoxy (222) can be variable depends on the coating parameters. The optimized thickness can provide a conformal coating, and zero void between bonded surfaces.

Figure 64:
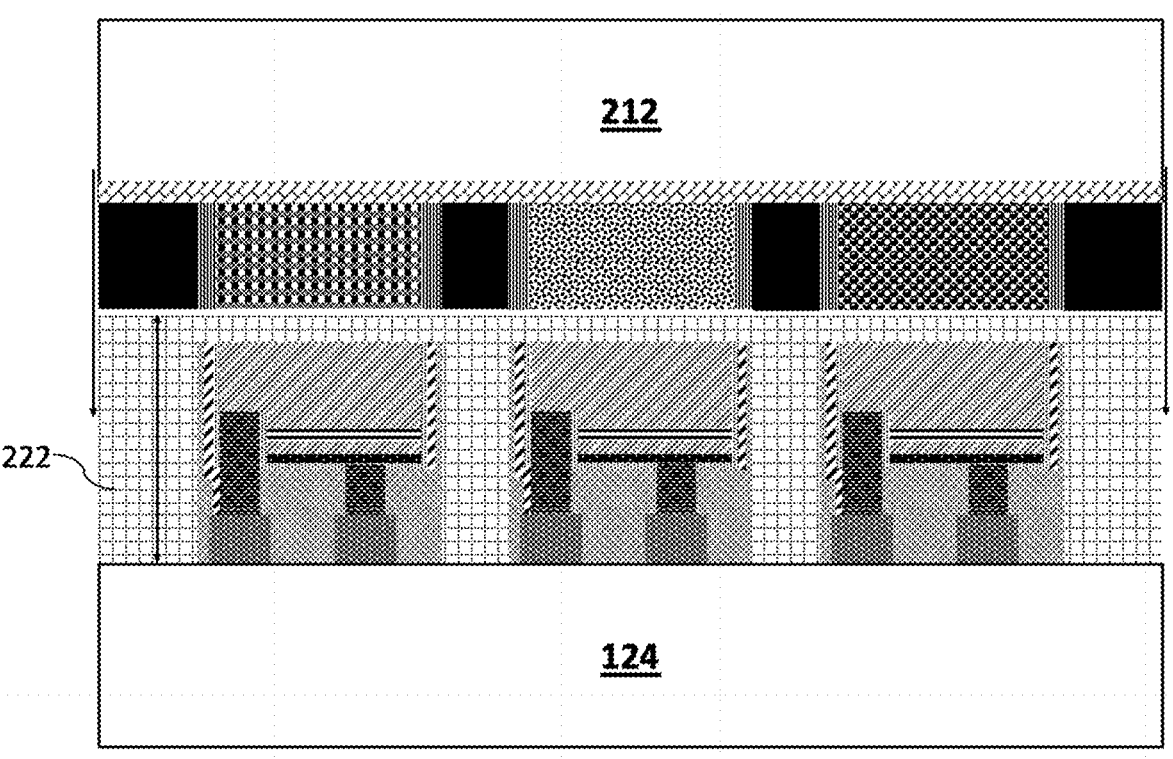
FIG. 64 depicts the integration of the glass substrate (with color conversion materials) and micro-LED structure when a layer of polymer with height may exist between them.

FIG. 64 shows the bonded color-conversion structure on the micro-LED substrate. The space between two structures depends on the initial optical epoxy (222) thickness and applied force during the bonding process.

Figure 65:
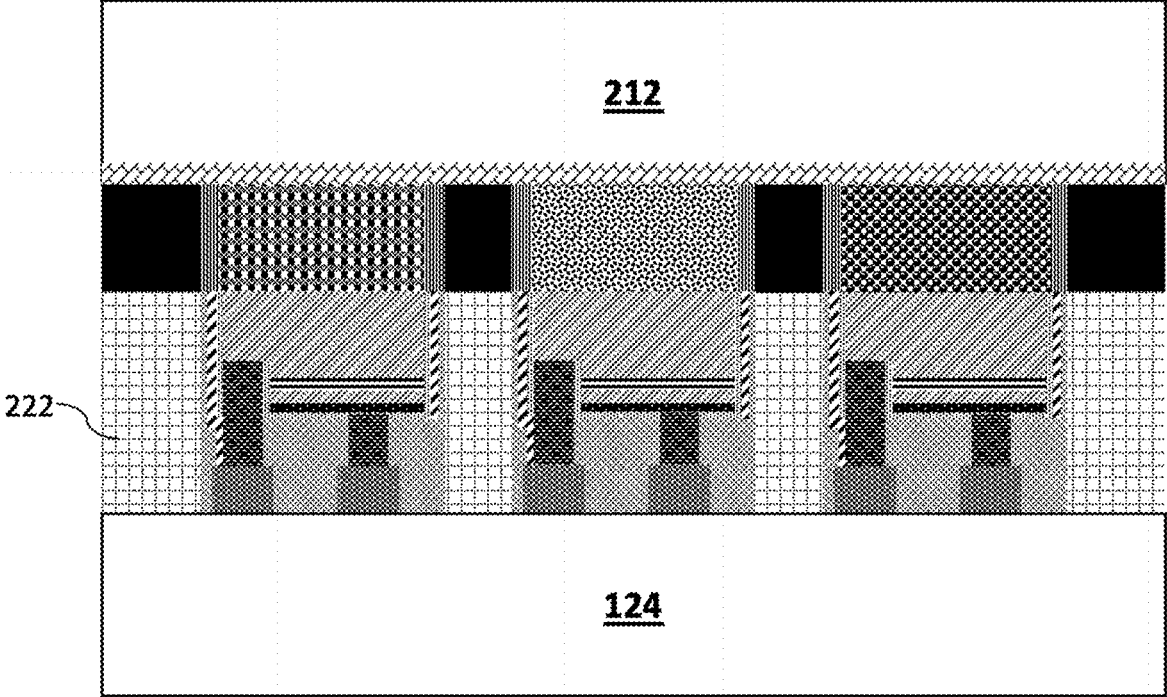
FIG. 65 depicts the integrated structure of the glass substrate (with color conversion materials) and micro-LED structure.

As shown in the FIG. 65, the bonding process can be designed to have zero gap between the color-conversion layer and micro-LEDs. In this case the mechanical strength can be guaranteed by attaching the micro-LED substrate and the color-conversion substrate using the optical epoxy (222).

Figure 66:
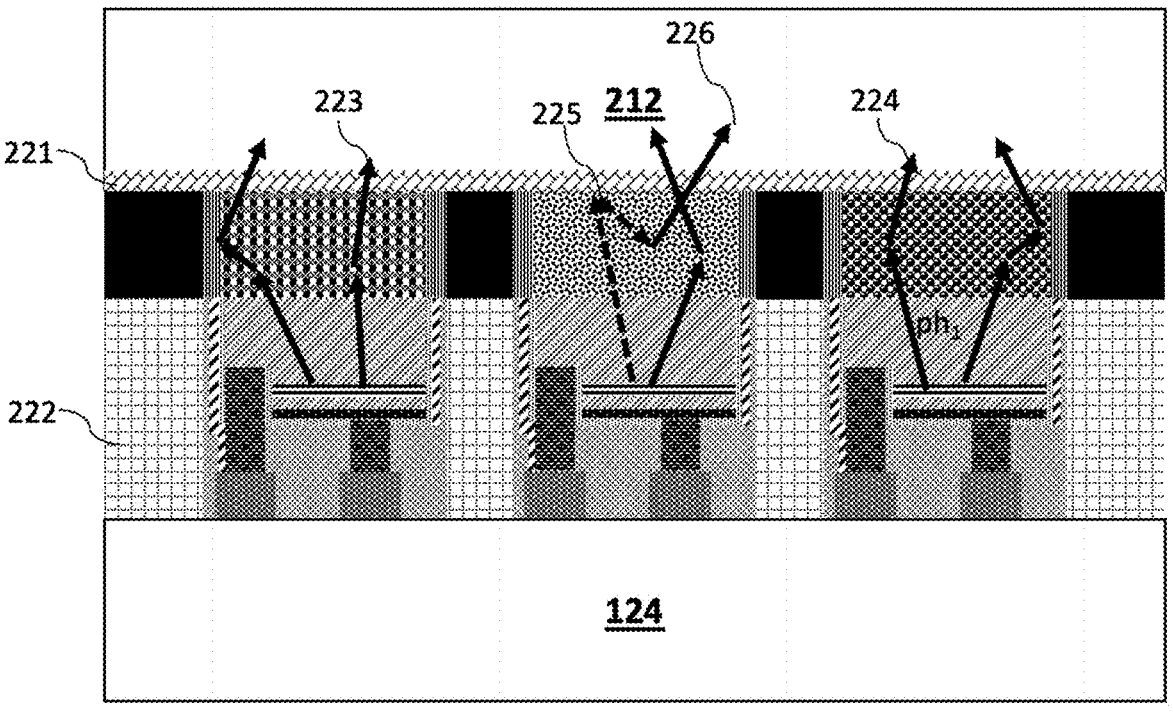
FIG. 66 depicts the optical path of the generated photons from the micro-LEDs and color conversion materials. The reflected photon due to the optical layer on the glass in also shown.

FIG. 66 shows optical path of the emitted photons from the color-conversion structures and micro-LEDs. The photons (ph1) can be generated originally from the active region inside the micro-LEDs. The photons will be absorbed in the color-conversion layer and the photons with new wavelength will be generated and emitted (224) (223) (226) from the color-conversion layer. Photons generated from the color-conversion layer depends on the electrical and optical bandgap of the color-conversion materials. If any photon (225) is not absorbed by the color-conversion layer, it can be reflected backward (recycled) by the optical layer (221). The reflected photon can be absorbed again and generate a converted photon (226). The optical layer (221) can be designed to pass a desired optical spectrum and filter any unwanted emission wavelength.

Figure 67:
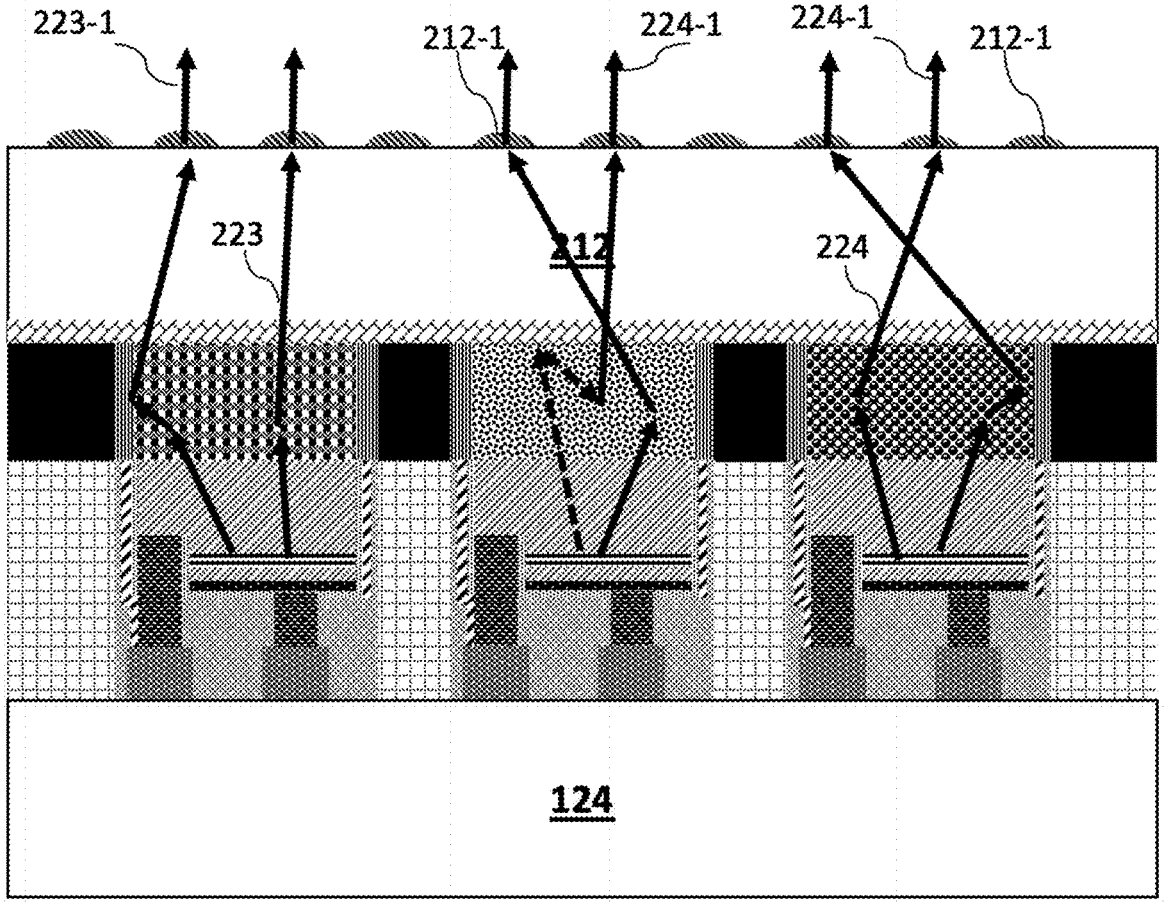
FIG. 67 depicts an optical function incorporated into the glass substrate that can cohere or homogenize the extracted light.

FIG. 67 shows a micro-LED display with a color-conversion structure. The optical elements (212-1) fabricated on the glass substrate can tune the optical path of the extracted photons (223-1) (224-1) (226-1). For example, the optical elements in FIG. 67 can collimate the photons and provide a directional emission display.

Figure 68:
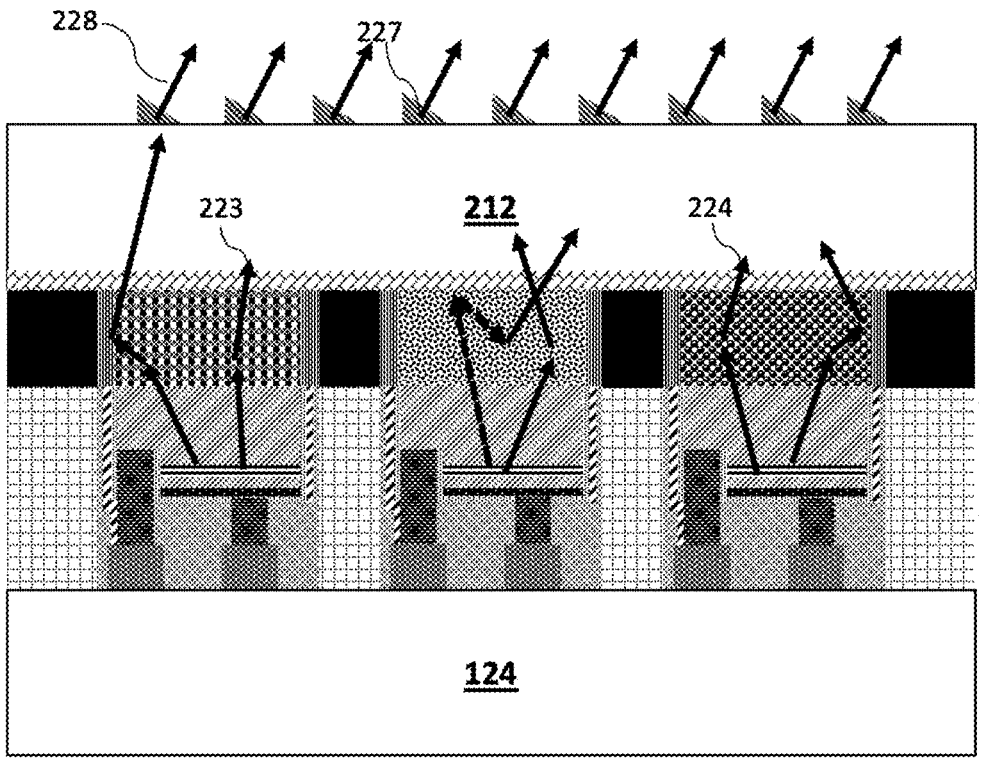
FIG. 68 depicts an optical function element incorporated (fabricated or made) into/on the glass substrate to tune the light optical path.

FIG. 68 is a micro-LED display with another type of optical elements (227) that can emit the photons directionally toward left or right. This optical element can be used to enhance the optical insertion of the extracted photons from a micro-LED display onto a pupil. In addition, the display can be integrated in an AR/VR system with more freedom. The developed optical elements on the glass substrate can be used on both vertical and flip-chipped micro-LED structures. The optical element can be made on the other side of the glass substrate.

Figure 69:
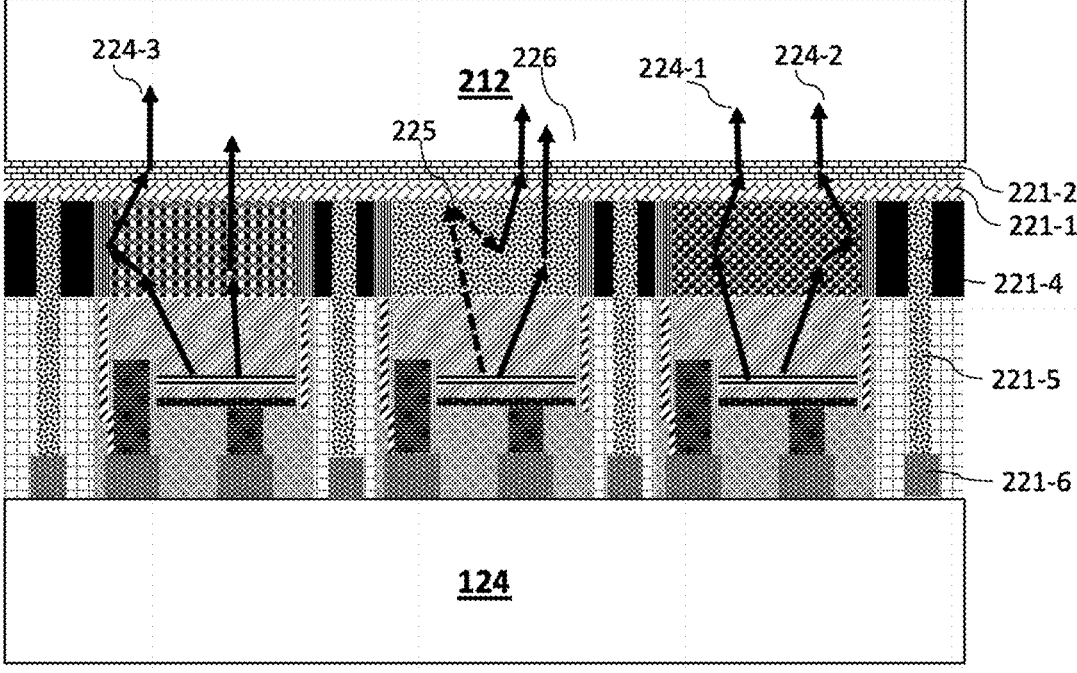
FIG. 69 depicts a micro-LED display where optical layer is connected to the driving circuit/backplane and can be electrically driven/tuned.

FIG. 69 shows a micro-LED display when the color-conversion structures with active optical layers/elements (221-1) (221-2) are bonded onto a backplane/driving circuit with electrical contacts (221-6). The (221-1) active optical layer is first connected to a through polymer via (221-4). During the color-conversion substrate (212) assembly onto the micro-LED substrate (124), the via (221-4) can be connected to via (221-5) which is connected to (221-6). As a result, the layer (221-1) can be electrically driven, tuned to provide the optical requirement for various applications. The new functionality can be tuning the brightness locally, tuning the directionality and controlling the extracted photon polarization.

Figure 70:
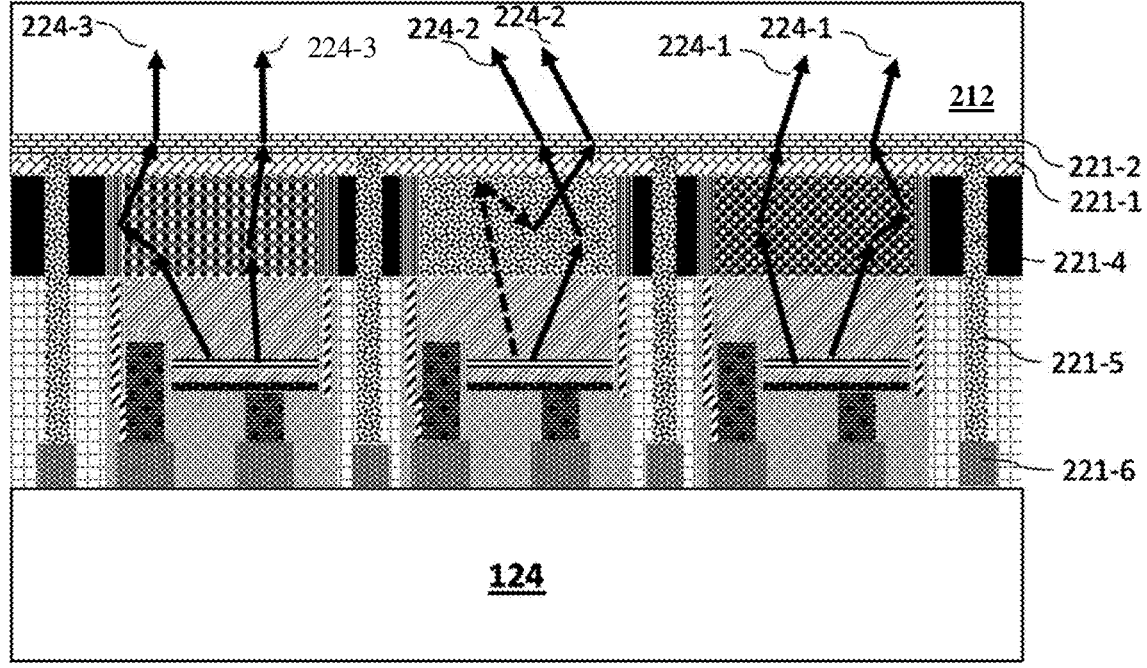
FIG. 70 depicts a micro-LED display where optical layer is tuned/driven electrically to modify the light paths.

An example of tuning the directionality of display emission using the active optical drive is shown in FIG. 70. Active optical film/layer/structure (221-1) or (221-2) can be driven locally using the nearest electrical junction (221-6). As a result, (224-1) photons can be guided to the right side, (224-2) photons can be guided to the left side and (224-3) can be guided to have a coherent beam. All the active optical film (221-1) and (221-2) can be tuned electrically at the same time and tune the optical performance of the system in one-step.

Figure 71:
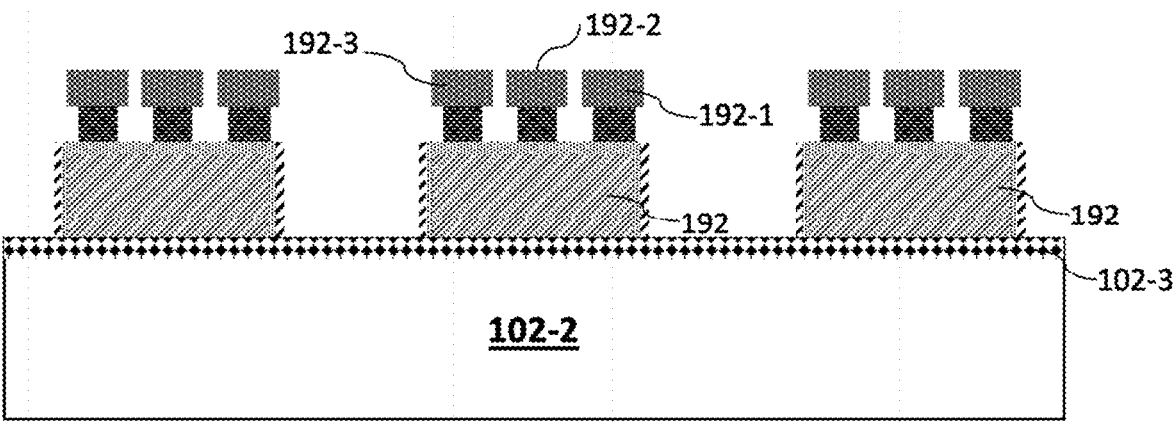
FIG. 71 depicts the driving circuits/logics fabricated (or transferred) on a laser transparent substrate.

As shown in FIG. 71, the same selective laser processing (printing) can be used to transfer selectively driving circuits (192) from a laser transparent substrate (102-2). The driving circuits (192) are fabricated on a laser transparent substrate (102-2) such as sapphire or they are transferred onto a laser transparent substrate from another process substrate such as silicon. In this case, an adhesive layer (102-3) (or a dielectric layer) can bond driving circuits onto the laser transparent or microdevice substrate (102-2). Driving circuits can be made from GaN, Silicon, or any other materials and the fabrication process is not limited to conventional micro-fabrication technology. The circuits can be used as logic, driving circuits to drive micro-LED, or row and line driver. The electrodes (192-1) (192-2) (192-3) can be source, drain, gate with any possible arraignment or they can be the any other electrode types fabricated during the BEOL processing connecting the driving circuits to the real world.

Figure 72:
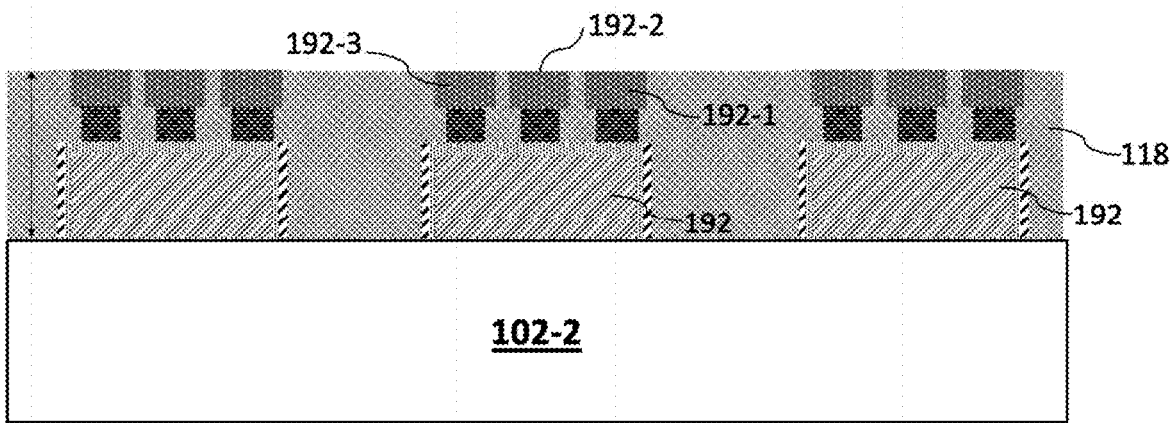
FIG. 72 depicts the circuits on a transparent substrate after coating with a photosensitive polymer with a thickness that can be variable.

FIG. 72 shows the driving circuits/logics (192) on a laser transparent substrate (102-2). A photo-sensitive polymer/epoxy/resin (118) is coated on the substrate with a thickness which can be variable depending on the application and condition on the receiver substrate. The thickness can be tuned by coating parameters or post-coating chemical/physical processes. The resist can be coated by spin-coating, spray, blade-coating, or any other techniques.

Figure 73:
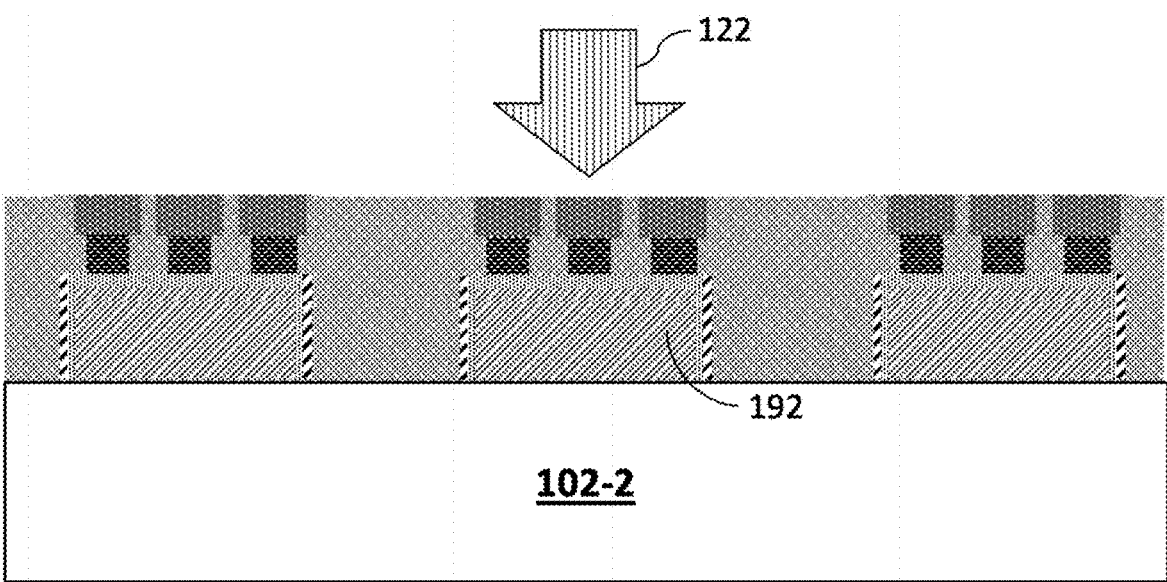
FIG. 73 depicts the photolithography patterning of the photosensitive polymer where a laser/optical beam is used for patterning the photo-sensitive polymer, and can be the same process as shown in FIG. 18.

The photo-sensitive polymer can be patterned using a lithography process. As shown in the FIG. 73, an optical/laser beam (122) can be used to expose the desired pattern into the resin depending on the positive/negative tone of the resist.

Figure 74:
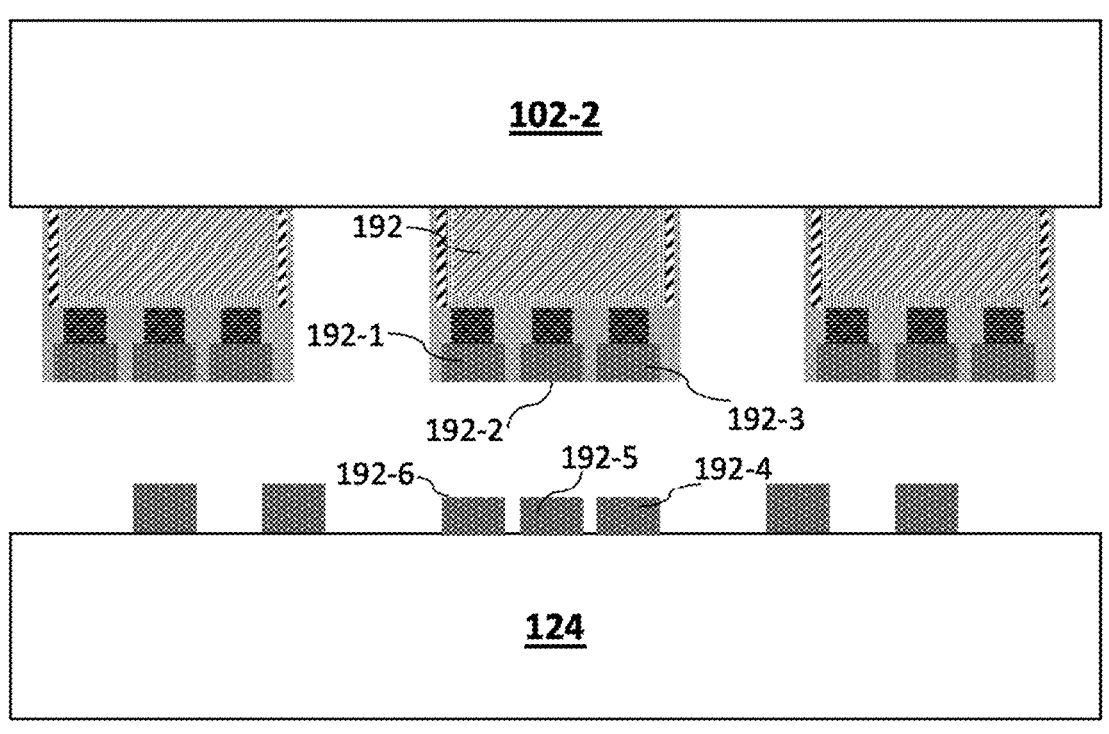
FIG. 74 depicts the alignment process of the flipped circuits/logics on a microdevice (growth/process) substrate and electrodes on a receiver/backplane substrate.

FIG. 74 shows the alignment process to bond the driving/logic circuits onto a receiver substrate (124). The circuit pads are defined as (192-1), (192-2), (192-3) should be aligned with the receiver substrate pads (192-4) (192-5) (192-6). As mentioned earlier, the circuit can be a driving circuit, a logic circuit, or can perform any other functionality. The alignment process is not limited but it can be performed through the transparent substrate or using any other alignment techniques.

Figure 75:
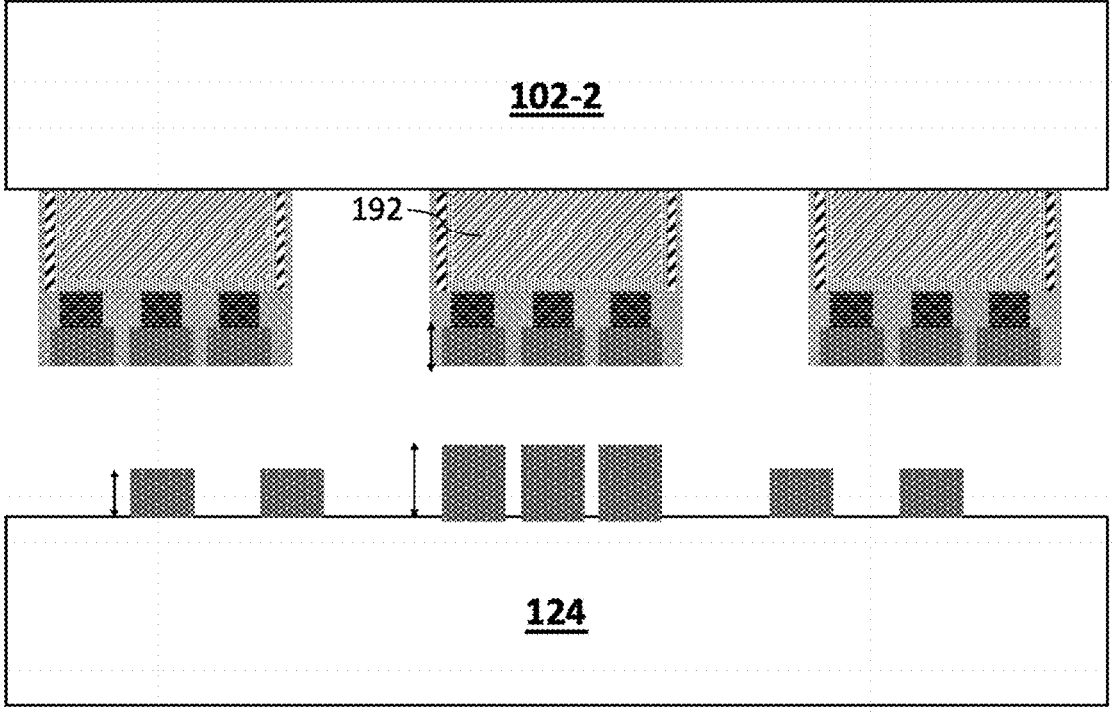
FIG. 75 depicts driving circuit and logics on a growth (process) substrate before bonding. The size and height of the circuits' electrodes or receiver electrodes be engineered to prevent interference.

As shown in FIG. 75, the height of the circuit pads and receiver pads can be designed to have no interference between the neighbor devices/pads during the transfer process.

Figure 76:
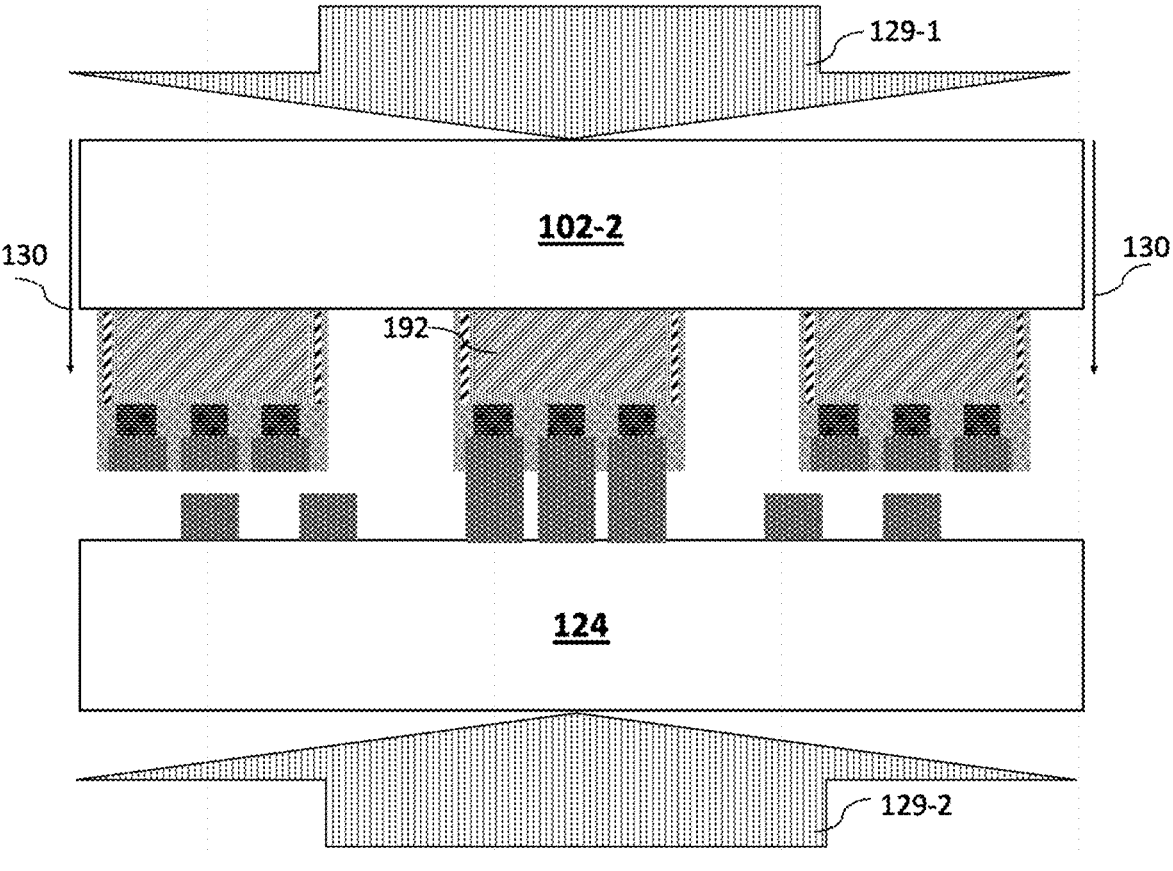
FIG. 76 depicts the driving circuits/logics bonded onto the pads on a backplane/receiver substrate.

FIG. 76 shows the substrate (102-2) with the circuits/logics bonded onto the receiver substrate (124). The pads can be completely in contact to each other. By applying force (130), the device pads can penetrate through the polymer/epoxy/resin (118) and can reach the receive pads. A heat source at the receiver substrate (129-2) side device substrate (129-1) can provide the temperature to cure the epoxy/polymer/resin or to make it softer. The heater is not limited but can be a laser beam, optical beam, conductive heater, or any other technology.

Figure 77:
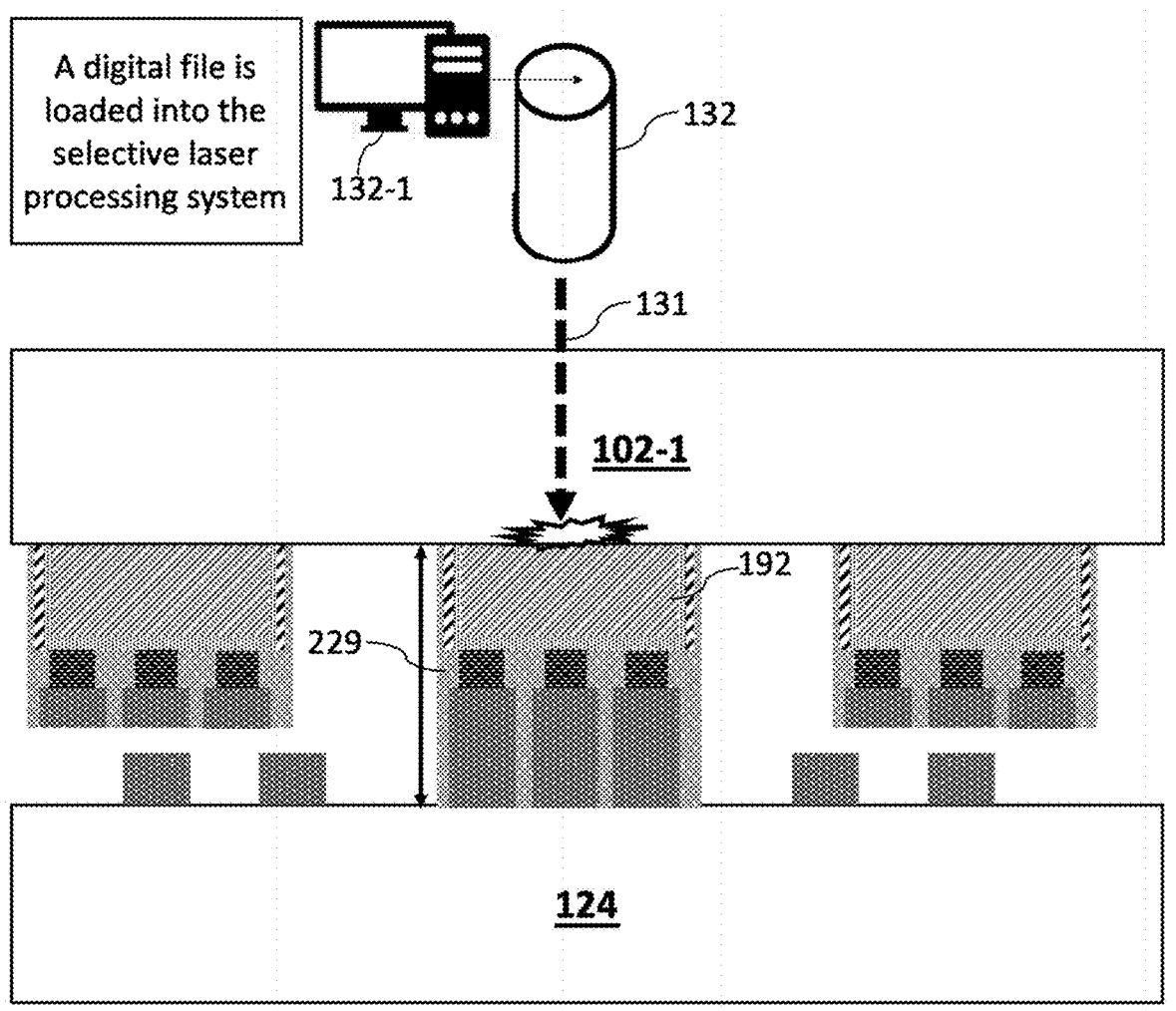
FIG. 77 depicts a laser-liftoff process when an optical/laser beam can be used to selectively release the driving circuit.

FIG. 77 shows a selective laser processing where a laser beam (131-2) can pass through the laser transparent substrate and is absorbed at the interface of the microdevice (circuit) (192) and the substrate. The epoxy/polymer/resin (229) can feel the space between the receiver substrate (124) and microdevice (circuit). The thickness of the epoxy can be engineered to provide a support during the laser-liftoff process. The laser beam is not limited but can be generated and guided using any of the systems and configurations described earlier for selective laser processing of micro-LEDs. A digital file is loaded into the selective laser processing system computation unit (132-1) that controls the selective processing system. It contains the map of the desired transfer pattern, earlier transferred devices, electrode maps, and any other information that can help the consequence of the selective laser processing.

Figure 78:
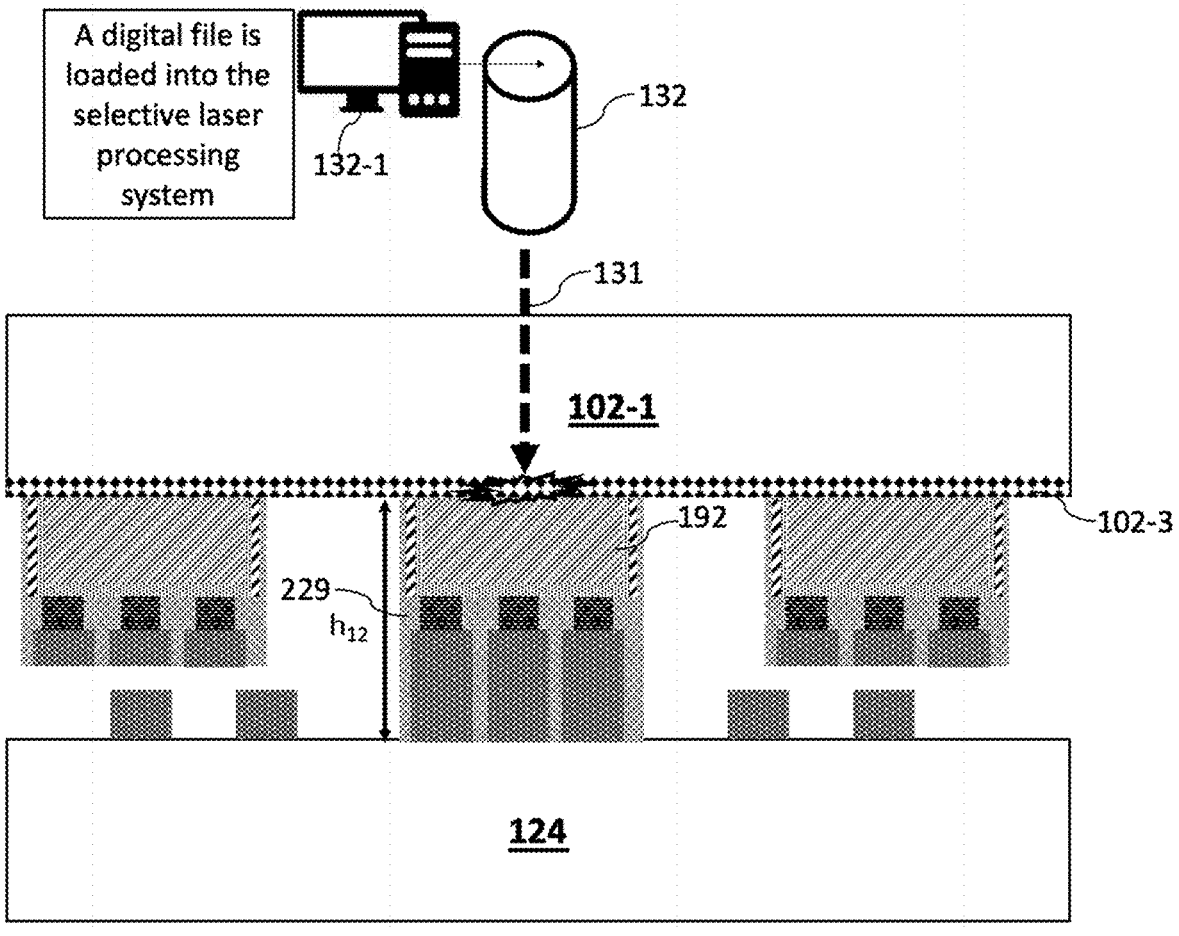
FIG. 78 depicts a laser-liftoff process when driving circuits/logics are bonded onto a transparent substrate using an organic/inorganic adhesive.

As shown in FIG. 78, a sacrificial layer (or temporary bonding layer) (102-3) can keep the microdevice (circuit/logic) onto the microdevice substrate. Layer (102-3) can be ablated by a laser beam and release the microdevice (192). The sacrificial layer (or temporary bonding layer) can be part of the epitaxial layers grown originally on the microdevice substrate or it can be mounted on the microdevice substrate as a temporary bonding.

Figure 79:
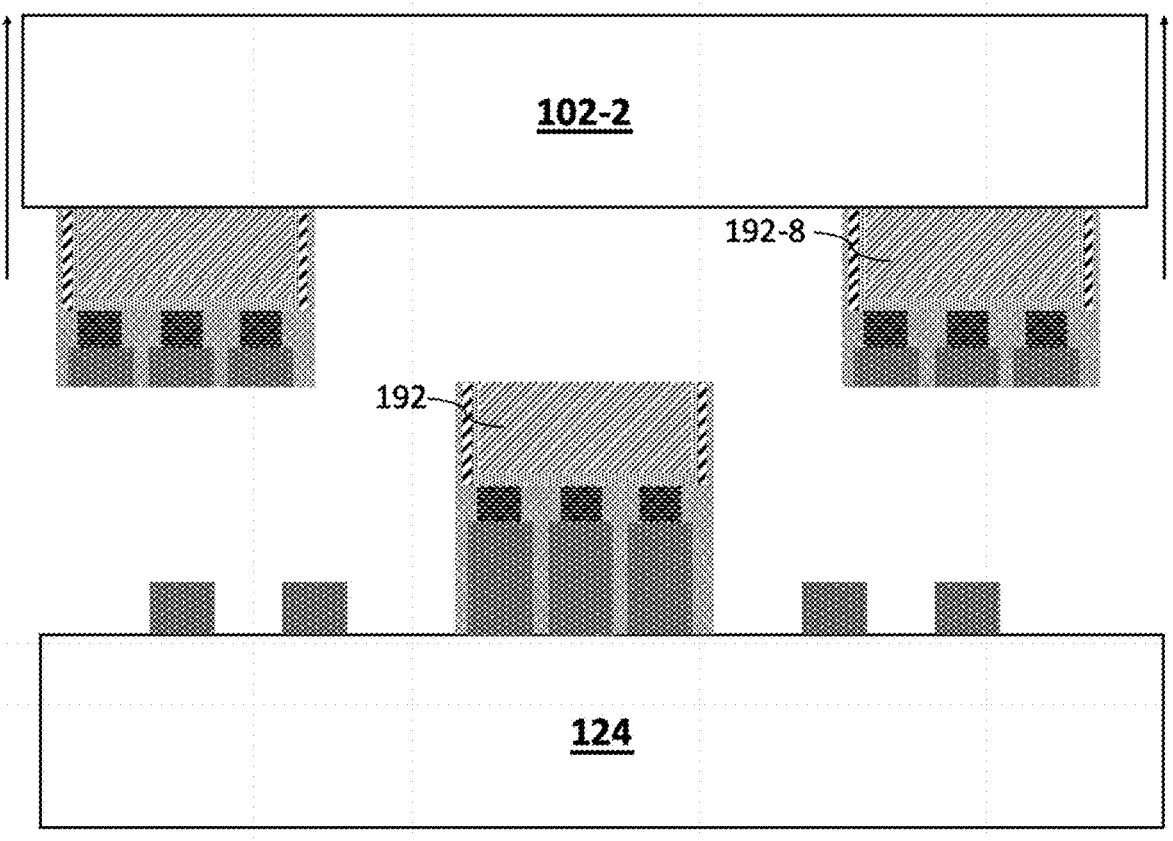
FIG. 79 depicts the driving circuit transferred onto the backplane/receiver substrate when the donor substrate is moving upward for the next transfer process.

As shown in FIG. 79, the microdevice substrate (102-2) can be released and move up when the laser processing is finished. A port of the microdevices (circuits/logics) (192) can be transferred onto the receive substrate and the remained devices (192-8) can be used for the next transfer/print process.

Figure 80:
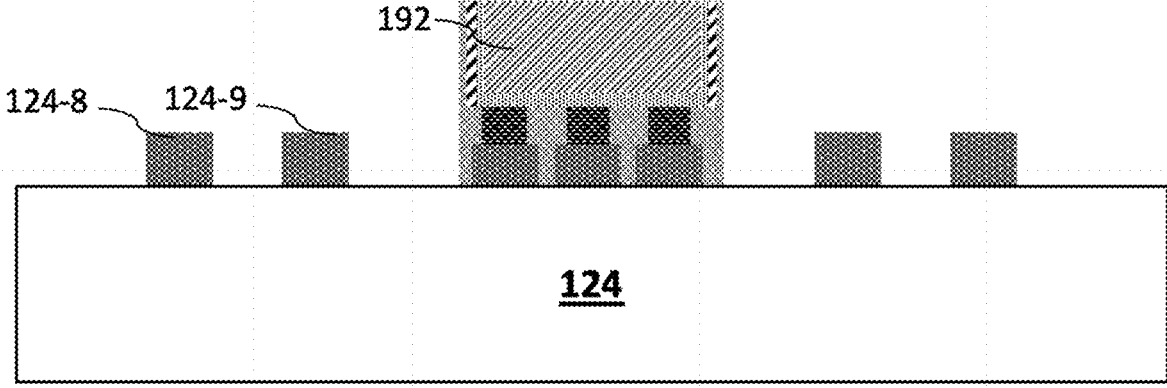
FIG. 80 depicts a receiver substrate/backplane when a logic/driving circuit is bonded onto it and other pads are ready for the next transfer processes.

The selectively printed/transferred microdevice (or circuit/logic) (192) on a receiver substrate is shown in FIG. 80. The other pads (124-8) (124-9) can be used for the next transfer process of other circuits, micro-LEDs, or any other passive and active devices.

Figure 81:
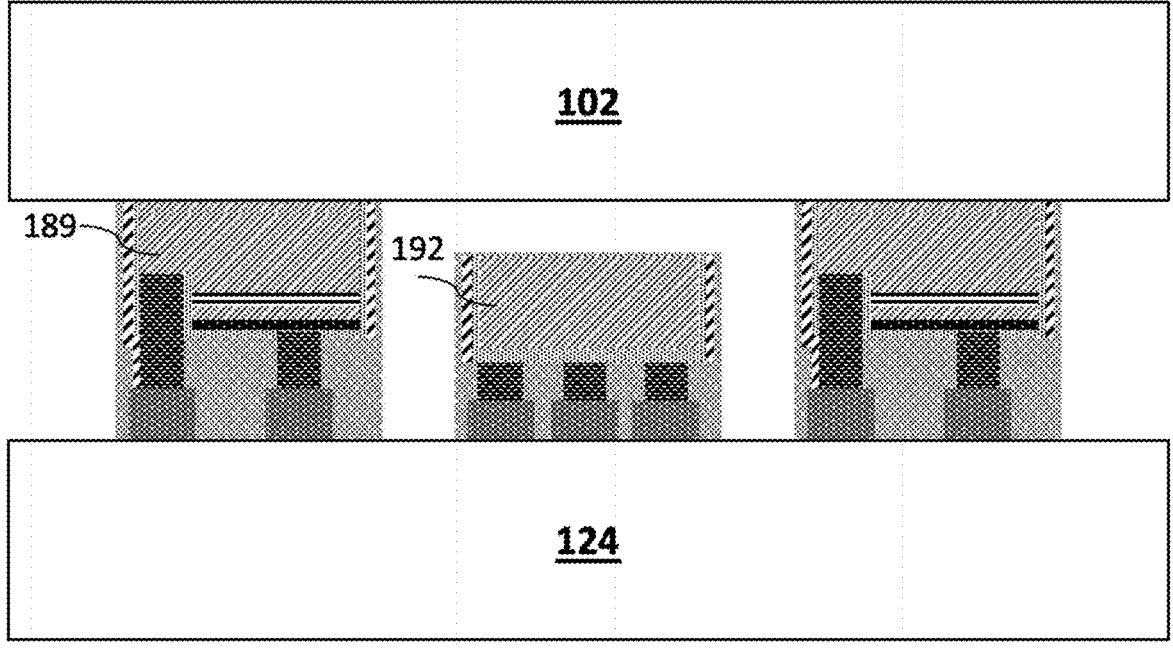
FIG. 81 depicts a receiver (backplane) substrate with a circuit on it when another substrate with micro-LED (laser diode) is bonded onto it.

As shown in FIG. 81, the next step transfer step can bond (integrate) or print micro-LEDs (189) to the receiver substrate (124). The area above the printed microdevice (circuit/logic) (192) should be empty in order to prevent any interference. If there is any device, layer or function on area the area above the printed microdevice (circuit/logic) (192), its thickness should be thin enough to not touch the already printed microdevice. Because of the height different between micro-LEDs (or electrical pads), there is no interference during the second, third or next consequential process.

Figure 82:
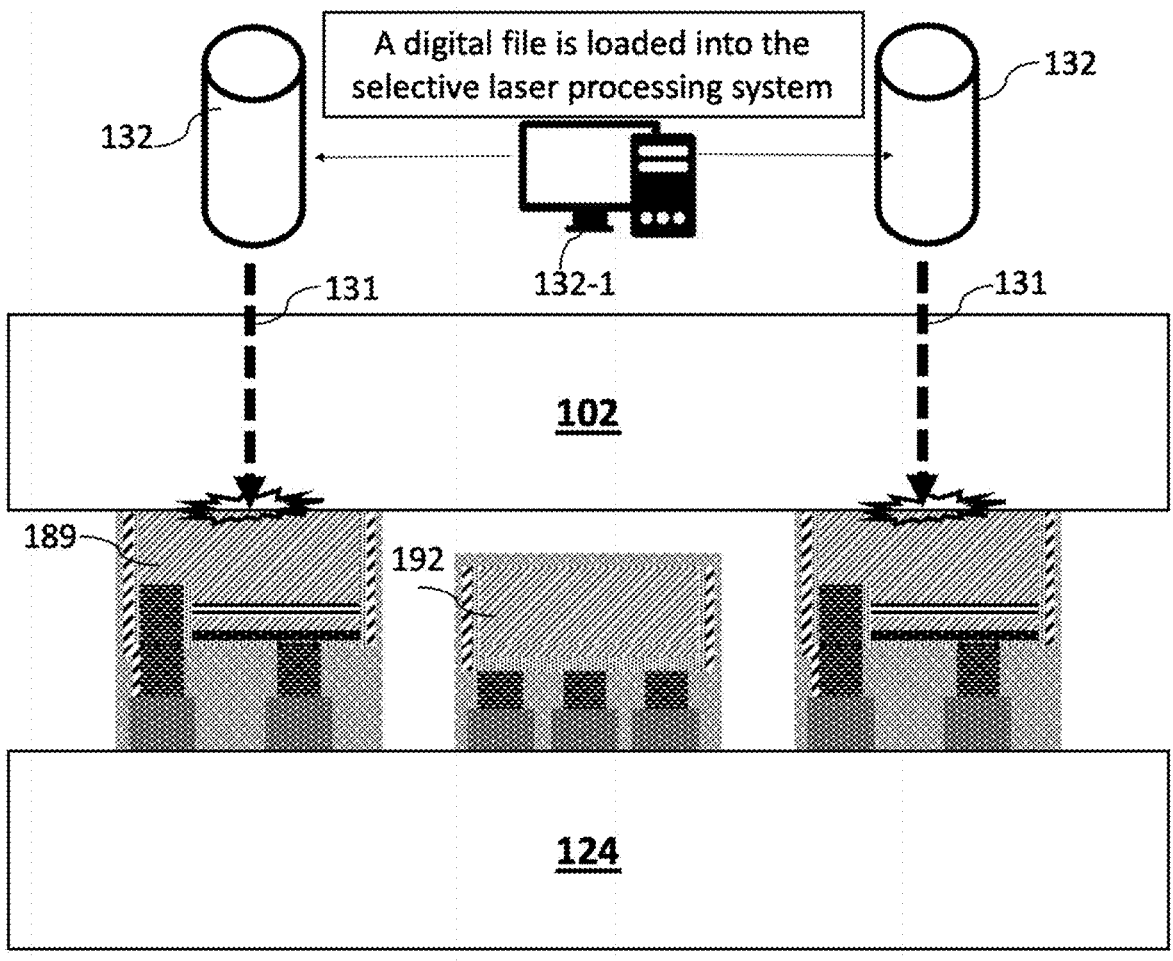
FIG. 82 depicts a selective laser-liftoff process to release the micro-LEDs from the donor substrate while the driving/circuit is transferred.

FIG. 82 shows a selective laser processing system that can be used to selectively release the micro-LEDs to the receiver substrate. The laser beam can be a laser and optical system that is based on a loaded digital file. The laser beam is not limited but can be generated and guided using any of the systems and configurations described earlier for selective laser processing of micro-LEDs.

Figure 83:
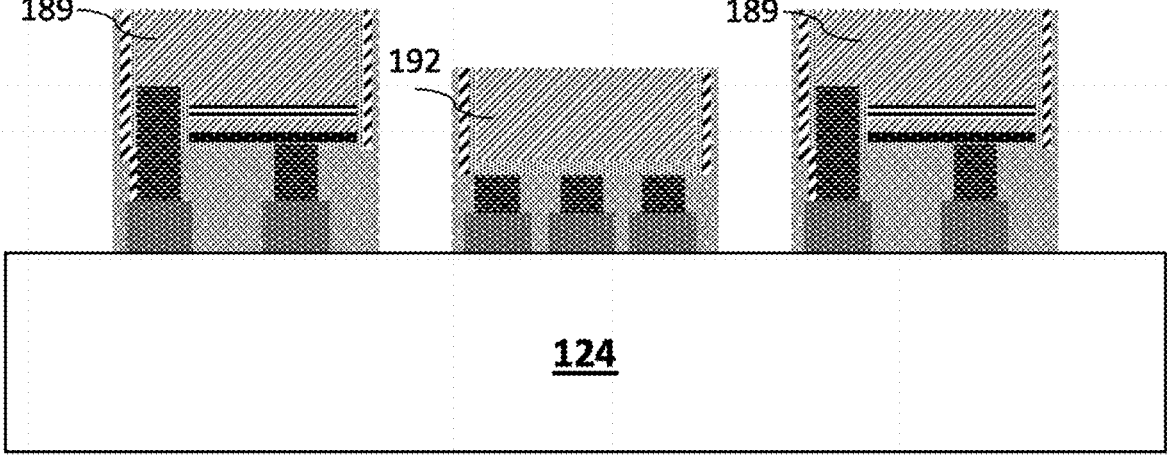
FIG. 83 depicts a receiver (backplane) substrate with both logic and micro-LEDs on it.

FIG. 83 shows the circuit/logic (192) microdevice and micro-LEDs (189) selectively transferred onto the receiver substrate. The number and order of the microdevice transferred onto the receiver substrate is not limited to what shown in the figure and can be in any order and numbers.

FIG. 84 provides the process flow for a repair process. A receiver substrate can have two pair of pads for each micro-LED cell. A spare pad (redundant pad) can be used for the repair process. A first group of micro-LEDs are transferred 842 onto the first set of pads using a selective laser processing. The next step is testing 844 the micro-LEDs electrically, optically, or using both techniques. In the test process, each micro-LED can be characterized to check the electrical behaviors such as series resistance, turn-on voltage, and etc. For this purpose, the display pads can be probed with a standard voltage to check each cell's electrical characteristics or the micro-LEDs pads can be large enough for an external probing. Another technique is turning ON all micro-LEDs and checking 846 the brightness of micro-LEDs using a machine vision system, a photodetector, a spectrometer, or combination of all of them. If a micro-LED brightness is less than a standard, it will not pass the test and needs to be replaced or repaired. Another technique is the photoluminescent characterization. In all test scenarios, a 2-dimensional map from the healthy and broken (unpassed) micro-LEDs will be prepared 848 with considering the fiducial marks and original transfer process pattern. A computational unit/software generates a digital file for the repair process. In the repair file, the location of the new transfer/print process is determined according to the failed devices and the location of the spare (redundant) pads. If a micro-LED is short circuited, another laser/mechanical processing may be required to remove it. The digital repair file will be loaded into the selective laser processing/printing system in order to transfer new micro-LEDs on the spare pads or the original pads. A repair micro-LED substrate that may have the same resolution as the repair pads may need to be fabricated separately. A photo-sensitive polymer/resin/epoxy processing may need to be performed on the micro-LED substrate to define a pattern of the micro-LEDs that need to be transferred according to the digital repair file. When the repair micro-LEDs are covered selectively with the photo-sensitive polymer, that can be bonded to the receiver substrate with failed micro-LEDs on it. A selective laser processing/printing according to the repair file generated in the test step, will transfer the micro-LEDs onto the location where failed (un-passed) micro-LEDs were detected. After the selective laser processing, the microdevice substrate can be removed/released from the receiver substrate.

Figure 85:
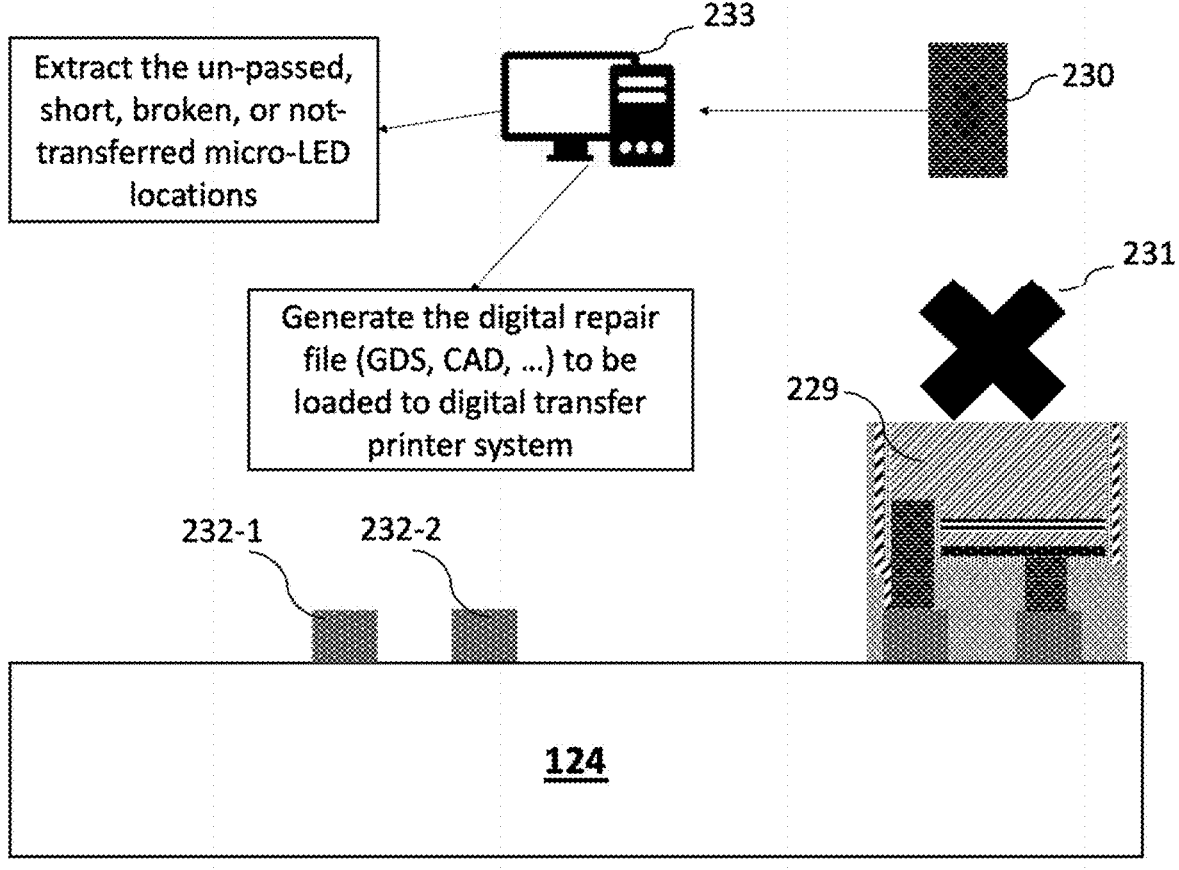
FIG. 85 depicts the un-passed micro-LED location detection and machine vision processing scenario.

FIG. 85 shows the test system that can detect the failed (un-passed) micro-LEDs. (229) is a micro-LED transferred onto the receiver substrate (124) from the previous transfer/print step. (232-1) and (232-2) are the spare (redundant) pads reserved for the repair process. The micro-LEDs can be driven electrically or optically for characterization. A machine vision system (230) detects the brightness of the micro-LEDs and sends the data to a computation unit (233). If the micro-LED brightness is higher than a pre-defined limit it will pass the test. Otherwise, the computation unit and machine vision will extract the location of the failed micro-LED (231) and generate a digital file (GDS/CAD or any other format) that will be used in the repair process. This file may need further processing to allocate fresh micro-LEDs onto the spare pads beside the failed micro-LEDs. Also, if the micro-LED is short-circuited, another digital file can be generated 850 to remove the short circuit device from the receiver substrate. It can be done using laser beam or mechanical force.

Figure 86:
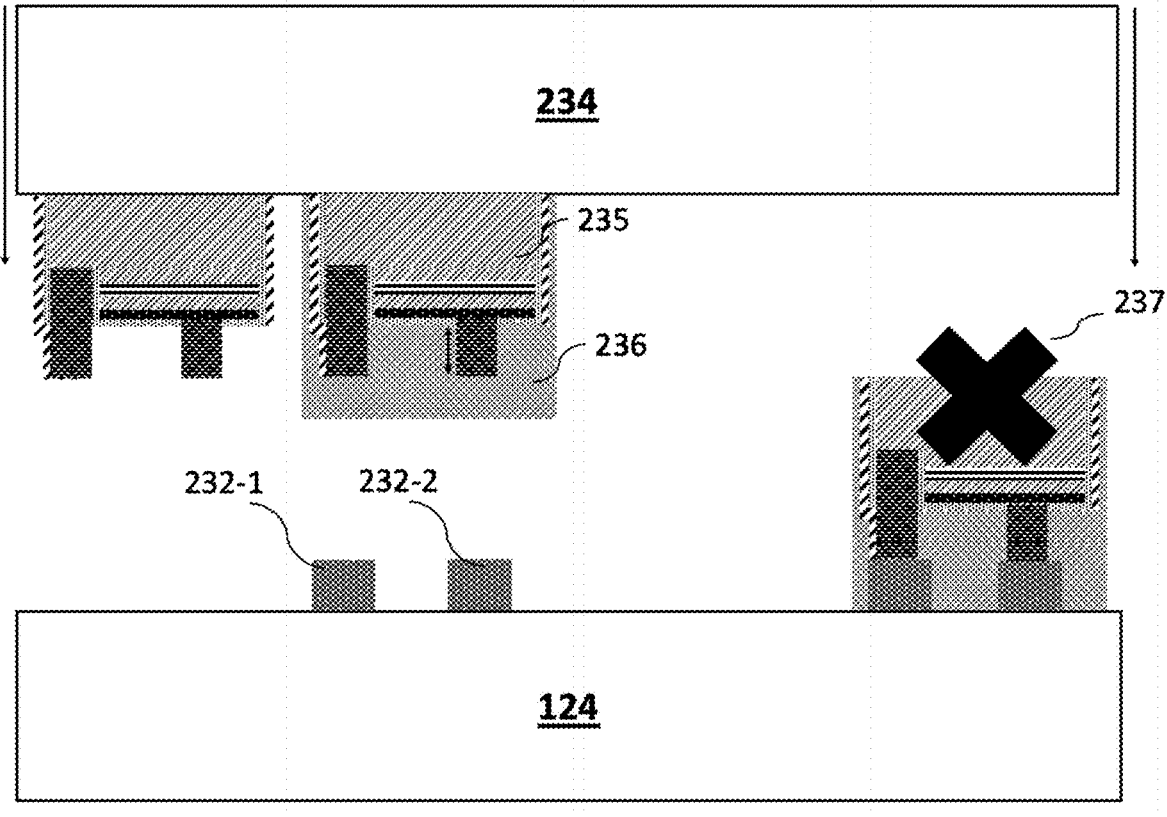
FIG. 86 depicts the repair mechanism by aligning the repair micro-LED with the redundant electrodes.

As shown in FIG. 86, another microdevice substrate with repair micro-LEDs (235) on it will be aligned to the receiver substrate (124). A photo-sensitive polymer (236) is patterned on the repair micro-LED using the lithography process described earlier in this document. The height (thickness) of the micro-LED electrodes (pads) can be engineered to prevent any interference with the failed micro-LED (237) on the substrate.

Figure 87:
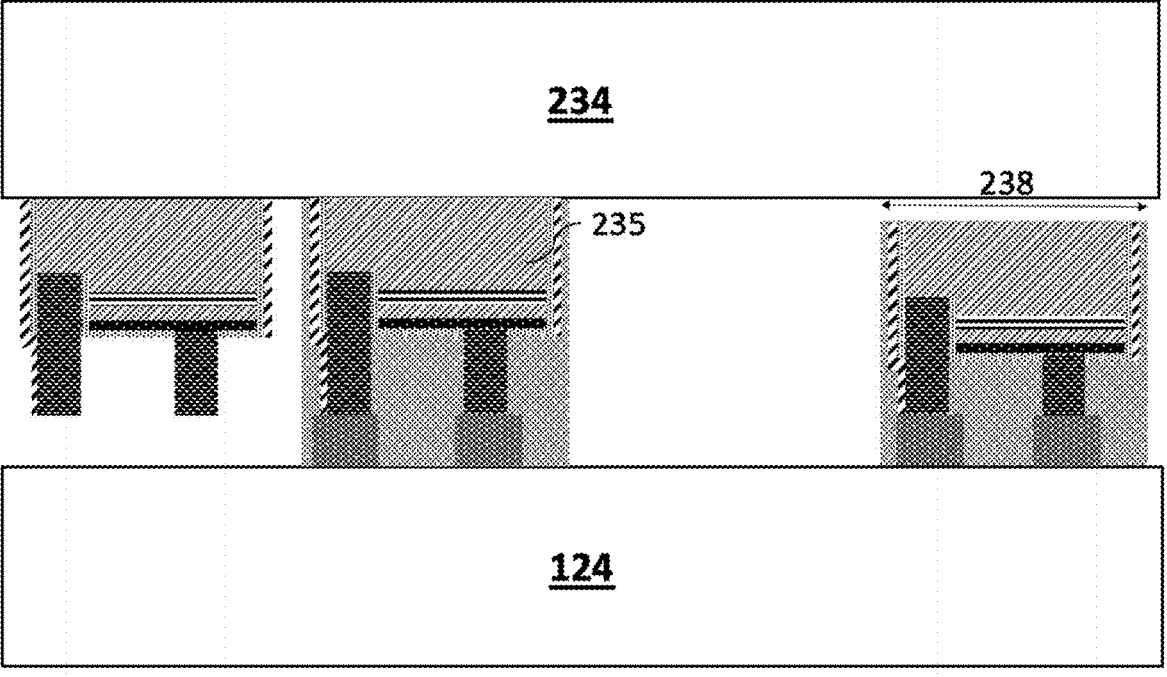
FIG. 87 depicts the repair micro-LED selectively bonded using a patterned photosensitive polymer onto the redundant electrodes.

FIG. 87 shows the repair micro-LED (235) bonded/integrated 860 to the spare pads on the receiver substrate. The repair micro-LED structure and pad size are engineered to have a gap at the area (238) above the failed micro-LED between the repair microdevice substrate (234) and the failed device. It may help any unwanted interference.

Figure 88:
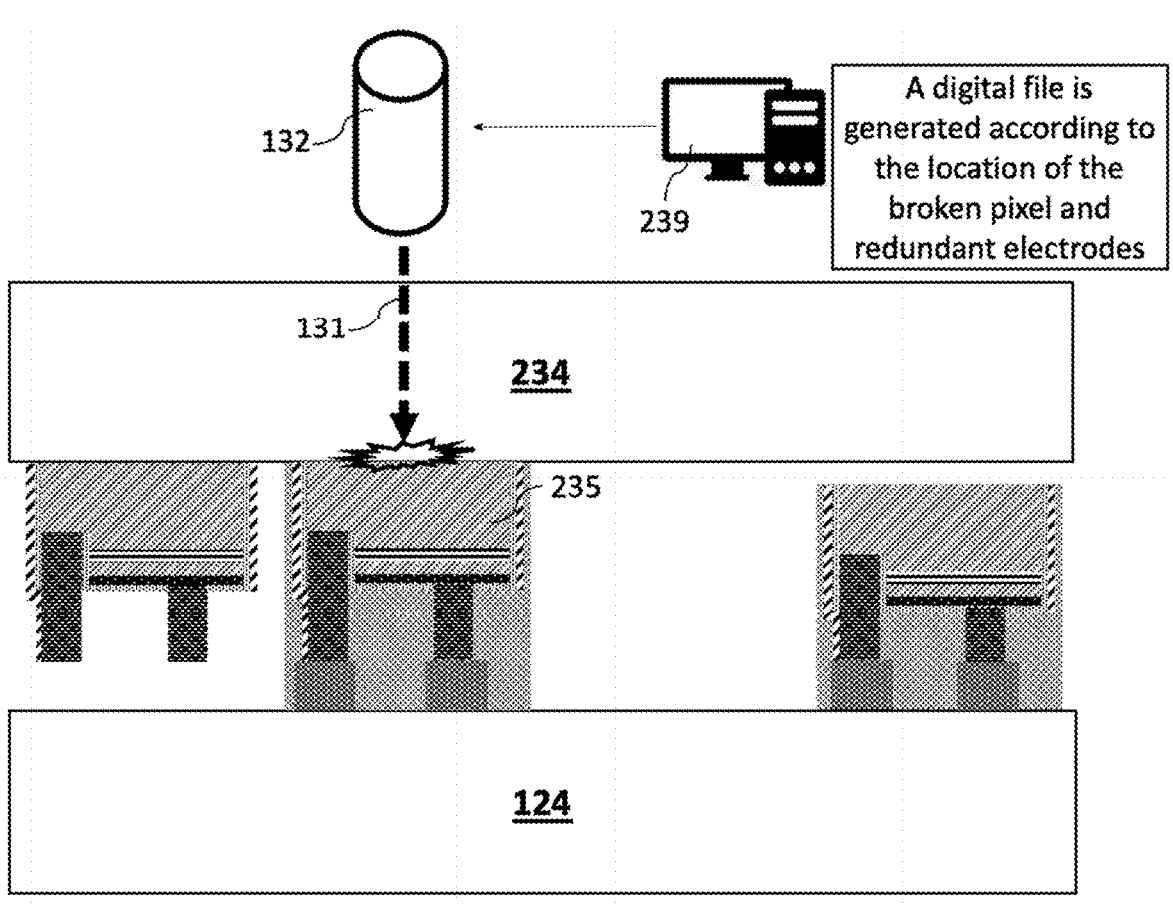
FIG. 88 depicts the selective laser-liftoff processing that releases the bonded repair micro-LED.

FIG. 88 shows the selective laser processing that can release 862 the repair micro-LEDs (235) from the repair substrate (234). The laser processing system is not limited to what shown in the figure, and any system that has been discussed earlier can be employed. The digital file generated based on the test data processed in a computational system (239) is loaded into the selective laser processing system to selective lift-off the micro-LEDs at the desired pattern and locations (on redundant pads for example).

Figure 89:
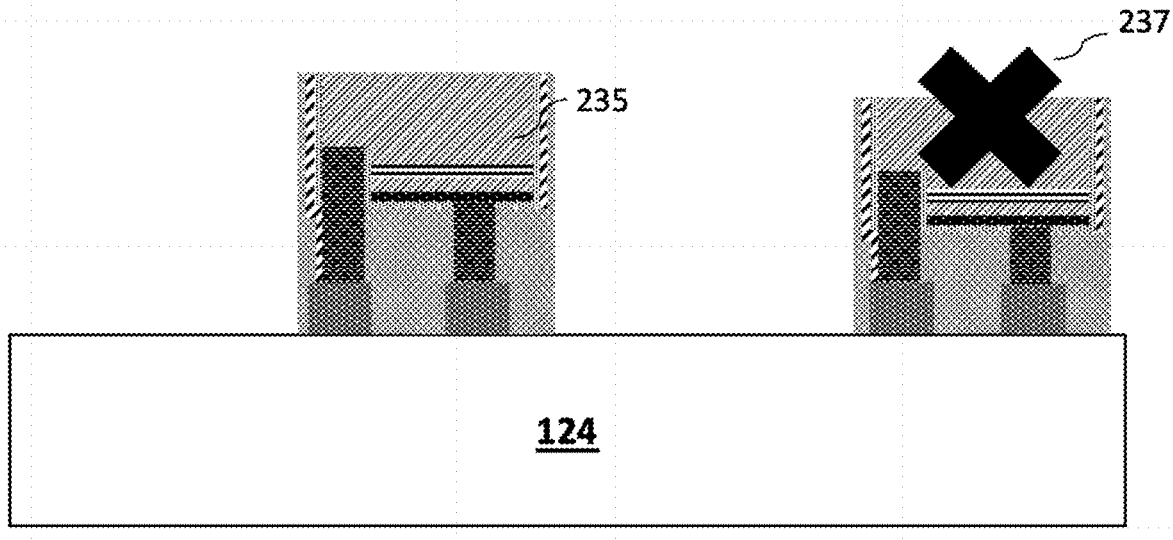
FIG. 89 depicts the receiver/backplane substrate after the repair process.

FIG. 89 shows a receiver substrate (124) after the repair process. Both repair micro-LED (235) and failed micro-LED (237) can exist on the substrate or the failed micro-LED (237) can be removed using another selective laser processing. Further electrical and optical test can be performed to test the repair micro-LED after the transfer.

Figure 90:
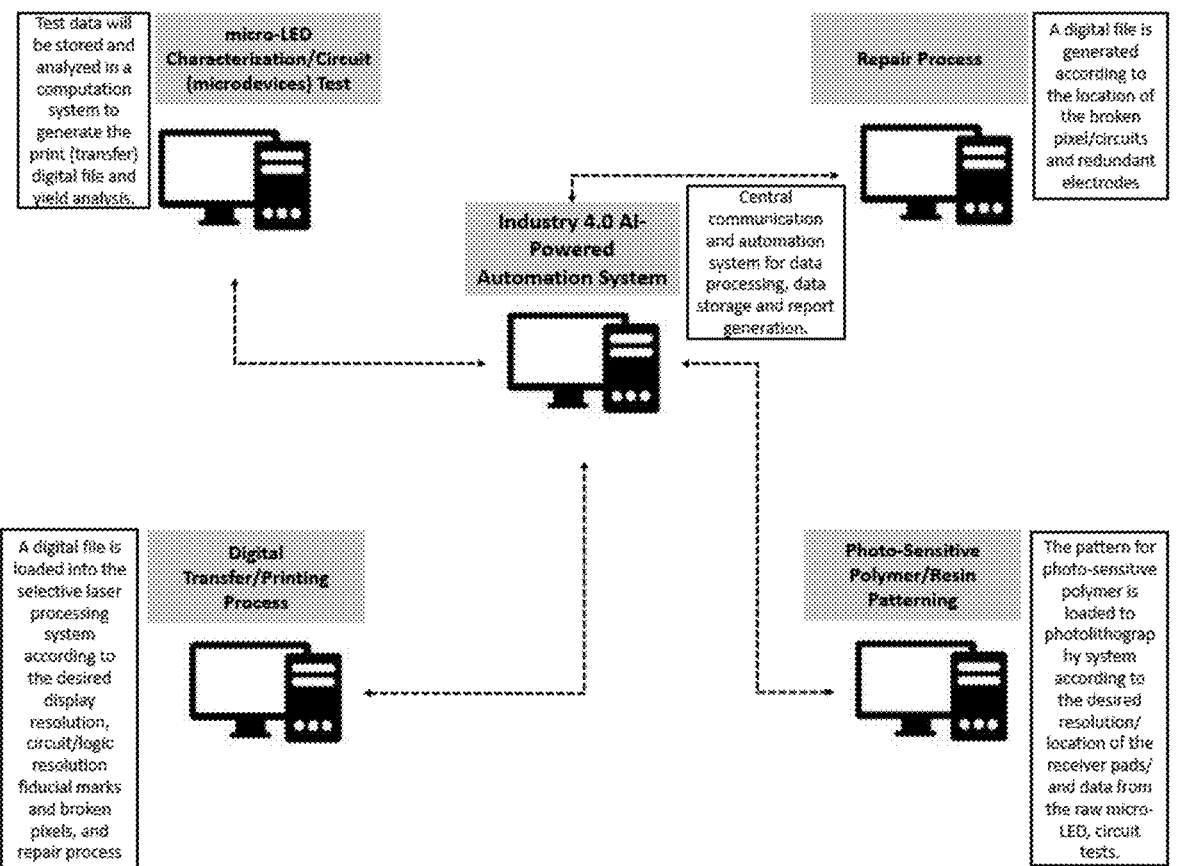
FIG. 90 depicts multiple systems interacting and operating the described methods.

FIG. 90 shows different systems interacting for operation of the methods described herein.

In order to automate the process and increase throughput, all the manufacturing process can be automated. Machine vision systems, machine to machine communication, and self-monitoring systems can be employed. All the fabrication steps described herein are compatible with smart automation. Also, each step can be governed independently. Artificial intelligence can be used to monitor the yield, make decision on the test results, and improve the transfer and repair yield. All the information generated in individual steps can be processed and be accessible and transparent to users/admins to follow the process and make required decision. The generated information can be used to improve the raw material yield and supply chain improvement.

It is to be understood that the above description is intended to be illustrative, and not restrictive. Many other embodiments will be apparent to those of skill in the art upon reviewing the above description. The scope should, therefore, be determined with reference to the appended claims, along with the full scope of equivalents to which such claims are entitled.

What is claimed is:

1. A method of packaging micro-LEDs onto a substrate, comprising:

microfabricating one or more micro-LEDs on an optically transparent microdevice substrate with an epitaxial layer between the microdevice substrate and an active layer for light generation;

aligning a test substrate with one or more test electrodes to connect each of the one or more electrodes to one of the one or more micro-LEDs;

injecting a current through each test electrode, capturing brightness information from each micro-LED, and creating a map of each healthy and defective micro-LED based on the captured brightness information;

removing the test substrate with one or more test electrodes;

coating a photo-sensitive polymer on the microdevice substrate;

exposing a pattern into the photo-sensitive polymer through optically patterning to remove the photo-sensitive polymer around all defective micro-LEDs;

forcing a receiver substrate with one or more pads towards the microdevice substrate such that at least one of the pads penetrates the photo-sensitive polymer and makes electrical contact with one of the healthy micro-LEDs, and the photo-sensitive polymer fills any gap between the micro-LED and the receiver substrate;

curing the photo-sensitive polymer surrounding one of the healthy micro-LEDs in contact with one of the pads, bonding the one of the healthy micro-LEDs to the receiver substrate and achieving lift-off of the micro-LED from the microdevice substrate; and moving the microdevice substrate away from the receiver substrate.

2. The method of claim 1, further comprising covering one or more sidewalls of each micro-LED with a reflective layer.

3. The method of claim 1, further comprising achieving liftoff by passing a laser beam through the microdevice substrate to be absorbed at an interface between the bonded one of the healthy micro-LEDs and the microdevice substrate.

4. The method of claim 3, further comprising directing the laser beam off a fast-scanning mirror and guiding the laser beam through optical elements focusing the laser beam on the interface.

5. The method of claim 3, further comprising reflecting the laser beam through two or more mirrors to focus on interfaces between the microdevice substrate and multiple of the one or more healthy micro-LEDs.

6. The method of claim 1, further comprising repeating the coating, exposing, forcing, and curing steps to bond one or more remaining healthy micro-LEDs to a second receiver substrate.

7. The method of claim 6, further comprising repeating bonding of healthy micro-LEDs to receiver substrates until a required resolution of micro-LEDs is achieved for a resolution requirement of a display.

8. The method of claim 7, further comprising bonding one type of micro-LEDs in a row and leaving a neighboring space open for a repair process.

9. The method of claim 8, further comprising achieving a full-color display by bonding a second type of micro-LEDs in a second row, a third type of micro-LEDs in a third row, and repeating the three row pattern across the full-color display.

10. The method of claim 7, further comprising bonding mono-color emitting micro-LEDs of the same mono-color throughout the full-color display, and applying a color conversion layer to achieve a full color display.

11. The method of claim 10, further comprising:

planarizing the full-color display above the mono-color emitting micro-LEDs;

filling space between the mono-color emitting micro-LEDs with an optically black material;

coating a reflective layer on top of each of the mono-color emitting micro-LEDs and the optically black material;

directionally etching the reflective layer from the top of the mono-color emitting micro-LEDs and the top of the optically black material; and filling the color conversion layer on top of each mono-color emitting micro-LED and between the reflective layer remaining on the sides of the optically black material.

12. The method of claim 10, further comprising:

forming the color conversion layer on a glass substrate by:

coating and patterning an optically black material on the glass substrate positioned to fit around individual mono-color emitting micro-LEDs of the display;

coating a reflective layer on the black material and glass substrate;

directionally etching the reflective layer to remove it from the glass substrate and top of the optically black material, and leave it on sidewalls of the optically black material; and filling spaces above the glass substrate and between the reflective-layer coated sidewalls of the optically black material with color-conversion materials;

aligning and bonding the color conversion layer above the mono-color emitting micro-LEDs.

13. The method of claim 12, further comprising including an optical layer on the glass substrate beneath the optically black material and color-conversion materials.

14. The method of claim 12, further comprising including multiple optical layers on the glass substrate beneath the optically black material and color-conversion materials.

15. The method of claim 14, further comprising fabricating optical elements on a side of the glass substrate opposite from a side nearest the color-conversion materials.

16. The method of claim 1, further comprising:

fabricating one or more driving circuits on a laser transparent substrate;

coating the photo-sensitive polymer on the laser transparent substrate;

aligning the laser transparent substrate opposite the receiver substrate such that at least one of the one or more driving circuits contacts one or more of the one or more pads;

curing the photo-sensitive polymer surrounding one of the driving circuits in contact with one of the pads, bonding the one of the driving circuits to the receiver substrate and achieving lift-off of the driving circuit from the laser transparent substrate; and moving the laser transparent substrate away from the receiver substrate.

17. The method of claim 1, further comprising for each bonding micro-LED, leaving a neighboring pad open for a repair process.

18. The method of claim 17, further comprising:

testing the bonded micro-LEDs and detecting one or more failed micro-LEDs; and repeating the coating, exposing, forcing, and curing steps to bond one or more remaining healthy micro-LEDs to the open neighboring pad of a detected failed micro-LED.

19. The method of claim 18, further comprising removing from the receiver substrate a detected failed micro-LED that has short-circuited.

20. The method of claim 17, further comprising:

microfabricating one or more repair micro-LEDs on an optically transparent repair substrate;

coating the photo-sensitive polymer on the repair substrate;

forcing the receiver substrate with one or more pads towards the repair substrate such that the neighboring pad of a failed micro-LED makes electrical contact with one of the repair micro-LEDS;

curing the photo-sensitive polymer surrounding one of the repair micro-LEDs in contact with then neighboring pad, bonding the one of the repair micro-LEDs to the receiver substrate and achieving lift-off of the repair micro-LED from the repair substrate; and moving the repair substrate away from the receiver substrate.

\* \* \* \* \*